(12) United States Patent
Wada et al.

(10) Patent No.: US 11,530,491 B2
(45) Date of Patent: *Dec. 20, 2022

(54) SILICON CARBIDE EPITAXIAL SUBSTRATE AND METHOD FOR MANUFACTURING SILICON CARBIDE SEMICONDUCTOR DEVICE

(71) Applicant: Sumitomo Electric Industries, Ltd., Osaka (JP)

(72) Inventors: Keiji Wada, Itami (JP); Tsutomu Hori, Itami (JP); Taro Nishiguchi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/337,466

(22) Filed: Jun. 3, 2021

(65) Prior Publication Data

US 2021/0296443 A1 Sep. 23, 2021

Related U.S. Application Data

(63) Continuation of application No. 15/780,689, filed as application No. PCT/JP2016/080098 on Oct. 11, 2016, now Pat. No. 11,053,607.

(30) Foreign Application Priority Data

Feb. 15, 2016 (JP) .............................. JP2016-026176

(51) Int. Cl.
*C30B 29/36* (2006.01)
*C30B 25/20* (2006.01)
(Continued)

(52) U.S. Cl.
CPC ............ *C30B 29/36* (2013.01); *C23C 16/325* (2013.01); *C30B 25/183* (2013.01); *C30B 25/20* (2013.01);
(Continued)

(58) Field of Classification Search
CPC ..... C23C 16/325; C30B 25/183; C30B 25/20; C30B 29/36
See application file for complete search history.

(56) References Cited

U.S. PATENT DOCUMENTS

| 6,631,726 B1 | 10/2003 | Kinoshita et al. |
| 2011/0006309 A1 | 1/2011 | Momose et al. |

(Continued)

FOREIGN PATENT DOCUMENTS

| CN | 101802273 A | 8/2010 |
| CN | 104078331 A | 10/2014 |

(Continued)

OTHER PUBLICATIONS

Ishiyama et al., "Gate oxide reliability of trapezoid-shaped defects and obtuse triangular defects in 4H—SiC epitaxial wafers," Japanese Journal of Applied Physics 53, 04EP15-1-04EP15-4, Mar. 25, 2014 [Cited in Parent].

(Continued)

*Primary Examiner* — Zachary M Davis
(74) *Attorney, Agent, or Firm* — Baker Botts L.L.P.; Michael A. Sartori

(57) ABSTRACT

A silicon carbide epitaxial substrate includes a silicon carbide single crystal substrate and a silicon carbide layer. In a direction parallel to a central region, a ratio of a standard deviation of a carrier concentration of the silicon carbide layer to an average value of the carrier concentration of the silicon carbide layer is less than 5%. The average value of the carrier concentration is more than or equal to $1 \times 10^{14}$ $cm^{-3}$ and less than or equal to $5 \times 10^{16}$ $cm^{-3}$. In the direction parallel to the central region, a ratio of a standard deviation of a thickness of the silicon carbide layer to an average value of the thickness of the silicon carbide layer is less than 5%. The central region has an arithmetic mean roughness (Sa) of (Continued)

less than or equal to 1 nm. The central region has a haze of less than or equal to 50.

16 Claims, 33 Drawing Sheets

(51) Int. Cl.
  *H01L 21/02* (2006.01)
  *C23C 16/32* (2006.01)
  *C30B 25/18* (2006.01)
  *H01L 21/04* (2006.01)
  *H01L 21/78* (2006.01)
  *H01L 29/04* (2006.01)
  *H01L 29/16* (2006.01)
  *H01L 29/34* (2006.01)
  *H01L 29/66* (2006.01)
  *H01L 29/78* (2006.01)

(52) U.S. Cl.
  CPC .... *H01L 21/0262* (2013.01); *H01L 21/02378* (2013.01); *H01L 21/02433* (2013.01); *H01L 21/02447* (2013.01); *H01L 21/02499* (2013.01); *H01L 21/02529* (2013.01); *H01L 21/02576* (2013.01); *H01L 21/02609* (2013.01); *H01L 21/046* (2013.01); *H01L 21/049* (2013.01); *H01L 21/0485* (2013.01); *H01L 21/78* (2013.01); *H01L 29/045* (2013.01); *H01L 29/1608* (2013.01); *H01L 29/34* (2013.01); *H01L 29/66068* (2013.01); *H01L 29/7802* (2013.01)

(56) References Cited

U.S. PATENT DOCUMENTS

| | | |
|---|---|---|
| 2011/0233562 A1 | 9/2011 | Harada et al. |
| 2012/0280254 A1 | 11/2012 | Muto et al. |
| 2014/0264384 A1 | 9/2014 | Loboda et al. |
| 2014/0295136 A1 | 10/2014 | Ohno et al. |
| 2016/0312381 A1 | 10/2016 | Norimatsu et al. |
| 2016/0351667 A1 | 12/2016 | Wada et al. |
| 2018/0016706 A1 | 1/2018 | Norimatsu et al. |

FOREIGN PATENT DOCUMENTS

| | | |
|---|---|---|
| JP | 2000-319689 A | 11/2000 |
| JP | 2001-137800 A | 5/2001 |
| JP | 2002-508298 A | 3/2002 |
| JP | 2008-094700 A | 4/2008 |
| JP | 2011-039327 A | 2/2011 |
| JP | 2013-034007 A | 2/2013 |
| JP | 2014-019596 A | 2/2014 |
| JP | 2015-051895 A | 3/2015 |
| JP | 2015-189633 A | 11/2015 |
| WO | 2010/119792 A1 | 10/2010 |
| WO | 2011/074453 A1 | 6/2011 |

OTHER PUBLICATIONS

Yamashita et al., "Origin Analyses of Trapezoid-Shape Defects in 4-deg.-off 4H—SiC Epitaxial Wafers by Synchrotron X-ray Topography," Materials Science Forum vols. 778-780 (2014) pp. 374-377 [Cited in Parent].

Tamai et al. Experimental Study of the Relation between Contact Angle and Surface Roughness, 1972, Journal of Physical Chemistry, vol. 76, No. 22, pp. 3267-3271 (Year: 1972) [Cited in Parent].

Lewandowska et al., "The Technique of Measurement of Intraocular Lens Surface Roughness Using Atomic Force Microscopy," 2014, Interdisciplinary Journal for Engineering Sciences, vol. II, No. 1, pp. 21-25 (Year:2014) [Cited in Parent].

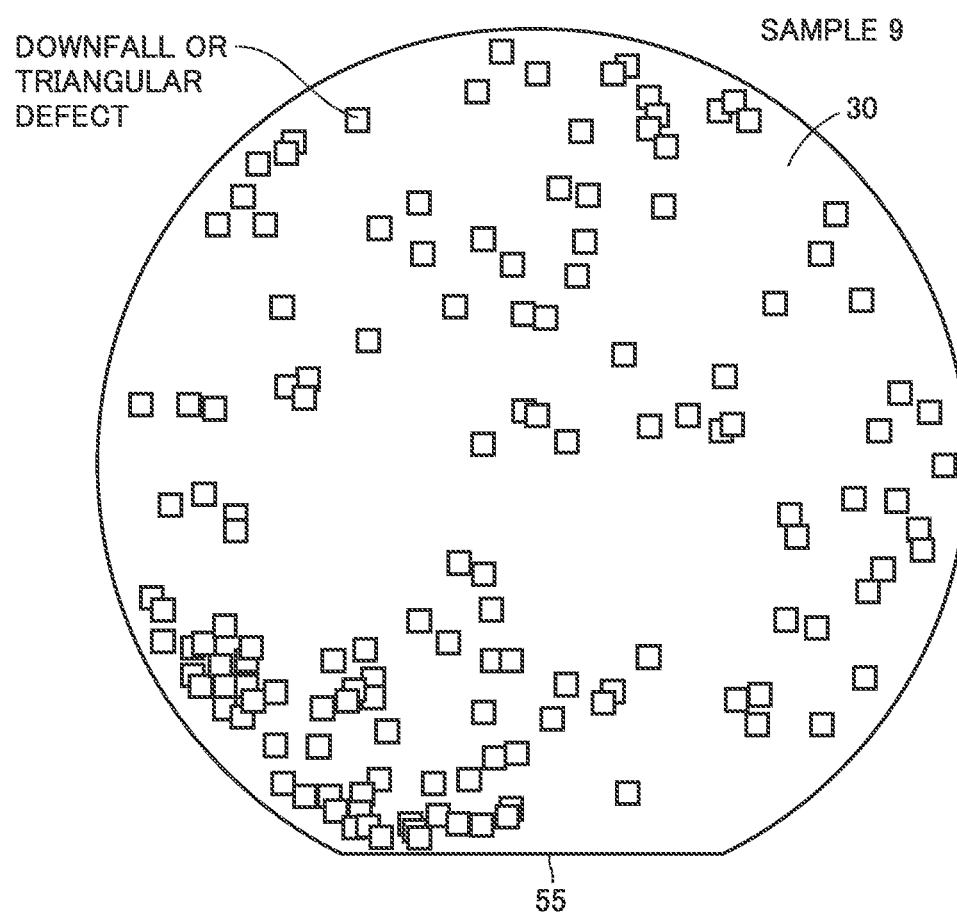

ered and less than or equal to 8° relative to a (0001) plane. The second main surface has a maximum diameter of more than or equal to 100 mm. The silicon carbide layer has a polytype of 4H-SiC. The silicon carbide layer has n type conductivity. The second main surface has an outer circumferential region and a central region, the outer circumferential region being within 3 mm from an outer edge of the second main surface, the central region being surrounded by the outer circumferential region. In a direction parallel to the central region, a ratio of a standard deviation of a carrier concentration of the silicon carbide layer to an average value of the carrier concentration of the silicon carbide layer is less than 5%. The average value of the carrier concentration is more than or equal to $1\times10^{14}$ cm$^{-3}$ and less than or equal to $5\times10^{16}$ cm$^{-3}$. In the direction parallel to the central region, a ratio of a standard deviation of a thickness of the silicon carbide layer to an average value of the thickness of the silicon carbide layer is less than 5%. The central region has an arithmetic mean roughness (Sa) of less than or equal to 1 nm. The central region has a haze of less than or equal to 50.

SILICON CARBIDE EPITAXIAL SUBSTRATE AND METHOD FOR MANUFACTURING SILICON CARBIDE SEMICONDUCTOR DEVICE

TECHNICAL FIELD

The present disclosure relates to a silicon carbide epitaxial substrate and a method for manufacturing a silicon carbide semiconductor device. The present application claims a priority based on Japanese Patent Application No. 2016-026176 filed on Feb. 15, 2016, the entire content of which is incorporated herein by reference.

BACKGROUND ART

Japanese Patent Laying-Open No. 2013-34007 (Patent Document 1) discloses a silicon carbide epitaxial substrate characterized in that there is no short step-bunching.

CITATION LIST

Patent Document

PTD 1: Japanese Patent Laying-Open No. 2013-34007

SUMMARY OF INVENTION

A silicon carbide epitaxial substrate according to the present disclosure includes a silicon carbide single crystal substrate and a silicon carbide layer. The silicon carbide single crystal substrate has a first main surface. The silicon carbide layer is on the first main surface. The silicon carbide layer includes a second main surface opposite to a surface of the silicon carbide layer in contact with the silicon carbide single crystal substrate. The second main surface corresponds to a plane inclined by more than or equal to 0.5° and

BRIEF DESCRIPTION OF DRAWINGS

FIG. 55 is a map showing an in-plane distribution of downfall and triangular defects in the second main surface of the silicon carbide epitaxial substrate according to sample 9.

DETAILED DESCRIPTION

Figure 1:
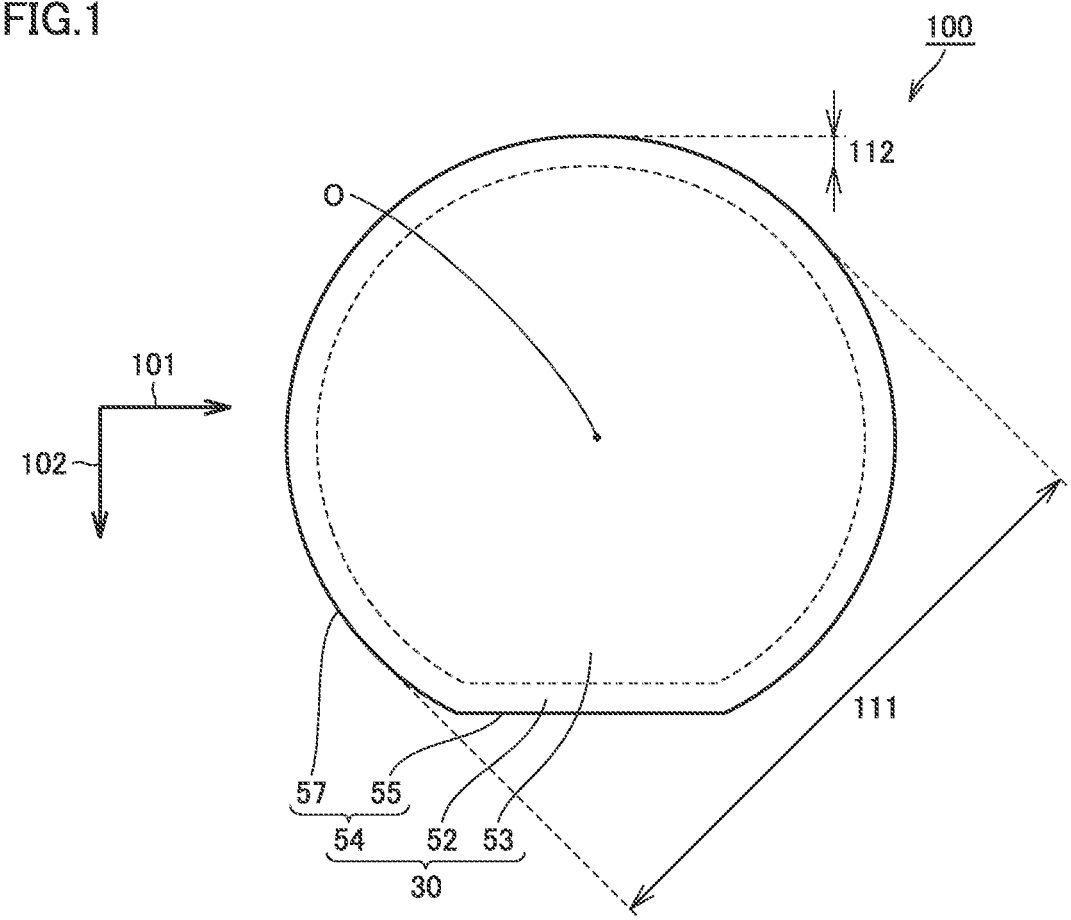
FIG. 1 is a schematic plan view showing a configuration of a silicon carbide epitaxial substrate according to the present embodiment.

Problems to be Solved by the Present Disclosure

An object of the present disclosure is to provide a silicon carbide epitaxial substrate and a method for manufacturing a silicon carbide semiconductor device, by each of which in-plane uniformity of a carrier concentration can be improved and surface roughness can be reduced.

Advantageous Effect of the Present Disclosure

According to the present disclosure, there can be provided a silicon carbide epitaxial substrate and a method for manufacturing a silicon carbide semiconductor device, by each of which in-plane uniformity of a carrier concentration can be improved and surface roughness can be reduced.

Overview of Embodiment of the Present Disclosure

First, the overview of the embodiment of the present disclosure will be described. Regarding crystallographic indications in the present specification, an individual orientation is represented by [ ], a group orientation is represented by < >, and an individual plane is represented by ( ), and a group plane is represented by { }. A crystallographically negative index is normally expressed by putting "-" (bar) above a numeral; however, in the present specification, the crystallographically negative index is expressed by putting a negative sign before the numeral.

(1) A silicon carbide epitaxial substrate 100 according to the present disclosure includes a silicon carbide single crystal substrate 10 and a silicon carbide layer 20. Silicon carbide single crystal substrate 10 has a first main surface 11. Silicon carbide layer 20 is on the first main surface. Silicon carbide layer 20 includes a second main surface 30 opposite to a surface 14 of silicon carbide layer 20 in contact with silicon carbide single crystal substrate 10. Second main surface 30 corresponds to a plane inclined by more than or equal to 0.5° and less than or equal to 8° relative to a (0001) plane. Second main surface 30 has a maximum diameter 111 of more than or equal to 100 mm. Silicon carbide layer 20 has a polytype of 4H-SiC. Silicon carbide layer 20 has n type conductivity. Second main surface 30 has an outer circumferential region 52 and a central region 53, outer circumferential region 52 being within 3 mm from an outer edge 54 of second main surface 30, central region 53 being surrounded by outer circumferential region 52. In a direction parallel to central region 53, a ratio of a standard deviation of a carrier concentration of silicon carbide layer 20 to an average value of the carrier concentration of silicon carbide layer 20 is less than 5%. The average value of the carrier concentration is more than or equal to $1 \times 10^{14}$ cm$^{-3}$ and less than or equal to $5 \times 10^{16}$ cm$^{-3}$. In the direction parallel to central region 53, a ratio of a standard deviation of a thickness of silicon carbide layer 20 to an average value of thickness 113 of silicon carbide layer 20 is less than 5%.

Central region 53 has an arithmetic mean roughness (Sa) of less than or equal to 1 nm. Central region 53 has a haze of less than or equal to 50.

(2) In silicon carbide epitaxial substrate 100 according to (1), when central region 53 is divided into square regions with each side of 6 mm, a ratio of the number of square regions each having at least one of a downfall defect and a triangular defect to the number of all the square regions may be less than or equal to 10%. This can lead to improved yield of a silicon carbide semiconductor device manufactured using the silicon carbide epitaxial substrate.

(3) In silicon carbide epitaxial substrate 100 according to (1) or (2), the average value of the thickness of silicon carbide layer 20 may be more than or equal to 5 µm and less than or equal to 50 µm.

(4) In silicon carbide epitaxial substrate 100 according to any one of (1) to (3), pits 87 originated from threading screw dislocations 23 may be in central region 53; however, fewer pits 87 are more preferable. An area density of the pits may be less than or equal to 100 $cm^{-2}$. A maximum depth 116 of each of the pits from central region 53 may be more than or equal to 8 nm.

(5) In silicon carbide epitaxial substrate 100 according to (4), the area density of pits 87 is preferably less than or equal to 10 $cm^{-2}$.

(6) In silicon carbide epitaxial substrate 100 according to (5), the area density of pits 87 is preferably less than or equal to 1 $cm^{-2}$.

(7) In silicon carbide epitaxial substrate 100 according to any one of (4) to (6), the maximum depth of each of the pits from central region 53 may be more than or equal to 20 nm.

(8) In silicon carbide epitaxial substrate 100 according to any one of (4) to (7), when viewed in a direction perpendicular to central region 53, each of pits 87 may have a planar shape including a first side 61 and a second side 62, first side 61 extending in a first direction, second side 62 extending in a second direction perpendicular to the first direction. A width of first side 61 may be twice or more as large as a width of second side 62.

(9) In silicon carbide epitaxial substrate 100 according to any one of (1) to (8), trapezoidal defects 70 may be in central region 53, each of trapezoidal defects 70 being a trapezoidal depression. However, fewer trapezoidal defects 70 are more preferable. An area density of trapezoidal defects 70 is preferably less than or equal to 10 $cm^{-2}$. When viewed in a direction perpendicular to central region 53, each of trapezoidal defects 70 may include an upper base portion 72 and a lower base portion 74 each crossing a <11-20> direction. Upper base portion 72 may have a width of more than or equal to 0.1 µm and less than or equal to 100 µm. Lower base portion 74 may have a width of more than or equal to 50 µm and less than or equal to 5000 µm. Upper base portion 72 may include a protrusion 73. Lower base portion 74 may include a plurality of step-bunchings 75.

(10) In silicon carbide epitaxial substrate 100 according to any one of (1) to (9), basal plane dislocations 24 may be in central region 53; however, fewer basal plane dislocations 24 are more preferable. An area density of the basal plane dislocations is preferably less than or equal to 10 $cm^{-2}$.

(11) In silicon carbide epitaxial substrate 100 according to any one of (1) to (10), first dislocation arrays 2 of first half loops 1 arranged along a straight line perpendicular to a <11-20> direction may be in central region 53; however, fewer first dislocation arrays 2 are more preferable. Each of first half loops 1 may include a pair of threading edge dislocations exposed at central region 53. An area density of first dislocation arrays 2 in central region 53 is preferably less than or equal to 10 $cm^{-2}$.

Normally, there are dislocation arrays of threading edge dislocations in a silicon carbide epitaxial substrate. Such dislocation arrays lead to decreased breakdown voltage of a semiconductor device, increased leakage current, and decreased reliability of the semiconductor device. Hence, the dislocation arrays are required to be reduced.

It is considered that the dislocation arrays of threading edge dislocations are mainly classified into three types. The first type of dislocation array is a dislocation array transferred from a silicon carbide single crystal substrate to a silicon carbide layer formed by epitaxial growth. The second type of dislocation array is a dislocation array generated during the epitaxial growth of the silicon carbide layer. The depth of each of a plurality of half loops included in the dislocation array is determined by the thickness of the silicon carbide layer upon occurrence of the half loop. Accordingly, the respective depths of the plurality of half loops included in the dislocation array are different from one another. Moreover, a direction (i.e., the longitudinal direction of the dislocation array) in which the plurality of half loops are arranged has a component of a step-flow growth direction (off direction). That is, the longitudinal direction of the dislocation array is not perpendicular to the off direction. The third type of dislocation array is a dislocation array generated after end of the epitaxial growth of the silicon carbide layer. It is considered that the dislocation array is formed in the following manner: a basal plane dislocation in the silicon carbide layer is slid in the direction perpendicular to the off direction after the end of the epitaxial growth. Hence, the longitudinal direction of the dislocation array is perpendicular to the off direction. Moreover, the respective depths of the plurality of half loops included in the dislocation array are substantially the same.

The inventors particularly paid attention to suppressing occurrence of the third type of dislocation array. It is considered that a half loop is formed in the silicon carbide layer when a basal plane dislocation is slid in the direction perpendicular to the off direction to relax stress in the silicon carbide layer. Moreover, it is considered that stress in the silicon carbide layer is mainly generated in the step of cooling the silicon carbide epitaxial substrate. Based on the above knowledge, the inventors found that the occurrence of the third type of dislocation array can be suppressed by controlling the cooling rate of the silicon carbide epitaxial substrate as described below in the step of cooling the silicon carbide epitaxial substrate so as to relax the stress in the silicon carbide epitaxial substrate. Accordingly, the area density of the first dislocation arrays of the first half loops arranged along the straight line perpendicular to the off direction can be reduced.

(12) In silicon carbide epitaxial substrate 100 according to (11), second dislocation arrays 5 of second half loops 4 arranged along a straight line inclined relative to a <11-20> direction may be in central region 53; however, fewer second dislocation arrays 5 are more preferable. Each of second half loops 4 may include a pair of threading edge dislocations exposed at central region 53. In central region 53, the area density of first dislocation arrays 2 may be lower than an area density of second dislocation arrays 5.

(13) In silicon carbide epitaxial substrate 100 according to any one of (1) to (12), when pure water is dropped to central region 53, an average value of a contact angle of the pure water may be less than or equal to 45°. An absolute value of a difference between maximum value and minimum value of the contact angle may be less than or equal to 10°.

(14) In silicon carbide epitaxial substrate 100 according to any one of (1) to (13), a thickness of silicon carbide single crystal substrate 10 may be less than or equal to 600 μm. A warp of silicon carbide epitaxial substrate 100 may be less than or equal to 30 μm. An absolute value of a bow of silicon carbide epitaxial substrate 100 may be less than or equal to 20 μm. When the bow is positive, in a direction perpendicular to a three-point reference plane 94 of second main surface 30, a location having a maximum height when viewed from three-point reference plane 94 may be in a range from a center O of second main surface 30 to ⅔ of a radius of second main surface 30. When the bow is negative, in the direction perpendicular to three-point reference plane 94, a location having a minimum height when viewed from three-point reference plane 94 may be in the range from center O of second main surface 30 to ⅔ of the radius of second main surface 30.

(15) A method for manufacturing a silicon carbide semiconductor device 300 according to the present disclosure may include: preparing silicon carbide epitaxial substrate 100 recited in any one of (1) to (14); and processing silicon carbide epitaxial substrate 100.

[Details of Embodiment of the Present Disclosure]

Next, the following describes details of the embodiment of the present disclosure with reference to figures. In the description below, the same or corresponding elements are given the same reference characters and are not described repeatedly.

(Silicon Carbide Epitaxial Substrate)

Figure 2:
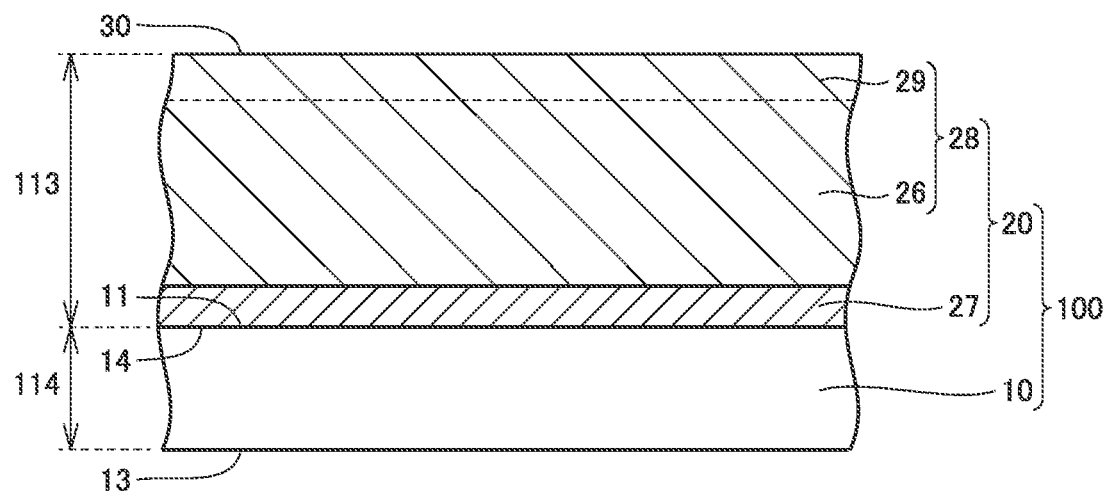
FIG. 2 is a schematic cross sectional view showing the configuration of the silicon carbide epitaxial substrate according to the present embodiment.

As shown in FIG. 1 and FIG. 2, a silicon carbide epitaxial substrate 100 according to the present embodiment has a silicon carbide single crystal substrate 10 and a silicon carbide layer 20. Silicon carbide single crystal substrate 10 includes a first main surface 11 and a third main surface 13 opposite to first main surface 11. Silicon carbide layer 20 is on first main surface 11. Silicon carbide layer 20 includes: a fourth main surface 14 in contact with silicon carbide single crystal substrate 10; and a second main surface 30 opposite to fourth main surface 14. As shown in FIG. 1, second main surface 30 includes: an outer circumferential region 52; and a central region 53 surrounded by outer circumferential region 52. Outer circumferential region 52 is a region within 3 mm from an outer edge 54 of second main surface 30. In other words, a distance 112 between outer edge 54 and a boundary between outer circumferential region 52 and central region 53 in the radial direction of second main surface 30 is 3 mm.

Outer edge 54 of silicon carbide epitaxial substrate 100 may have an orientation flat 55 and a curvature portion 57. Orientation flat 55 extends along a first direction 101. Curvature portion 57 is continuous to the both ends of orientation flat 55. First direction 101 is a <11-20> direction, for example. A second direction 102 perpendicular to first direction 101 in which orientation flat 55 extends is a <1-100> direction, for example.

Silicon carbide single crystal substrate 10 (which may be hereinafter simply referred to as "single crystal substrate") is composed of a silicon carbide single crystal. The silicon carbide single crystal has a polytype of 4H-SiC, for example. 4H-SiC is superior to other polytypes in terms of electron mobility, dielectric strength, and the like. Silicon carbide single crystal substrate 10 includes an n type impurity such as nitrogen, for example. The conductivity type of silicon carbide single crystal substrate 10 is n type, for example. First main surface 11 corresponds to a plane inclined by more than or equal to 0.5° and less than or equal to 8° relative to a (0001) plane, for example. The inclination direction (off direction) of first main surface 11 is the <11-20> direction, for example.

Silicon carbide layer 20 is an epitaxial layer formed on silicon carbide single crystal substrate 10. Silicon carbide layer 20 has a polytype of 4H-SiC. Silicon carbide layer 20 is in contact with first main surface 11. Silicon carbide layer 20 includes an n type impurity such as nitrogen, for example. The conductivity type of silicon carbide layer 20 is n type. The concentration of the n type impurity in silicon carbide layer 20 may be lower than the concentration of the n type impurity in silicon carbide single crystal substrate 10.

As shown in FIG. 1, second main surface 30 has a maximum diameter 111 (diameter) of more than or equal to 100 mm. The diameter of maximum diameter 111 may be more than or equal to 150 mm, may be more than or equal to 200 mm, or may be more than or equal to 250 mm. The upper limit of maximum diameter 111 is not limited in particular. The upper limit of maximum diameter 111 may be 300 mm, for example.

Second main surface 30 corresponds to a plane inclined by more than or equal to 0.5° and less than or equal to 8° relative to a (0001) plane. The inclination direction (off direction) of first main surface 11 is the <11-20> direction, for example. The off direction may be a <1-100> direction or may be a direction including a <11-20> direction component and a <1-100> direction component, for example. The inclination angle (off angle) relative to the (0001) plane may be more than or equal to 1° or may be more than or equal to 2°. The off angle may be less than or equal to 7° or may be less than or equal to 6°.

(In-Plane Uniformity of Carrier Concentration)

Silicon carbide layer 20 contains nitrogen as a dopant. It should be noted that the term "carrier concentration" in the present application means an effective carrier concentration. For example, when the silicon carbide layer includes donor and acceptor, the effective carrier concentration is calculated as the absolute value (|Nd−Na|) of a difference between the donor concentration (Nd) and the acceptor concentration (Na). A method for measuring the carrier concentration will be described later.

The average value of the carrier concentration of silicon carbide layer 20 is more than or equal to $1 \times 10^{14}$ cm$^{-3}$ and less than or equal to $5 \times 10^{16}$ cm$^{-3}$. The average value of the carrier concentration may be less than or equal to $2 \times 10^{16}$ cm$^{-2}$ or may be less than or equal to $9 \times 10^{15}$ cm$^{-3}$, for example. The average value of the carrier concentration may be more than or equal to $1 \times 10^{15}$ cm$^{3}$ or may be more than or equal to $5 \times 10^{15}$ cm$^{-3}$.

In the direction parallel to central region 53, a ratio of the standard deviation of the carrier concentration of silicon carbide layer 20 to the average value of the carrier concentration of silicon carbide layer 20 (i.e., standard deviation/average value) is less than 5%. The ratio of the standard deviation of the carrier concentration of silicon carbide layer 20 to the average value of the carrier concentration of silicon carbide layer 20 may be less than 4%, may be less than 3%, or may be less than 2%. A ratio obtained by dividing, by a value twice as large as the average value, a value obtained by subtracting the minimum value of the carrier concentration of silicon carbide layer 20 from the maximum value of the carrier concentration of silicon carbide layer 20 is, for example, less than or equal to 5%, is preferably less than or equal to 4%, is more preferably less than or equal to 3%, and is further preferably less than or equal to 2%.

Figure 3:
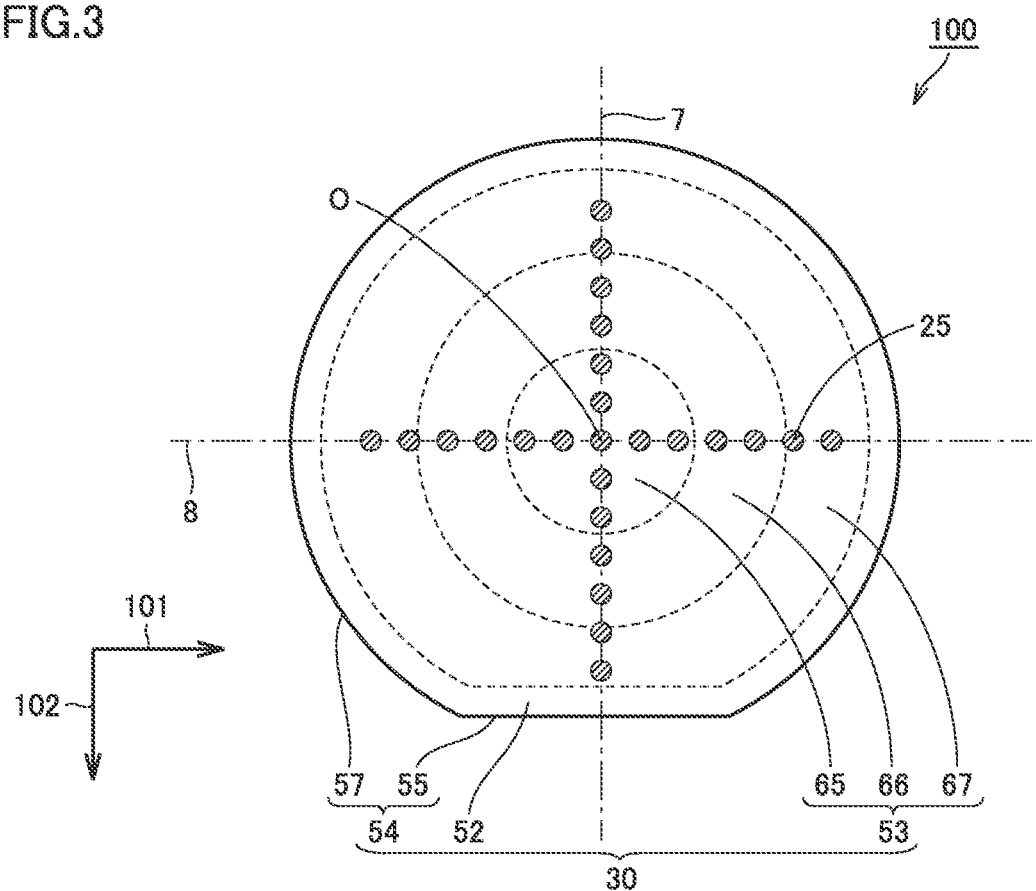
FIG. 3 is a schematic plan view showing measurement locations for carrier concentration and film thickness.

As shown in FIG. 3, it is assumed that there are a first straight line 8 extending through center O of second main surface 30 and parallel to first direction 101, and a second straight line 7 extending through center O of second main surface 30 and parallel to second direction 102, for example. When the radius of central region 53 is assumed as R (in other words, the half of a value obtained by subtracting 6 mm (which is twice as large as the width of outer circumferential region 52) from the maximum diameter of second main surface 30), central region 53 is divided into: a first region 65 that is surrounded by a circle centered on center O of second main surface 30 and having a radius of R/3; a third region 67 that is surrounded by the outer edge of central region 53 and a circle centered on center O and having a radius of 2R/3; and a second region 66 interposed between first region 65 and third region 67. First region 65 includes center O. It should be noted that the center of a circle circumscribing a triangle formed by three arbitrary points on curvature portion 57 may be set as center O of second main surface 30.

The absolute value of a difference between the average value of the carrier concentration of silicon carbide layer 20 in first region 65 and the average value of the carrier concentration of silicon carbide layer 20 in central region 53 is, for example, less than or equal to 5%, and is preferably less than or equal to 3%. Likewise, the absolute value of a difference between the average value of the carrier concentration of silicon carbide layer 20 in second region 66 and the average value of the carrier concentration of silicon carbide layer 20 in central region 53 is, for example, less than or equal to 5%, and is preferably less than or equal to 3%. Likewise, the absolute value of a difference between the average value of the carrier concentration of silicon carbide layer 20 in third region 67 and the average value of the carrier concentration of silicon carbide layer 20 in central region 53 is, for example, less than or equal to 7%, and is preferably less than or equal to 4%.

According to silicon carbide epitaxial substrate 100 according to the present embodiment, the absolute value of the difference between the average value of the carrier concentration of silicon carbide layer 20 in first region 65 and the average value of the carrier concentration of silicon carbide layer 20 in third region 67 is, for example, less than or equal to 7%, and is preferably less than or equal to 4%.

Preferably, the profile of the carrier concentration of silicon carbide layer 20 is M type or W type. When the profile of the carrier concentration is the M type, a location indicating the minimum value of the carrier concentration is in first region 65 or third region 67 and a location indicating the maximum value of the carrier concentration is in second region 66 or third region 67. When the profile of the carrier concentration is the W type, the location indicating the maximum value of the carrier concentration is in first region 65 or third region 67 and the location indicating the minimum value of the carrier concentration is in second region 66 or third region 67.

Next, the following describes the method for measuring the carrier concentration. The carrier concentration is measured using a C-V measuring apparatus employing a mercury probe method, for example. The area of the probe is 0.01 cm$^2$, for example. The carrier concentration is measured at central region 53. As shown in FIG. 3, for example, on a first straight line 8, the carrier concentration is measured at points distant away from center O by ±10 mm, ±20 mm, ±30 mm, ±40 mm, ±50 mm and ±60 mm. Likewise, on a second straight line 7, the carrier concentration is measured at points distant away from center O by ±10 mm, ±20 mm, ±30 mm, ±40 mm, ±50 mm and ±60 mm. The carrier concentration is also measured at center O. In other words, the carrier concentration is measured at a total of 25 measurement regions 25 indicated by circles with hatching in FIG. 3. The average value and standard deviation of the carrier concentration at the total of 25 measurement locations are calculated.

Figure 4:
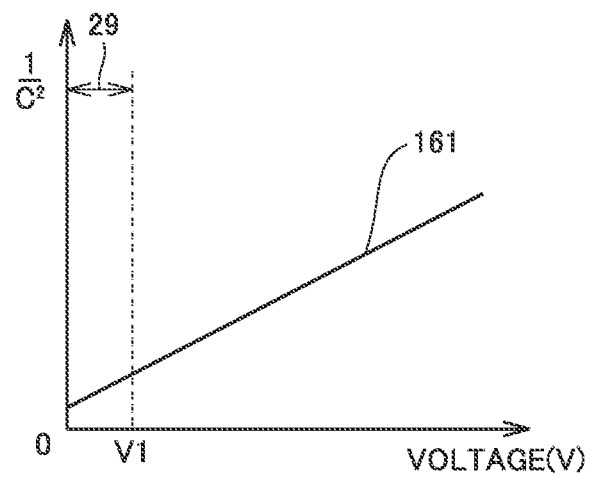
FIG. 4 shows a method for measuring the carrier concentration.

As shown in FIG. 4, measurement data 161 is plotted with the vertical axis representing $1/C^2$ (reciprocal of the square of capacitance) and the horizontal axis representing voltage (V). As shown in FIG. 4, as the voltage becomes larger, the value of the reciprocal of the square of capacitance becomes larger. Based on the inclination of the straight line of measurement data 161, the carrier concentration is determined. As the absolute value of the inclination of measurement data 161 is larger, the carrier concentration is higher. The depth of the measurement of the carrier concentration is dependent on applied voltage. In the present embodiment, a voltage of, for example, 0 V to 5 V (voltage V1 in FIG. 4) is swept in a direction in which a depletion layer is expanded in silicon carbide layer 20. Accordingly, the carrier concentration is measured at a central surface layer 29 (see FIG. 2), which is within about 5 μm to 10 μm in a direction from central region 53 toward first main surface 11.

(In-Plane Uniformity of Thickness of Silicon Carbide Layer)

In central region 53, the average value of thickness 113 of silicon carbide layer 20 is more than or equal to 5 μm and less than or equal to 50 μm, for example. The average value of thickness 113 of silicon carbide layer 20 may be more than or equal to 10 μm, may be more than or equal to 15 μm, or may be more than or equal to 20 μm. The upper limit of thickness 113 of silicon carbide layer 20 is not limited in particular. The upper limit of thickness 113 of silicon carbide layer 20 may be 150 μm, for example.

In the direction parallel to central region 53, the ratio (i.e., standard deviation/average value) of the standard deviation of the thickness of silicon carbide layer 20 to the average value of thickness 113 of silicon carbide layer 20 is less than 5%. The ratio of the standard deviation of the thickness of silicon carbide layer 20 to the average value of thickness 113 of silicon carbide layer 20 is preferably less than 4%, is more preferably less than 3%, is still more preferably less than 2%, and is further preferably less than 1%. A ratio obtained by dividing, by a value twice as large as the average value, a value obtained by subtracting the minimum value of thickness 113 of silicon carbide layer 20 from the maximum value of thickness 113 of silicon carbide layer 20 is, for example, less than or equal to 5%, is preferably less than or equal to 4%, is more preferably less than or equal to 3%, and is further preferably less than or equal to 2%.

Thickness 113 of silicon carbide layer 20 can be measured using FT-IR (Fourier Transform-InfraRed spectrometer), for example. Measurement regions 25 for the thickness of silicon carbide layer 20 may be the same as the measurement locations for the carrier concentration, for example. For example, at the total of 25 measurement regions 25 indicated by the circles with hatching in FIG. 3, the thickness of silicon carbide layer 20 is measured. The average value and standard deviation of the thickness of silicon carbide layer 20 at the total of 25 measurement locations are calculated.

The thickness of silicon carbide layer 20 can be measured in combination with a Fourier transform infrared spectrophotometer (IRPrestige-21) provided by Shimadzu Corporation and an infrared microscope (AIM-8800) provided by Shimadzu Corporation, for example. The thickness of silicon carbide layer 20 measured by the FT-IR is determined using an optical constant difference resulting from a doping concentration difference between silicon carbide layer 20 and silicon carbide single crystal substrate 10. Specifically, the thickness of silicon carbide layer 20 is measured by emitting infrared light to silicon carbide epitaxial substrate 100 and measuring interference caused by reflection from the surface of silicon carbide layer 20 and reflection from the interface between silicon carbide layer 20 and silicon carbide single crystal substrate 10. A range of the measurement wave number is a range of 1000 cm$^{-1}$ to 4000 cm$^{-1}$, for example. A measurement interval is about 4 cm$^{-1}$, for example. An incident angle of the infrared light with respect to silicon carbide epitaxial substrate 100 is about 27°. From an interference waveform obtained by the measurement, the thickness of silicon carbide layer 20 is determined in accordance with the following formula. In the formula, d represents the thickness of the silicon carbide layer, n represents the refractive index (2.7) of the silicon carbide layer, θ represents the incident angle (25°) with respect to the sample, m represents the number of peaks of the calculation wave number range, $k_2$ represents the maximum wave number of the peaks of the calculation wave number range, and $k_1$ represents the minimum wave number of the peaks of the calculation wave number range.

$$d = \frac{m-1}{2\sqrt{n^2 - \sin^2\theta}} \times \frac{1}{(k_2 - k_1)} \quad \text{[Formula 1]}$$

(Arithmetic Mean Roughness: Ra)

Central region 53 has an arithmetic mean roughness (Ra) of less than or equal to 1 nm. The arithmetic mean roughness (Ra) can be measured by an AFM (Atomic Force Microscope), for example. As the AFM, "Dimension3000" provided by Veeco or the like can be employed, for example. For a cantilever of the AFM, a model number "NCHV-10V" provided by Bruker or the like is suitable. Conditions of the AFM can be set as follows. A measurement mode is set at a tapping mode. A measurement region in the tapping mode is set as a 5-μm square. Regarding sampling in the tapping mode, a scanning rate in the measurement region is set at 5 seconds per cycle, the number of scan lines is set at 512, and measurement points per scan line are set at 512. Control displacement for the cantilever is set at 15.50 nm. A measurement range for the arithmetic mean roughness (Ra) is a square region of 5 μm×5 μm, for example. The arithmetic mean roughness (Ra) of central region 53 is preferably less than or equal to 0.3 nm, and is more preferably less than or equal to 0.2 nm.

Figure 23:
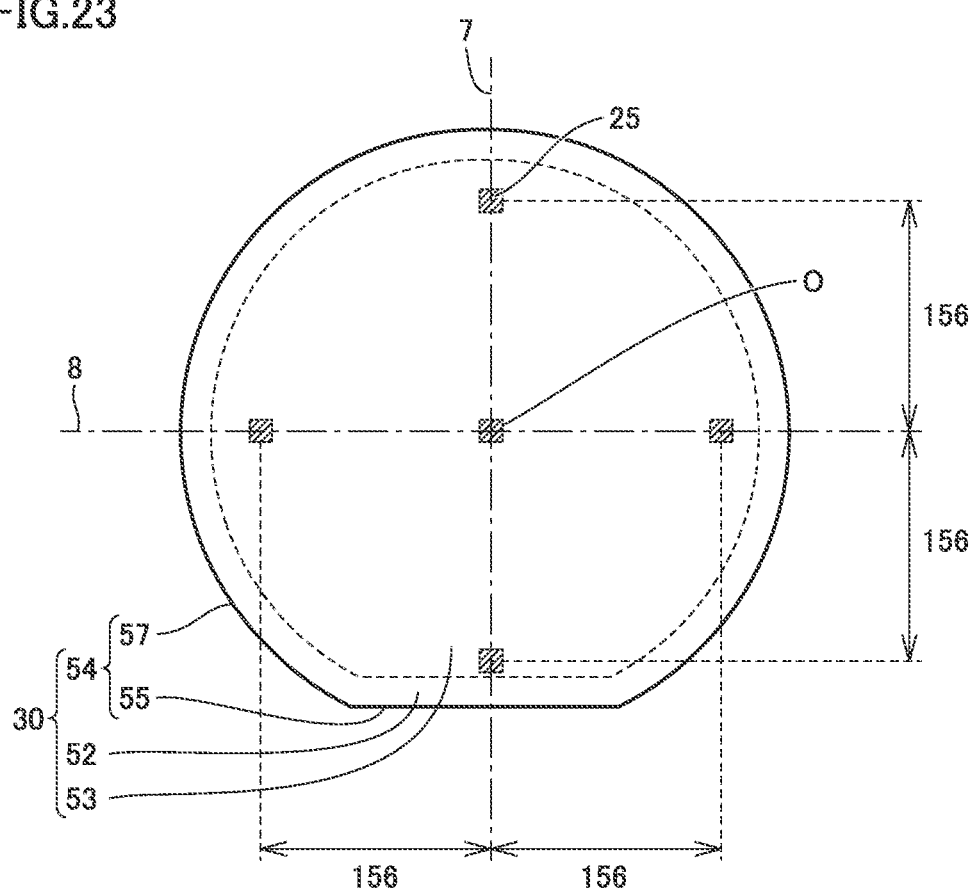
FIG. 23 is a schematic plan view showing measurement locations for Sa, Ra, dislocation, and contact angle.

As shown in FIG. 23, it is assumed that in central region 53, there are first straight line 8 extending through center O of second main surface 30 and parallel to first direction 101, and second straight line 7 extending through center O of second main surface 30 and parallel to second direction 102, for example. Arithmetic mean roughness Ra is measured at the following regions: square regions including points located on first straight line 8 and separated from center O by a certain distance 156 leftward and rightward; square regions including points located on second straight line 7 and separated from center O by certain distance 156 upward and downward; and a square region including center O. For example, arithmetic mean roughness Ra is measured at the following regions: square regions including points distant away from center O by ±60 mm on first straight line 8; square regions including points distant away from center O by ±60 mm on second straight line 7; and the square region including center O (i.e., a total of five measurement regions indicated by hatching in FIG. 23).

(Arithmetic Mean Roughness: Sa)

An arithmetic mean roughness (Sa) of central region 53 is less than or equal to 1 nm. The arithmetic mean roughness (Sa) is a parameter obtained by extending the two-dimensional arithmetic mean roughness (Ra) to three dimensions. The arithmetic mean roughness (Sa) can be measured using a white light interferometric microscope, for example. As the white light interferometric microscope, BW-D507 provided by NIKON can be used, for example. A measurement range for the arithmetic mean roughness (Sa) is a square region of 255 μm×255 μm, for example. The arithmetic mean roughness (Sa) of central region 53 is preferably less than or equal to 0.3 nm, and is more preferably less than or equal to 0.2 nm. For example, arithmetic mean roughness Sa is measured at the following regions: the square regions including points distant away from center O by ±60 mm on first straight line 8; the square regions located including points distant away from center O by ±60 mm on second straight line 7; and the square region including center O (i.e., a total of five measurement regions 25 indicated by hatching in FIG. 23).

(Haze)

Central region 53 has a haze of less than or equal to 50. The haze in central region 53 may be less than or equal to 30 or may be less than or equal to 20. The haze is an index representing a degree of surface roughness. As the surface becomes close to a flat surface, the value of the haze becomes smaller. The haze of a completely flat surface is 0. The unit of the haze is dimensionless. The haze is measured using WASAVI series "SICA 6X" provided by Lasertec, for example. Specifically, light having a wavelength of 546 nm is emitted from a light source such as a mercury xenon lamp to the surface of the silicon carbide epitaxial substrate and the light reflected therefrom is observed using a light receiving element such as a CCD (Charge-Coupled Device), for example. A difference is quantified between the brightness of one certain pixel in the observed image and the brightness of a pixel around the one certain pixel. The haze is obtained by quantifying the difference in brightness between the plurality of pixels in the observed image using the following method.

Specifically, the maximum haze value of square regions obtained by dividing, into 64, one observation field of a square having each side of 1.8 mm±0.2 mm is determined. The one observation field includes an image capturing region with 1024×1024 pixels. The maximum haze value is determined as the absolute value of the edge intensity of the observation field in each of the horizontal and perpendicular directions as calculated by a Sobel filter. By the above-described procedure, the maximum haze values of respective observation fields are observed in the entire central region 53 of second main surface 30 other than outer circumferential region 52. The average value of the maximum haze values of the observation fields is assumed as the haze value in central region 53.

(Downfall Defects and Triangular Defects)

Macroscopic defects may be in central region 53; however, fewer macroscopic defects are more preferable. Each of macroscopic defects is a defect having a planar size of more than or equal to 10 μm and having a perpendicular size, such as height or depth, of more than or equal to several ten nm, for example. Examples of the macroscopic defects include downfall defects, triangular defects, stacking faults, carrot defects, and the like. Each of the downfall defects is a grain-like silicon carbide crystal resulting from falling of a deposit in a growth apparatus onto a surface of the silicon carbide substrate during epitaxial growth. The planar size (diameter) of the downfall is more than or equal to 10 μm and less than or equal to 1 mm, for example. The downfall defect may be 4H-SiC, may be 3C-SiC, or may be caused by a heat insulator, for example. The downfall defect may include a graphite component. In central region 53, the area density of the downfall defects is, for example, less than or equal to 1.0 cm$^{-2}$, is preferably less than or equal to 0.5 cm$^{-2}$, and is more preferably less than or equal to 0.1 cm$^{-2}$.

Each of the triangular defects is an extended defect having a triangular outer shape when viewed in a plan view. When viewed in a direction perpendicular to the surface of the silicon carbide layer, each of the extended defects is a defect spreading two-dimensionally. For example, the extended defect may be an extended dislocation constituted of: two partial dislocations branched from a complete dislocation; and a strip-like stacking fault connecting between the two partial dislocations. The triangular defect may be 4H-SiC, or may be 3C-SiC, for example. In central region 53, the area density of the triangular defects is, for example, less than or equal to 1.0 cm$^{-2}$, is preferably less than or equal to 0.5 cm$^{-2}$, and is more preferably less than or equal to 0.1 cm$^{-2}$.

When central region 53 is divided into square regions with each side of 6 mm, a ratio of the number of square regions having at least one of a downfall defect and a triangular defect to the number of all the square regions is less than or equal to 10%, for example. Specifically, central region 53 is hypothetically divided into a plurality of square regions each having a size of 6 mm×6 mm. All the square regions are observed by SICA, for example. Square regions each having at least one of a downfall defect and a triangular defect are specified. By dividing the number of the square regions each having at least one of the downfall defect and the triangular defect by the number of all the square regions, a ratio of the square regions each having at least one of the downfall defect and the triangular defect is calculated. The ratio of the square regions each having at least one of the downfall defect and the triangular defect is preferably less than or equal to 5%, and is more preferably less than or equal to 1%.

(Carrot Defects)

Carrot defects may be in central region 53; however, fewer carrot defects are more preferable. Each of the carrot defects is one type of an extended defect. When viewed in the direction perpendicular to second main surface 30, each of the carrot defects has an elongated shape. Typically, the width of carrot defect 90 in the longitudinal direction is more than or equal to 100 μm and less than or equal to 500 μm. The maximum value of the width of carrot defect 90 in the short direction is more than or equal to 10 μm and less than or equal to 100 μm, for example. The carrot defect has a portion protruding from second main surface 30. The height of the protruding portion is more than or equal to 0.1 μm and less than or equal to 2 μm, for example.

A value obtained by dividing the number of the carrot defects by the total number of shallow pits 86 and deep pits 87 is less than or equal to 1/500. The value obtained by dividing the number of the carrot defects by the total number of shallow pits 86 and deep pits 87 is preferably less than or equal to 1/1000, and is more preferably less than or equal to 1/5000. The density of the carrot defects in central region 53 is a value obtained by dividing the number of all the carrot defects in central region 53 by the area of central region 53. The density of the carrot defects is less than or equal to 1 cm$^{-2}$, for example. The density of the carrot defects is preferably less than or equal to 0.5 cm$^{-2}$, and is more preferably less than or equal to 0.1 cm$^{-2}$.

The downfall defects, triangular defects, and carrot defects can be specified by observing second main surface 30 using a defect inspection apparatus including a confocal differential interference microscope, for example. Examples of the defect inspection apparatus including the confocal differential interference microscope include the above-described WASAVI series "SICA 6X" provided by Lasertec. The magnification of an objective lens thereof is ×10, for example. A threshold value for detection sensitivity of the defect inspection apparatus is determined using a standard sample. The downfall defect, triangular defect, and carrot defect are defined beforehand in consideration of typical planar shape, size, and the like of downfall defect, triangular defect, and carrot defect. Based on an observed image, the type, location, and number of defects satisfying the definition are specified.

(Stacking Faults)

Stacking faults may be in central region 53; however, fewer stacking faults are more preferable. When viewed in the direction perpendicular to central region 53, the shape of each of the stacking faults is triangular or trapezoidal, for example. The stacking fault may be 2H-SiC, may be 3C-SiC, or may be 8H-SiC. In central region 53, the area density of the stacking faults is, for example, less than or equal to 1.0 cm$^{-2}$, is preferably less than or equal to 0.5 cm$^{-2}$, and is more preferably less than or equal to 0.1 cm$^{-2}$. The stacking faults can be measured by a PL (Photo Luminescence) imaging method, for example. As a PL measuring apparatus, PLIS-100 provided by Photon Design can be used, for example. Light from a mercury xenon lamp is emitted to enter a sample via a 313-nm band pass filter and PL light is detected via a 750-nm low pass filter. The stacking faults can be measured using a contrast difference from the surroundings.

(Pits)

Figure 5:
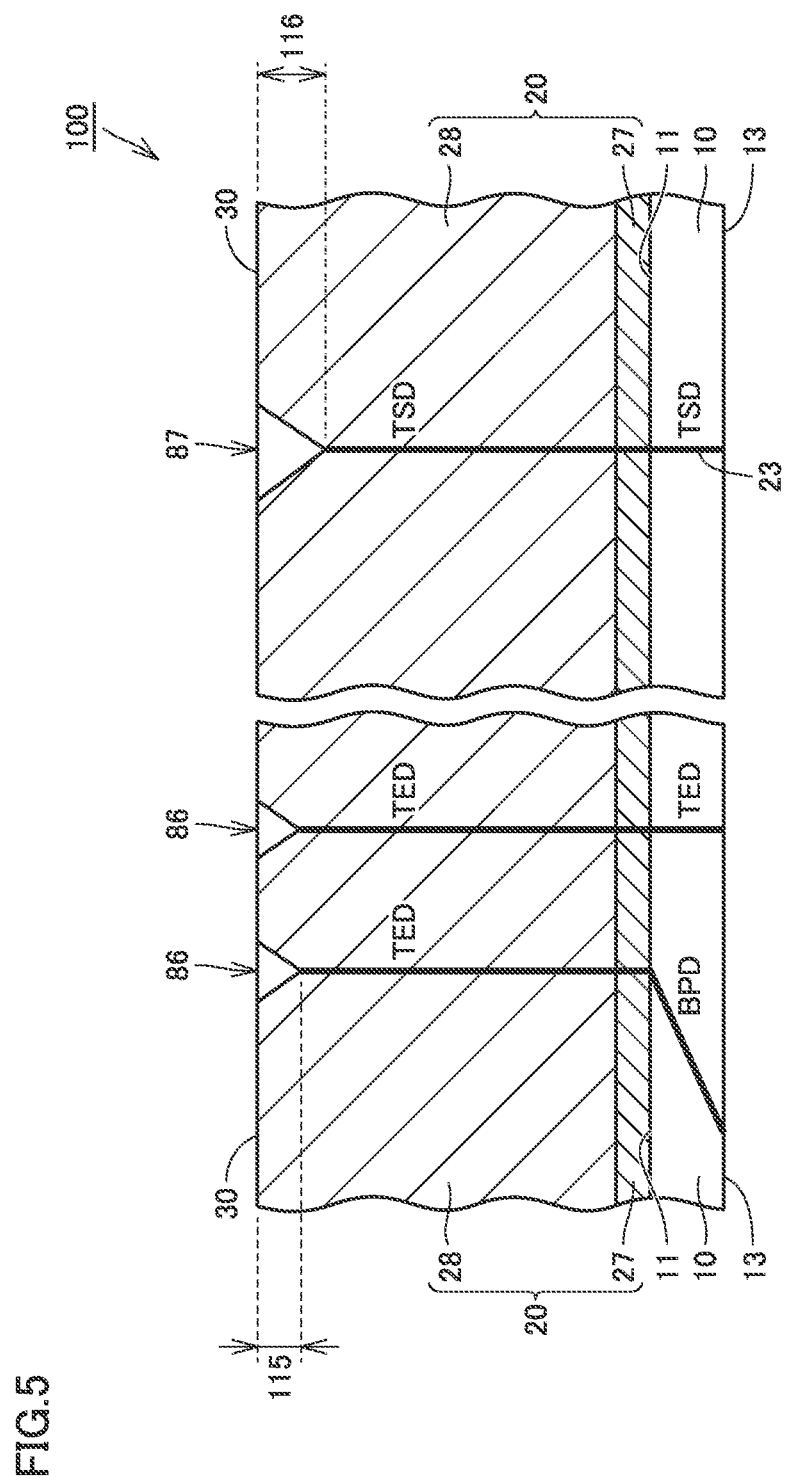
FIG. 5 is a schematic cross sectional view showing configurations of a shallow pit (left side) and a deep pit (right side).

As shown in FIG. 5, in central region 53, there may be shallow pits 86 each having a maximum depth 115 of less than 8 nm and deep pits 87 each having a maximum depth 116 of more than or equal to 8 nm; however, fewer shallow pits 86 and deep pits 87 are more preferable. These pits may be originated from threading screw dislocations (TSD), threading edge dislocations (TED), and the like in the epitaxial layer. Shallow pits 86 and deep pits 87 may be originated from threading screw dislocations extending in silicon carbide single crystal substrate 10 and silicon carbide layer 20. As shown in FIG. 5, a basal plane dislocation (BPD) in silicon carbide single crystal substrate 10 may be converted into a TED at a boundary between silicon carbide single crystal substrate 10 and silicon carbide layer 20, and a shallow pit 86 originated from the TED extending in silicon carbide layer 20 may be exposed at second main surface 30. A shallow pit 86 originated from a TED extending in silicon carbide single crystal substrate 10 and silicon carbide layer 20 may be exposed at the second main surface. Each of shallow pits 86 is a microscopic defect in the form of a groove. It is considered that shallow pits 86 are originated from threading screw dislocations, threading edge dislocations, and threading mixed dislocations in silicon carbide layer 20. In the specification of the present application, a threading mixed dislocation including a screw dislocation component is also assumed as a threading screw dislocation.

As shown in FIG. 5, maximum depth 116 of deep pit 87 from central region 53 is more than or equal to 8 nm. In central region 53, the area density of deep pits 87 is less than or equal to 100 cm$^{-2}$, for example. A smaller area density of deep pits 87 is more desirable. The area density of deep pits 87 is preferably less than or equal to 10 cm$^{-2}$, and is more preferably less than or equal to 1 cm$^{-2}$. The maximum depth of deep pit 87 from central region 53 may be more than or equal to 20 nm. In other words, the area density of deep pits 87 originated from threading screw dislocations 23 and each having a maximum depth of more than or equal to 20 nm from central region 53 is, for example, less than or equal to 100 cm$^{-2}$, is preferably less than or equal to 10 cm$^{-2}$, and is more preferably less than or equal to 1 cm$^{-2}$.

Figure 6:
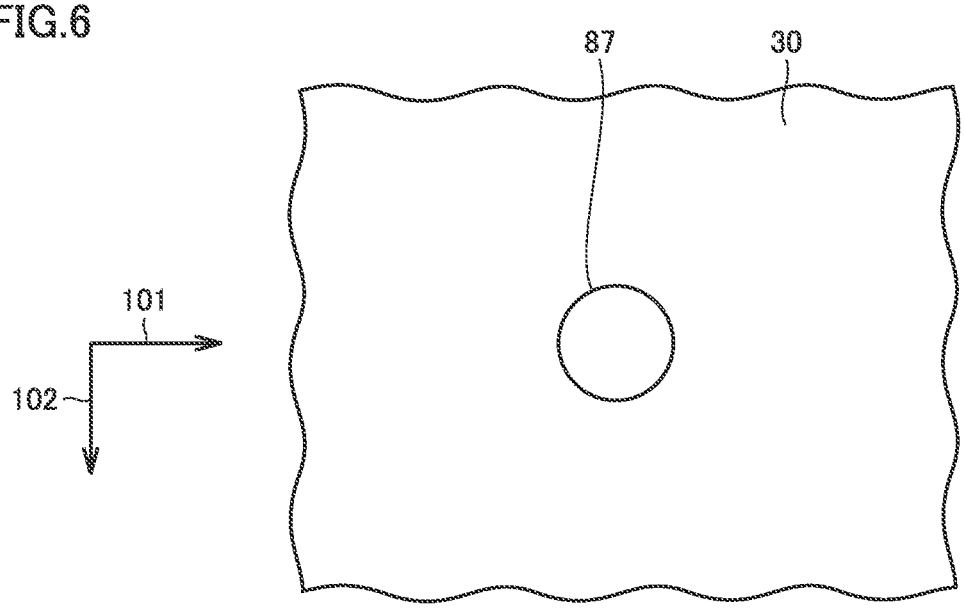
FIG. 6 is a schematic plan view showing a configuration of a first example of the deep pit.
Figure 7:
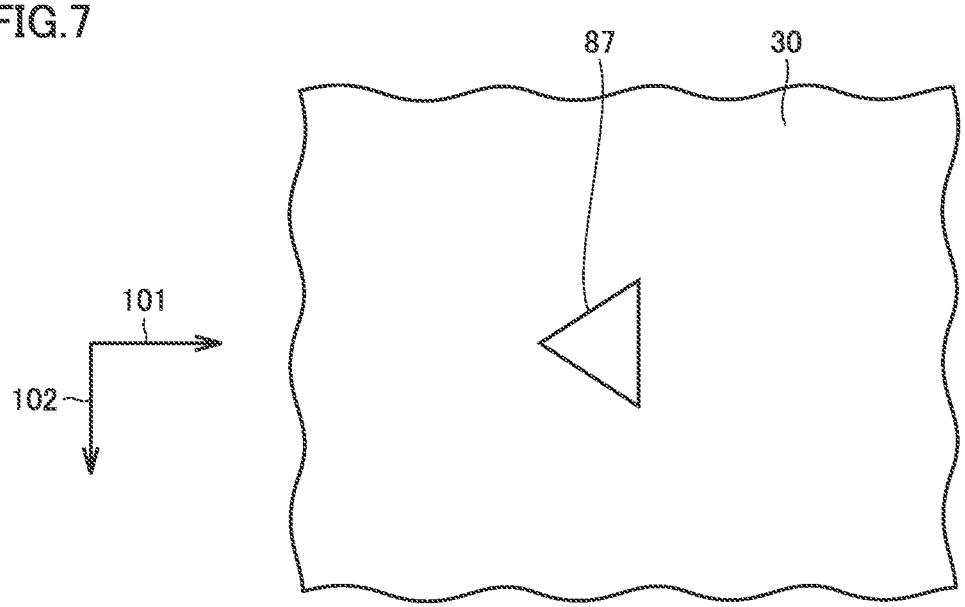
FIG. 7 is a schematic plan view showing a configuration of a second example of the deep pit.

As shown in FIG. 6, when viewed in the direction perpendicular to second main surface 30, the planar shape of each of deep pits 87 may be circular. When viewed in the direction perpendicular to second main surface 30, the planar shape of deep pit 87 may be triangular as shown in FIG. 7 or may be bar-like as shown in FIG. 8.

Figure 8:
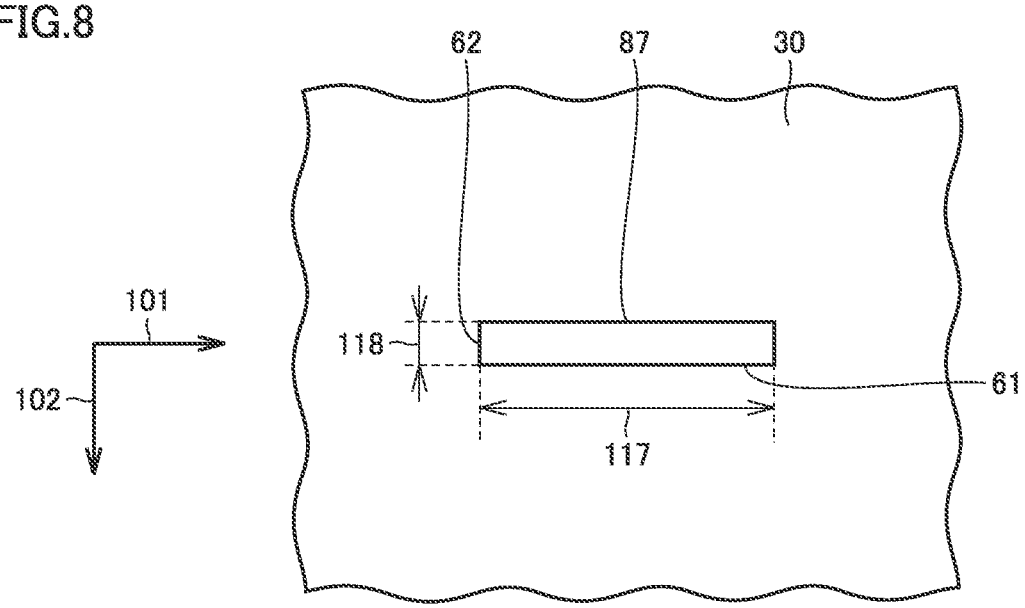
FIG. 8 is a schematic plan view showing a configuration of a third example of the deep pit.

As shown in FIG. 8, when viewed in the direction perpendicular to central region 53, the planar shape of a bar-like deep pit 87 may include: a first side 61 extending in first direction 101; and a second side 62 extending in second direction 102 perpendicular to first direction 101. Width 117 of first side 61 is twice or more as large as width 118 of second side 62, for example. Width 117 of first side 61 may be 5 or more times as large as width 118 of second side 62. Width 117 of first side 61 may be more than or equal to 5 μm, or may be more than or equal to 25 μm, for example. Width 117 of first side 61 may be less than or equal to 50 μm, or may be less than or equal to 35 μm, for example. Width 118 of second side 62 may be more than or equal to 1 μm, or may be more than or equal to 2 μm, for example. Width 118 of second side 62 may be less than or equal to 5 μm or may be less than or equal to 4 μm, for example.

It can be checked using an etch pit method whether or not a pit is originated from a threading screw dislocation, for example. According to the etch pit method, a pit originated from a threading screw dislocation can be distinguished, for example, as follows. Etching conditions described here are just exemplary, and may be changed depending on the thickness of the epitaxial layer, doping concentration, and the like, for example. The below-described conditions are assumed for a case where the thickness of the epitaxial layer is about 10 μm to 50 μm.

For the etching, molten potassium hydroxide (KOH) is used, for example. The temperature of the molten KOH is set at about 500 to 550° C. Etching time is set at about 5 to 10 minutes. After the etching, second main surface 30 is observed using a Nomarski differential interference microscope. A pit originated from a threading screw dislocation forms an etch pit larger than a pit originated from a threading edge dislocation. The etch pit originated from the threading screw dislocation has a hexagonal planar shape, and the length of a diagonal line of the hexagon is typically about 30 to 50 μm, for example. The etch pit originated from the threading edge dislocation has a hexagonal planar shape, and is smaller than the etch pit originated from the threading screw dislocation, for example. In the etch pit originated from the threading edge dislocation, the length of a diagonal line of the hexagon is typically about 15 to 20 μm.

The maximum depth of the pit from second main surface 30 can be measured using AFM. The AFM as employed herein may be "Dimension3000" provided by Veeco, for example. For a cantilever of the AFM, the model type "NCHV-10V" provided by Bruker or the like is suitable. Conditions of the AFM can be set as follows. A measurement mode is set at a tapping mode. A measurement region in the tapping mode is set as a 5-μm square. For sampling in the tapping mode, a scanning rate in the measurement region is set at 5 seconds per cycle, the number of scan lines is set at 512, and measurement points per scan line are set at 512. A control displacement for the cantilever is set at 15.50 nm.

The shape of each pit can be specified by observing second main surface 30 using a defect inspection apparatus including a confocal differential interference microscope. Examples of the defect inspection apparatus including the confocal differential interference microscope include the above-described WASAVI series "SICA 6X" provided by Lasertec or the like. The magnification of an objective lens thereof may be ×10. A threshold value for detection sensitivity of the defect inspection apparatus is determined using a standard sample. Accordingly, by using the defect inspection apparatus, the shape of a pit formed in a target sample can be evaluated quantitatively.

The area density of the pits each having a maximum depth of more than or equal to 8 nm from second main surface 30 is measured by using both the AFM measurement and the defect inspection apparatus. Depth data in the AFM measurement is associated with a pit image in the confocal microscope measurement, thereby defining the shape of a pit having a maximum depth of more than or equal to 8 nm. Central region 53 is analyzed entirely to detect pits that satisfy the definition. By dividing the number of the detected pits by the measurement area, the area density of the pits can be calculated.

(Trapezoidal Defects)

Figure 9:
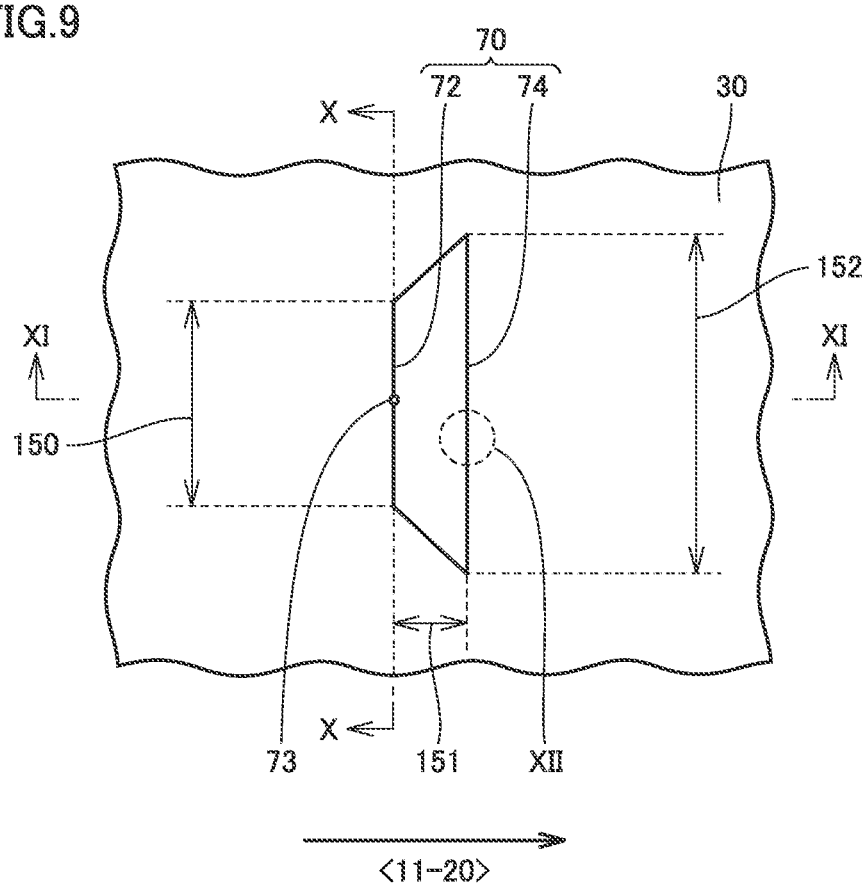
FIG. 9 is a schematic plan view showing a configuration of a trapezoidal defect.

As shown in FIG. 9, in central region 53, there may be trapezoidal defects 70, each of which is a trapezoidal depression; however, fewer trapezoidal defects 70 are more preferable. In central region 53, the area density of trapezoidal defects 70 is less than or equal to 10 cm$^{-2}$, for example. A smaller defect density of the trapezoidal defects is more preferable. The defect density of the trapezoidal defects is preferably less than or equal to 5 cm$^{-2}$, and is more preferably less than or equal to 1 cm$^{-2}$.

When viewed in the direction perpendicular to central region 53, each of trapezoidal defects 70 includes an upper base portion 72 and a lower base portion 74, each of which crosses the <11-20> direction. Width 150 of upper base portion 72 is more than or equal to 0.1 μm and less than or equal to 100 μm, for example. Width 152 of lower base portion 74 is more than or equal to 50 μm and less than or equal to 5000 μm, for example. A distance 151 between upper base portion 72 and lower base portion 74 in the direction parallel to the <11-20> direction may be shorter than upper base portion 72. Upper base portion 72 may include a protrusion 73. Lower base portion 74 may include a plurality of step-bunchings 75.

Figure 10:
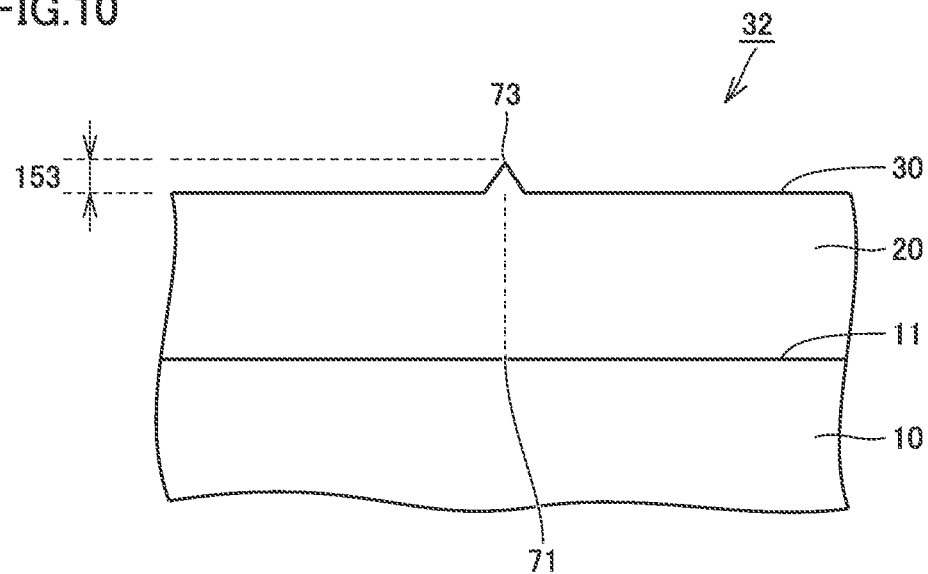
FIG. 10 is a schematic cross sectional view along an X-X line of FIG. 9.

FIG. 10 is a schematic cross sectional view along an X-X line in FIG. 9. As shown in FIG. 10, upper base portion 72 may include protrusion 73 (bump). Protrusion 73 may be located at substantially the center of upper base portion 72. In upper base portion 72, protrusion 73 may protrude from second main surface 30 in the direction substantially perpendicular to second main surface 30. Height 119 of protrusion 73 is about more than or equal to 5 nm and less than or equal to 20 nm. Height 153 of protrusion 73 can be measured by a white light interferometric microscope ("BW-D507" provided by NIKON), for example. For a light source of the white light interferometric microscope, a mercury lamp can be employed. An observation field can be 250 μm×250 μm.

Figure 11:
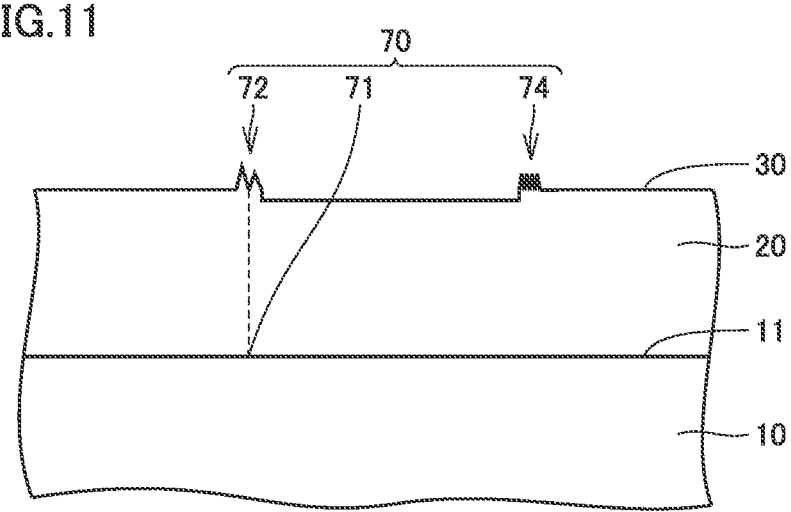
FIG. 11 is a schematic cross sectional view along an XI-XI line of FIG. 9.

FIG. 11 is a schematic cross sectional view along an XI-XI line of FIG. 9. In a portion inside trapezoidal defect 70, i.e., a region between upper base portion 72 and lower base portion 74, the surface of silicon carbide layer 20 is recessed slightly toward the single crystal substrate 10 side.

In other words, trapezoidal defect 70 includes a recess provided in second main surface 30. Trapezoidal defect 70 may have an origin 71 at an interface between single crystal substrate 10 and silicon carbide layer 20. As shown in FIG. 10, a dislocation extending from origin 71 may be connected to protrusion 73 described above.

Figure 12:
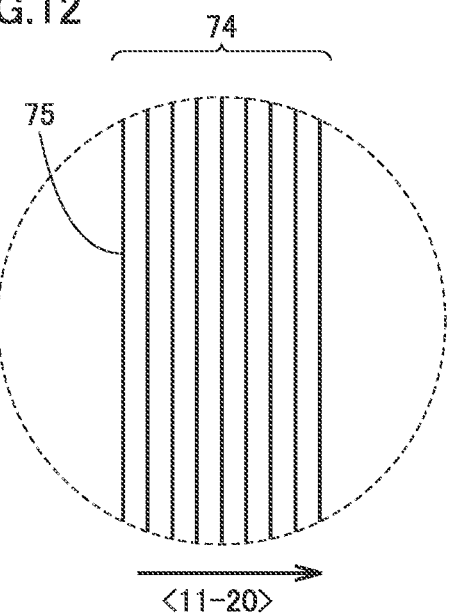
FIG. 12 is an enlarged view of an XII region of FIG. 9.

FIG. 12 is an enlarged view of a region XII of FIG. 9. As shown in FIG. 12, lower base portion 74 may include a plurality of step-bunchings 75. The term "step-bunching" refers to a line defect including a bunch of a plurality of atomic steps to form a step of more than or equal to 1 nm. The size of the step in the step-bunching is about 1 to 5 nm, for example. The size of the step in the step-bunching can be measured by AFM, for example. The number of step-bunchings 75 included in lower base portion 74 may be about 2 to 100, or may be 2 to 50, for example.

Each of the trapezoidal defects in second main surface 30 can be observed using a Nomarski type optical microscope (for example, the product name "MX-51" provided by Olympus), for example. For example, by entirely analyzing central region 53 at a magnification of ×50 to ×400 and dividing the number of detected defects by the area of central region 53, the defect density of trapezoidal defects 70 can be calculated.

(Basal Plane Dislocations)

Figure 13:
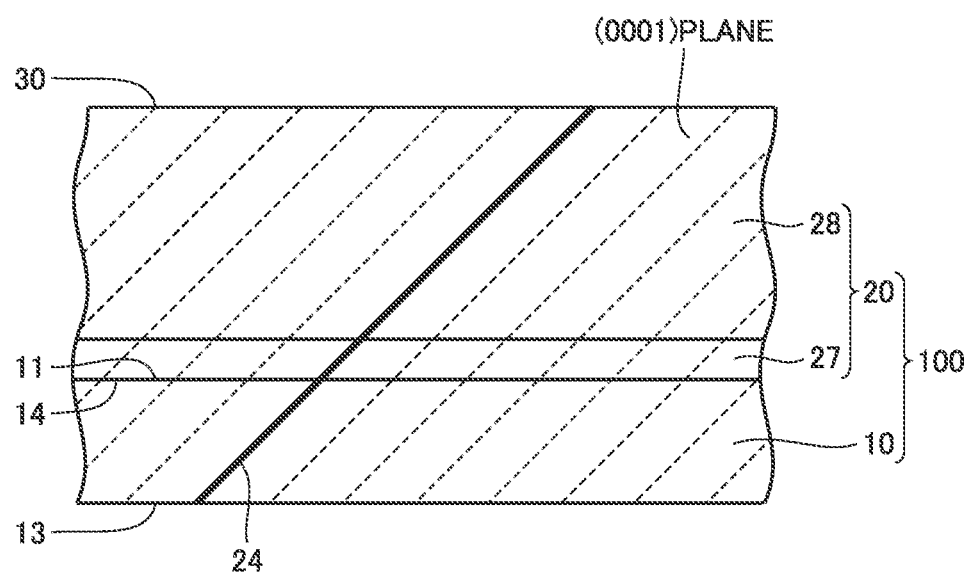
FIG. 13 is a schematic plan view showing a configuration of a basal plane dislocation.

As shown in FIG. 13, basal plane dislocations 24 may be in central region 53; however, fewer basal plane dislocations 24 are more preferable. Each of basal plane dislocations 24 is a dislocation extending in the (0001) plane. Basal plane dislocation 24 may have one end exposed at third main surface 13, and may have the other end exposed at second main surface 30. In central region 53, the area density of basal plane dislocations 24 is less than or equal to 10 $cm^{-2}$, for example. In central region 53, the area density of basal plane dislocations 24 is preferably less than or equal to 1 $cm^{-2}$, and is more preferably less than or equal to 0.1 $cm^{-2}$.

(Threading Screw Dislocations and Threading Edge Dislocations)

Threading screw dislocations may be in central region 53; however, fewer threading screw dislocations are more preferable. The area density of the threading screw dislocations in central region 53 is less than or equal to 1000 $cm^{-2}$, for example. The area density of the threading screw dislocations in central region 53 is preferably less than or equal to 500 $cm^{-2}$, and is more preferably less than or equal to 100 $cm^{-2}$. Likewise, threading edge dislocations may be in central region 53; however, fewer threading edge dislocations are more preferable. The area density of the threading edge dislocations in central region 53 is less than or equal to 5000 $cm^{-2}$, for example. The area density of the threading screw dislocations in central region 53 is preferably less than or equal to 3000 $cm^{-2}$, and is more preferably less than or equal to 1000 $cm^{-2}$.

Next, the following describes a method for measuring the area densities of the basal plane dislocations, threading screw dislocations, and threading edge dislocations.

The area densities of the above-described dislocations can be checked using the etch pit method, for example. For the etching, molten potassium hydroxide (KOH) is used, for example. The temperature of the molten KOH is set at about 500 to 550° C. Etching time is set at about 5 to 10 minutes. After the etching, second main surface 30 is observed using a Nomarski differential interference microscope. Measurement region 25 can be a square region of 0.3 mm×0.3 mm. For example, the above-described dislocations are measured at the following regions: the square regions including points distant away from center O by ±60 mm on first straight line 8; the square regions including points distant away from center O by ±60 mm on second straight line 7; and the square region including center O (i.e., a total of five measurement regions indicated by hatching in FIG. 23). It should be noted that the basal plane dislocation may be measured by the PL (Photo Luminescence) imaging method. In the case of the PL imaging method, the area of the measurement region is 6 mm×6 mm, for example.

(Dislocation Arrays of Half Loops Arranged Along Straight Line Perpendicular to Off Direction)

Figure 14:
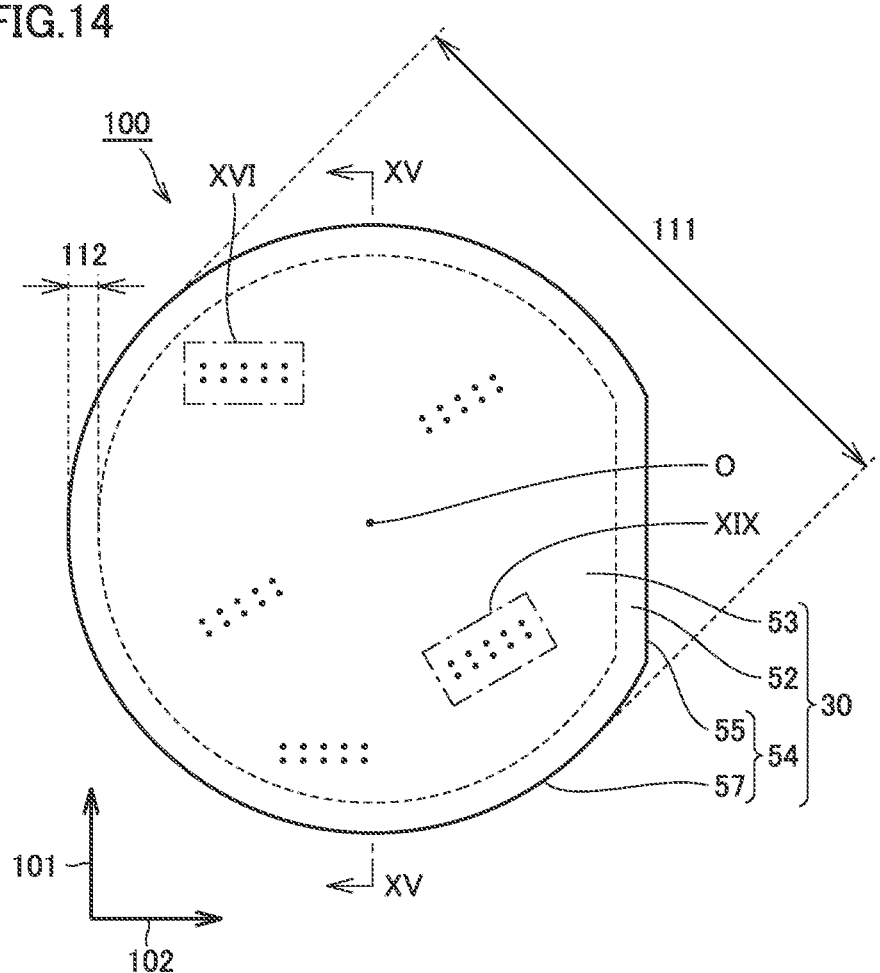
FIG. 14 is a schematic plan view showing a configuration of a silicon carbide epitaxial substrate according to the present embodiment.
Figure 15:
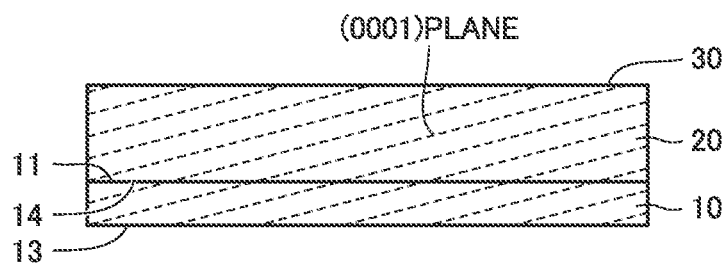
FIG. 15 is a schematic cross sectional view along an XV-XV line of FIG. 14.
Figure 16:
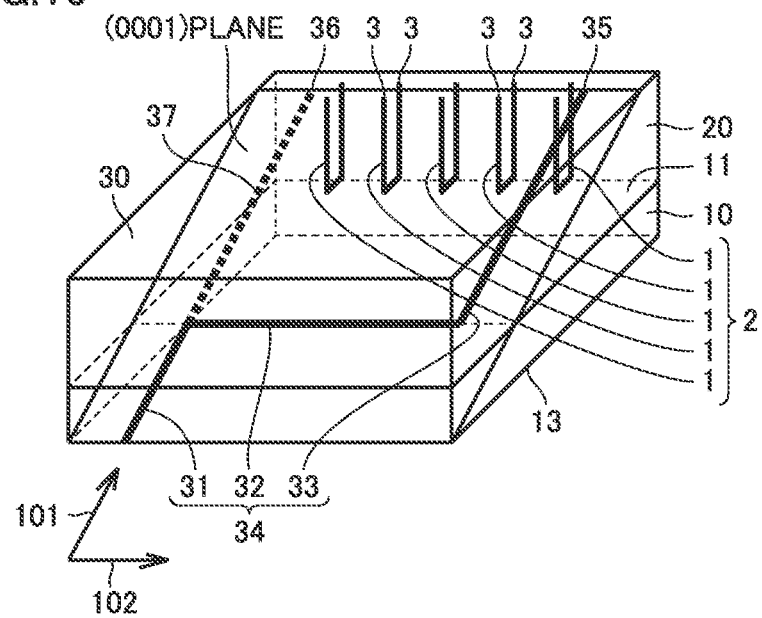
FIG. 16 is a schematic perspective view in a region XVI of FIG. 14.

As shown in FIG. 14 and FIG. 16, in central region 53, there may be first dislocation arrays 2 of first half loops 1 arranged along straight lines perpendicular to the off direction; however, fewer first dislocation arrays 2 are more preferable. Each of first dislocation arrays 2 is constituted of a plurality of first half loops 1. When the off direction is first direction 101, the direction perpendicular to the off direction is second direction 102. Each of first half loops 1 includes a pair of threading edge dislocations exposed at second main surface 30 (see FIG. 15). The area density of first dislocation arrays 2 in central region 53 is less than or equal to 10 $cm^{-2}$. The area density of first dislocation arrays 2 in central region 53 is preferably less than or equal to 5 $cm^{-2}$, and is more preferably less than or equal to 1 $cm^{-2}$.

Next, the following describes a method for measuring the area density of the dislocation arrays.

First, central region 53 is etched by molten KOH (potassium hydroxide), thereby forming etch pits in central region 53. The temperature of the molten KOH is 515° C., for example. An etching time by the molten KOH is 8 minutes, for example. Next, an etch pit formed in central region 53 is observed using an optical microscope. Central region 53 is divided into square regions each having a size of 1 cm×1 cm in the form of a lattice, for example. The area densities of the dislocation arrays are measured in all the square regions. The expression "the area density of first dislocation arrays 2 in central region 53 is less than or equal to 10 $cm^{-2}$" means that the area density of first dislocation arrays 2 is less than or equal to 10 $cm^{-2}$ in each of all the square regions. It should be noted that the vicinity of the outer circumference of central region 53 is rounded and is therefore unable to be divided into a square region. In the calculation for the area density of the dislocation arrays, the area density in such a region unable to be divided into a square region is not taken into consideration.

As shown in FIG. 16, each of first half loops 1 has a substantially U shape. A curved portion of first half loop 1 is provided in silicon carbide layer 20. End portions 3 of the pair of threading edge dislocations are exposed at second main surface 30. The curved portion of first half loop 1 may be a dislocation other than the threading edge dislocation. Silicon carbide epitaxial substrate 100 includes basal plane dislocations 34. Each of basal plane dislocations 34 is constituted of a first portion 31, a second portion 32, and a third portion 33. First portion 31 is a basal plane dislocation in silicon carbide single crystal substrate 10. Second portion 32 is an interface dislocation at an interface between silicon carbide single crystal substrate 10 and silicon carbide layer 20. Third portion 33 is a basal plane dislocation in silicon carbide layer 20. First portion 31 is connected to second portion 32. Second portion 32 is connected to third portion 33. First portion 31 is exposed at third main surface 13 of silicon carbide single crystal substrate 10. Third portion 33 is exposed at second main surface 30 of silicon carbide layer 20. In other words, one end portion 35 of basal plane dislocation 34 is exposed at second main surface 30, and the other end portion is exposed at third main surface 13.

As shown in FIG. 16, first dislocation array 2 may be located between one end portion 35 of basal plane dislocation 34 and a point 36 at which an imaginary line 37 is exposed at second main surface 30. Imaginary line 37 is obtained by extending first portion 31 to the silicon carbide layer 20 side along the extending direction of first portion 31. In other words, each of the plurality of first half loops 1 included in first dislocation array 2 may be located between point 36 and end portion 35. That is, when viewed in the direction perpendicular to second main surface 30, first dislocation array 2 may be located between imaginary line 37 and third portion 33.

Figure 17:
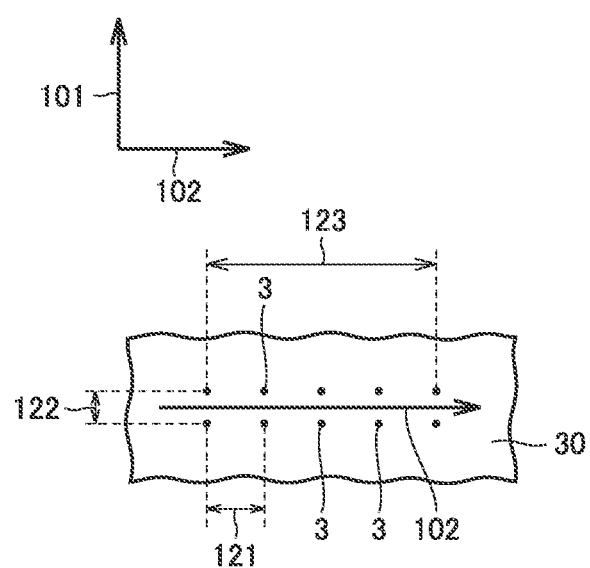
FIG. 17 is a schematic plan view in region XVI of FIG. 14.

As shown in FIG. 17, in second direction 102, length 123 of first dislocation array 2 is more than or equal to 0.1 mm and less than or equal to 50 mm, for example. In first direction 101, a distance 122 between one end portion 3 and the other end portion 3 is more than or equal to 1 μm and less than or equal to 10 μm, for example. In second direction 102, a distance 121 between two adjacent first half loops 1 is more than or equal to 1 μm and less than or equal to 100 μm, for example. Distance 121 may be longer than distance 122. Two end portions 3 may be located in first direction 101. An interval between two adjacent first half loops may be the same, or may be different. When viewed in the direction perpendicular to second main surface 30, each of the plurality of first half loops 1 overlaps with the straight line parallel to second direction 102. The longitudinal direction of first dislocation array 2 is second direction 102. The longitudinal direction of first dislocation array 2 may be parallel to the extending direction of the interface dislocation.

Figure 18:
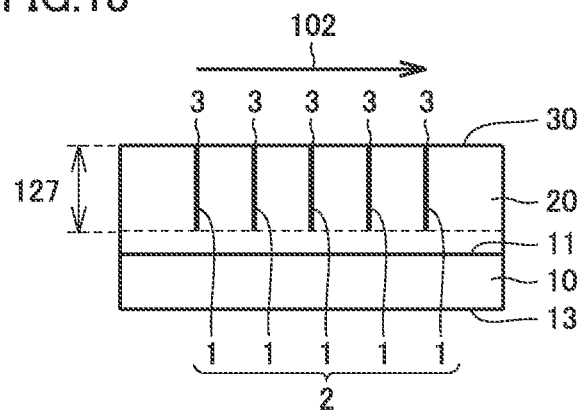
FIG. 18 is the schematic cross sectional view in region XVI of FIG. 14.

As shown in FIG. 18, in the direction perpendicular to second main surface 30, the depths of the plurality of first half loops 1 may be substantially the same. The depth of each of first half loops 1 is the length of the half loop in the direction perpendicular to second main surface 30. The depth of first half loop 1 may be smaller than the thickness of silicon carbide layer 20. First half loop 1 may be separated from silicon carbide single crystal substrate 10.

(Dislocation Arrays of Half Loops Arranged Along Straight Line Inclined Relative to Off Direction)

Figure 19:
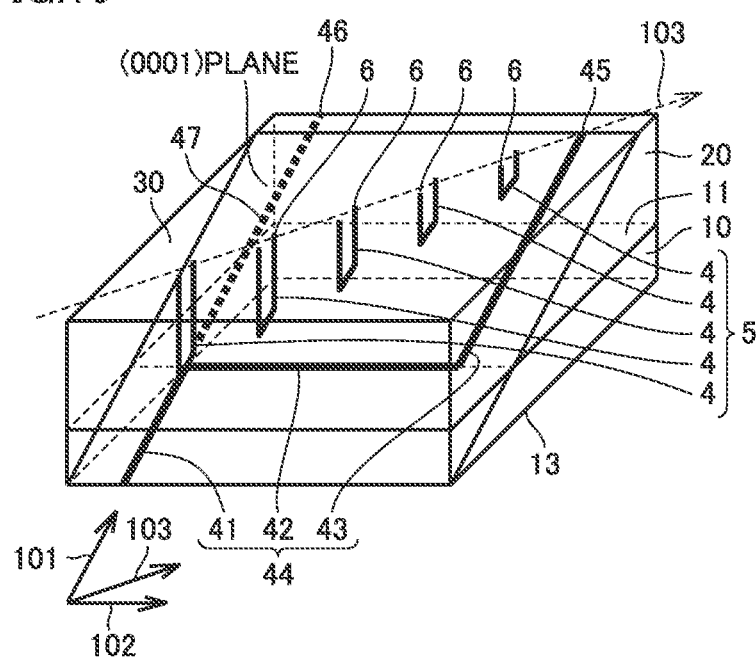
FIG. 19 is a schematic perspective view in a region XIX of FIG. 14.

As shown in FIG. 14 and FIG. 19, in central region 53, there may be second dislocation arrays 5 of second half loops 4 arranged along straight lines inclined relative to the off direction; however, fewer second dislocation arrays 5 are more preferable. Each of second dislocation arrays 5 is constituted of a plurality of second half loops 4. Second half loops 4 are arranged along a third direction 103 parallel to the straight line inclined relative to both first direction 101 and second direction 102. Each of second half loops 4 includes a pair of threading edge dislocations exposed at second main surface 30. In central region 53, the area density of first dislocation arrays 2 may be lower than the area density of second dislocation arrays 5. The area density of second dislocation arrays 5 in central region 53 may be higher than 10 cm$^{-2}$. There may be a multiplicity of first dislocation arrays 2 near outer circumferential region 52, whereas there may be a multiplicity of second dislocation arrays 5 near the center of central region 53.

As shown in FIG. 19, each of second half loops 4 has a substantially U shape. A curved portion of second half loop 4 is provided in silicon carbide layer 20. End portions 6 of the pair of threading edge dislocations are exposed at second main surface 30. The curved portion of second half loop 4 may be a dislocation other than the threading edge dislocation. Silicon carbide epitaxial substrate 100 includes basal plane dislocations 44. Each of basal plane dislocations 44 is constituted of a fourth portion 41, a fifth portion 42, and a sixth portion 43. Fourth portion 41 is a basal plane dislocation in silicon carbide single crystal substrate 10. Fifth portion 42 is an interface dislocation at an interface between silicon carbide single crystal substrate 10 and silicon carbide layer 20. Sixth portion 43 is a basal plane dislocation in silicon carbide layer 20. Fourth portion 41 is connected to fifth portion 42. Fifth portion 42 is connected to sixth portion 43. Fourth portion 41 is exposed at third main surface 13 of silicon carbide single crystal substrate 10. Sixth portion 43 is exposed at second main surface 30 of silicon carbide layer 20. In other words, one end portion 45 of basal plane dislocation 44 is exposed at second main surface 30, and the other end portion is exposed at third main surface 13. When viewed in the direction perpendicular to second main surface 30, second dislocation array 5 may be located between an imaginary line 47 and sixth portion 43. Imaginary line 47 is obtained by extending fourth portion 41 to the silicon carbide layer 20 side along the extending direction of fourth portion 41. In other words, second dislocation array 5 may be located between one end portion 45 of basal plane dislocation 44 and a point 46 at which imaginary line 47 is exposed at second main surface 30.

Figure 20:
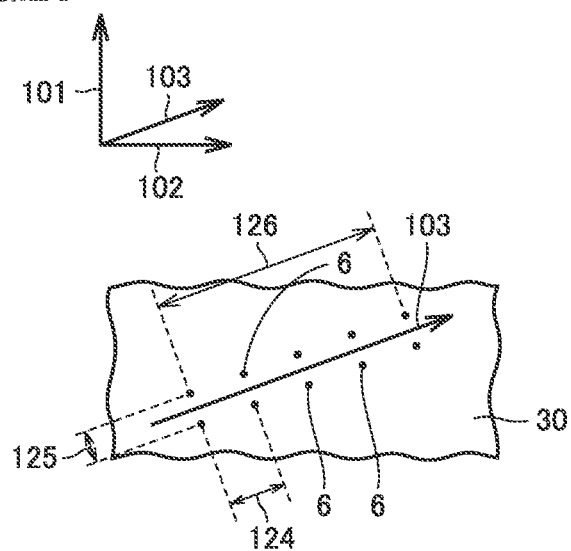
FIG. 20 is a schematic plan view in region XIX of FIG. 14.

As shown in FIG. 20, in third direction 103, length 126 of second dislocation array 5 is more than or equal to 0.1 mm and less than or equal to 50 mm, for example. In the direction perpendicular to third direction 103, a distance 125 between one end portion 6 and the other end portion 6 is more than or equal to 1 μm and less than or equal to 10 μm, for example. In third direction 103, a distance 124 between two adjacent second half loops 4 is more than or equal to 1 μm and less than or equal to 100 μm, for example. Distance 124 may be longer than distance 125. Two end portions 6 may be located on the straight line perpendicular to third direction 103. When viewed in the direction perpendicular to second main surface 30, each of the plurality of second half loops 4 overlaps with the straight line parallel to third direction 103. An interval between two adjacent second half loops may be the same, or may be different.

Figure 21:
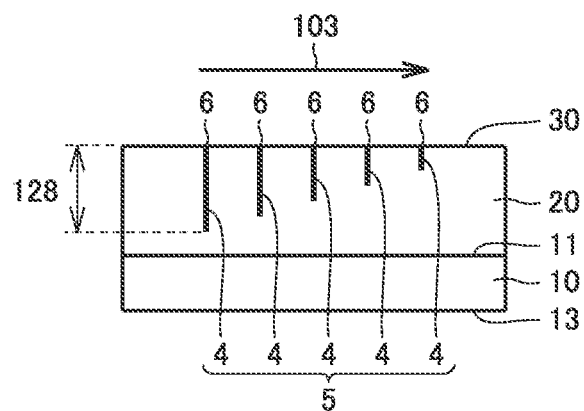
FIG. 21 is a schematic cross sectional view in region XIX of FIG. 14.

As shown in FIG. 21, in the direction perpendicular to second main surface 30, the respective depths of the plurality of second half loops 4 may be different from one another. The depth of each of second half loops 4 is the length of the half loop in the direction perpendicular to second main surface 30. Specifically, the depths of second half loops 4 may become smaller in the off direction. In other words, when viewed in the direction perpendicular to second main surface 30, the depth of second half loop 4 near fourth portion 41 is larger than the depth of second half loop 4 near sixth portion 43. Each of the depths of second half loops 4 may be smaller than the thickness of silicon carbide layer 20. Second half loops 4 may be separated from silicon carbide single crystal substrate 10.

(Contact Angle)

Figure 22:
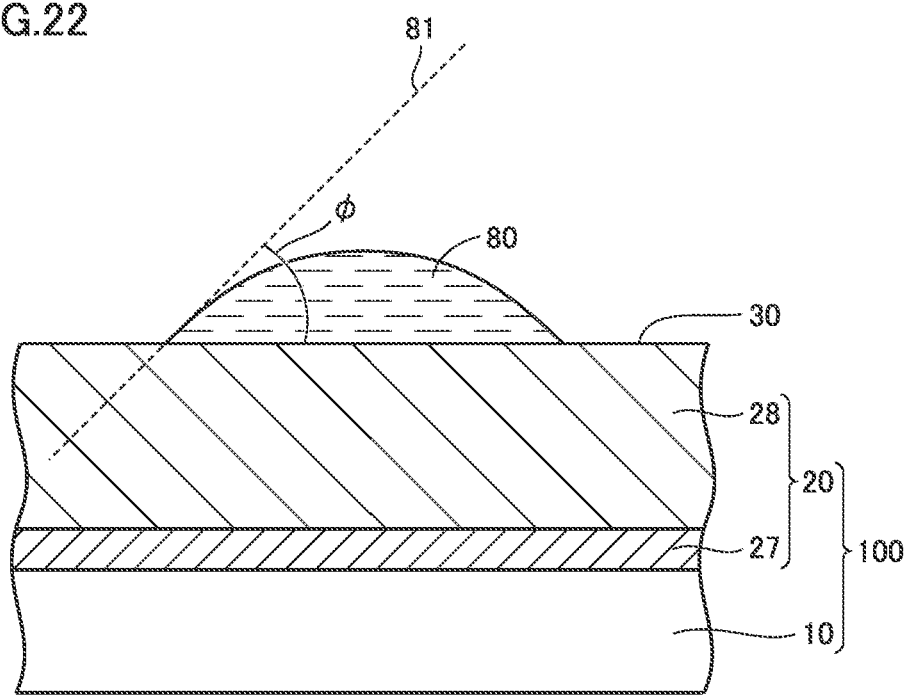
FIG. 22 is a schematic cross sectional view showing a method for measuring a contact angle.

As shown in FIG. 22, it is assumed that pure water 80 is dropped onto central region 53 of second main surface 30. A contact angle φ of pure water 80 is represented by an angle between central region 53 and a tangent line 81 of a surface of pure water 80 at a boundary surface between central region 53 and pure water 80. As shown in FIG. 23, in each of five measurement regions 25 indicated by hatching, contact angle φ of pure water 80 is measured. In the above-described five measurement regions 25, the average value of contact angle φ of pure water 80 may be less than or equal to 45°, and the absolute value of a difference between the maximum and minimum values of contact angle φ may be less than or equal to 10°. The average value of contact angle ϕ is preferably less than or equal to 30°, and is more preferably less than or equal to 15°. The absolute value of the difference between the maximum and minimum values of contact angle ϕ is preferably less than or equal to 5°, and is more preferably less than or equal to 3°. The contact angle can be measured as follows, for example. 0.2 mL of pure water is dropped to second main surface 30 of silicon carbide single crystal substrate 10 and the dropped pure water is photographed in the direction parallel to second main surface 30. In accordance with the taken photograph, the contact angle is represented by the value of a measured angle between second main surface 30 and an interface between the pure water and the atmosphere.

Specifically, the average value of contact angle ϕ may be less than or equal to 45°, and the absolute value of the difference between the maximum and minimum values of contact angle ϕ may be less than or equal to 5°. The average value of contact angle ϕ may be less than or equal to 30°, and the absolute value of the difference between the maximum and minimum values of contact angle ϕ may be less than or equal to 5°. The average value of contact angle ϕ may be less than or equal to 15°, and the absolute value of the difference between the maximum and minimum values of contact angle ϕ may be less than or equal to 3°. As hydrophilicity is higher, the contact angle becomes smaller. With a small contact angle, particles on the second main surface can be effectively removed when cleaning the silicon carbide epitaxial substrate.

(Warp and Bow)

Figure 24:
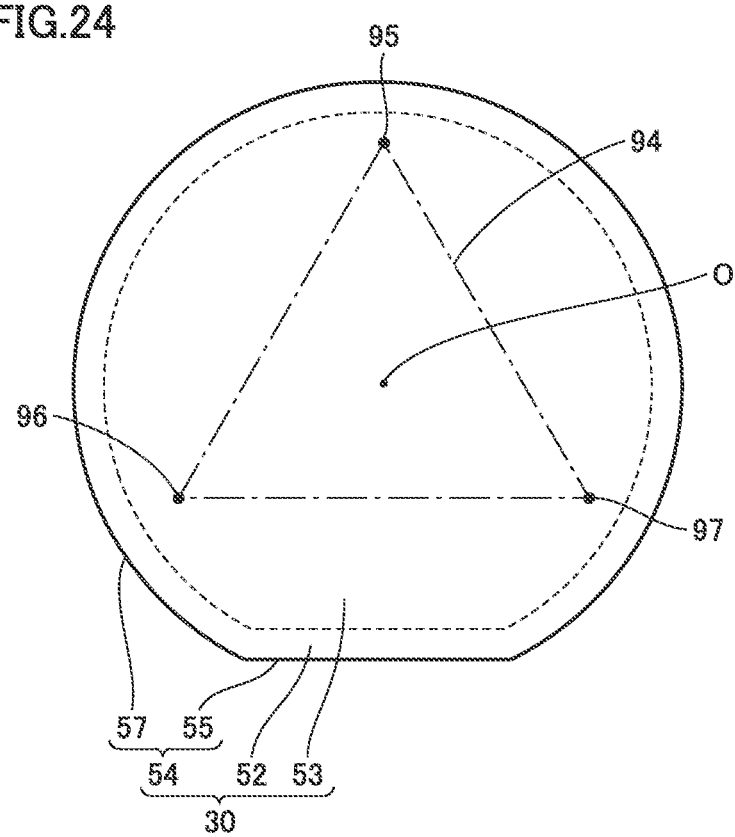
FIG. 24 is a schematic plan view showing a three-point reference plane of the second main surface.

Next, the following describes warp and bow of silicon carbide epitaxial substrate 100. First, as shown in FIG. 24, a three-point reference plane 94 of second main surface 30 is determined. Three-point reference plane 94 is an imaginary plane including three points (a first location 95, a second location 96, and a third location 97) on second main surface 30. A triangle formed by connecting first location 95, second location 96, and third location 97 is a regular triangle including center O of second main surface 30 therein. The warp and bow can be measured by Flatmaster provided by Tropel, for example.

Figure 25:
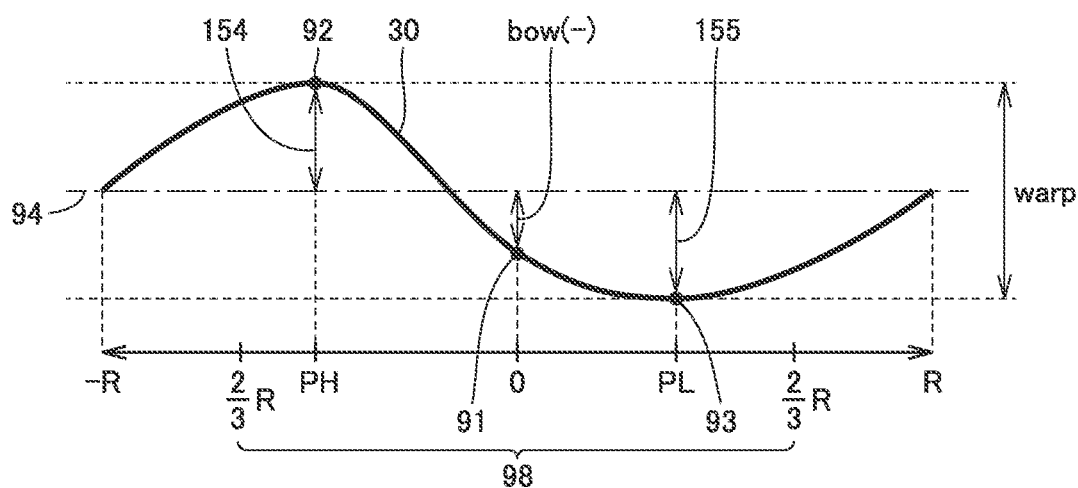
FIG. 25 shows a first example of a warpage of the second main surface.
Figure 26:
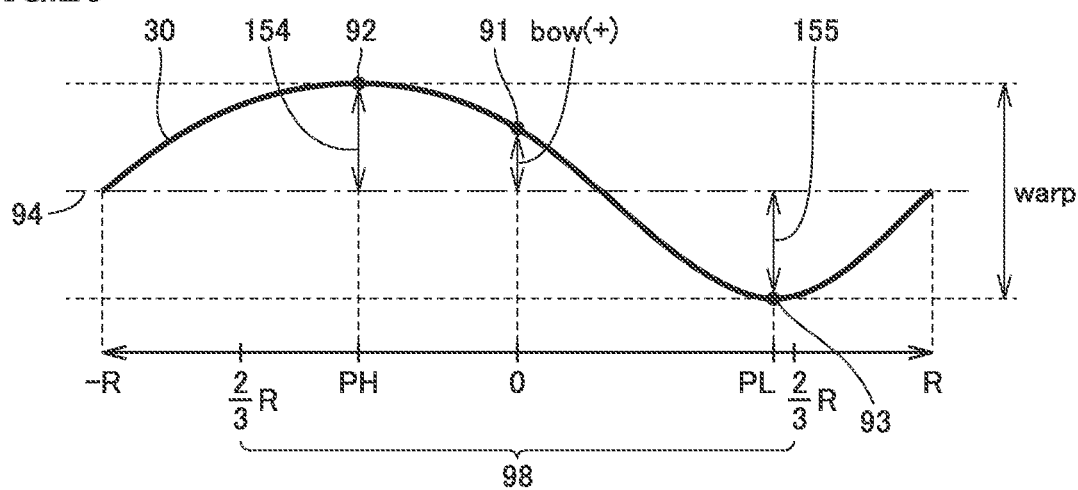
FIG. 26 shows a second example of the warpage of the second main surface.

As shown in FIG. 25 and FIG. 26, in the direction perpendicular to three-point reference plane 94, the warp is represented by a total of a distance 154 between highest location 92 of second main surface 30 and three-point reference plane 94 when viewed from three-point reference plane 94, and a distance 155 between lowest location 93 of second main surface 30 and three-point reference plane 94 when viewed from three-point reference plane 94. Silicon carbide epitaxial substrate 100 according to the present embodiment has a warp of more than or equal to 0 µm and less than or equal to 30 µm, for example. The warp of silicon carbide epitaxial substrate 100 is preferably less than or equal to 25 µm, and is more preferably less than or equal to 20 µm. It should be noted that the thickness of silicon carbide single crystal substrate 10 is less than or equal to 600 µm.

As shown in FIG. 25 and FIG. 26, in the direction perpendicular to three-point reference plane 94, the bow is represented by a distance between central location 91 of second main surface 30 and three-point reference plane 94. As shown in FIG. 25, when central location 91 of second main surface 30 is lower than three-point reference plane 94, the bow indicates a negative value. On the other hand, as shown in FIG. 26, when central location 91 of second main surface 30 is higher than three-point reference plane 94, the bow indicates a positive value. The absolute value of the bow of silicon carbide epitaxial substrate 100 according to the present embodiment is less than or equal to 20 µm, for example. The absolute value of the bow of silicon carbide epitaxial substrate 100 is preferably less than or equal to 18 µm, and is more preferably less than or equal to 15 µm.

As shown in FIG. 25, when the bow is negative, in the direction perpendicular to three-point reference plane 94, a location PL having the minimum height when viewed from three-point reference plane 94 is in a range from center O of second main surface 30 to ⅔ of radius R of second main surface 30. Location PL having the minimum height when viewed from three-point reference plane 94 is preferably in a range from center O of second main surface 30 to ½ of radius R of second main surface 30. Location PL having the minimum height when viewed from three-point reference plane 94 is more preferably in a range from center O of second main surface 30 to ⅓ of radius R of second main surface 30. Likewise, in the direction perpendicular to three-point reference plane 94, a location PH having the maximum height when viewed from three-point reference plane 94 is in a range from center O of second main surface 30 to ⅔ of radius R of second main surface 30, is preferably in a range from center O of second main surface 30 to ½ of radius R of second main surface 30, and is more preferably in a range from center O of second main surface 30 to ⅓ of radius R of second main surface 30.

As shown in FIG. 26, when the bow is positive, in the direction perpendicular to three-point reference plane 94 of second main surface 30, location PH having the maximum height when viewed from three-point reference plane 94 is in a range from center O of second main surface 30 to ⅔ of radius R of second main surface 30. Location PH having the maximum height when viewed from three-point reference plane 94 is preferably in a range from center O of second main surface 30 to ½ of radius R of second main surface 30, and is more preferably in a range from center O of second main surface 30 to ⅓ of radius R of second main surface 30. Likewise, in the direction perpendicular to three-point reference plane 94, location PL having the minimum height when viewed from three-point reference plane 94 is in a range from center O of second main surface 30 to ⅔ of radius R of second main surface 30, is preferably in a range from center O of second main surface 30 to ½ of radius R of second main surface 30, and is more preferably in a range from center O of second main surface 30 to ⅓ of radius R of second main surface 30.

(Manufacturing Apparatus for Silicon Carbide Epitaxial Substrate)

The following describes a configuration of a manufacturing apparatus 200 for silicon carbide epitaxial substrate 100 according to the present embodiment.

Figure 27:
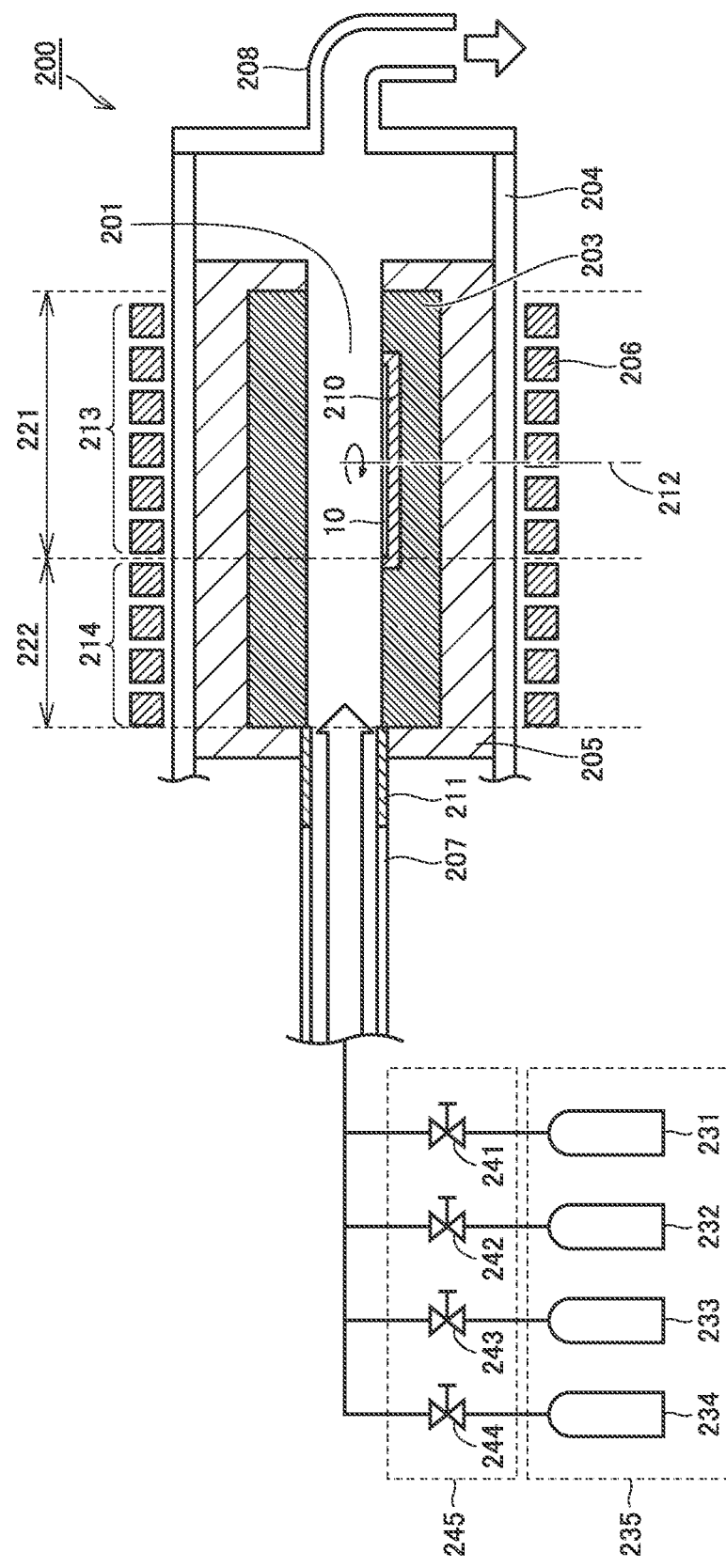
FIG. 27 is a partial schematic cross sectional view showing a configuration of a first example of a manufacturing apparatus for the silicon carbide epitaxial substrate according to the present embodiment.

As shown in FIG. 27, manufacturing apparatus 200 is a lateral type CVD (Chemical Vapor Deposition) apparatus employing a hot wall method, for example. Manufacturing apparatus 200 mainly includes a reaction chamber 201, a gas supplier 235, a controller 245, a heating element 203, a quartz tube 204, a heat insulator 205 and an induction heating coil 206.

Heating element 203 has a tubular shape and a reaction chamber 201 is formed therein, for example. Heating element 203 is composed of graphite, for example. Heat insulator 205 surrounds the outer circumference of heating element 203. Heat insulator 205 is provided inside quartz tube 204 in contact with the inner circumferential surface of quartz tube 204. For example, induction heating coil 206 is wound around the outer circumferential surface of quartz tube 204. Induction heating coil 206 is configured to supply alternating current using an external power supply (not shown). Accordingly, heating element 203 is inductively heated. As a result, reaction chamber 201 is heated by heating element 203.

Reaction chamber 201 is a formed space surrounded by heating element 203. In reaction chamber 201, silicon carbide single crystal substrate 10 is placed. Reaction chamber 201 is configured to heat silicon carbide single crystal substrate 10. In reaction chamber 201, susceptor plate 210 is provided to hold silicon carbide single crystal substrate 10. Susceptor plate 210 is configured to be rotatable around a rotation axis 212.

Manufacturing apparatus 200 further includes a gas inlet 207 and a gas outlet 208. Gas outlet 208 is connected to an exhaust pump not shown in the figures. Arrows in FIG. 27 represent flow of gas. The gas is introduced from gas inlet 207 into reaction chamber 201, and is exhausted from gas outlet 208. A pressure in reaction chamber 201 is adjusted by a balance between an amount of the supplied gas and an amount of the exhausted gas.

Manufacturing apparatus 200 may further include a heater 211 located between gas inlet 207 and heating element 203. Heater 211 is located upstream of heating element 203. Heating element 203 may be configured to heat at about more than or equal to 1500° C. and less than or equal to 1700° C., for example.

Gas supplier 235 is configured to supply reaction chamber 201 with a mixed gas including silane ($SiH_4$) gas, propane ($C_3H_8$) gas, ammonia ($NH_3$) gas, and hydrogen ($H_2$) gas, for example. Specifically, gas supplier 235 may include a first gas supplier 231, a second gas supplier 232, a third gas supplier 233, and a carrier gas supplier 234.

First gas supplier 231 is configured to supply a first gas including carbon atoms. First gas supplier 231 is a gas container having the first gas introduced therein, for example. The first gas is propane gas, for example. Examples of the first gas may include methane ($CH_4$) gas, ethane ($C_2H_6$) gas, acetylene ($C_2H_2$) gas, and the like.

Second gas supplier 232 is configured to supply a second gas including silicon atoms. Second gas supplier 232 is a gas container having the second gas introduced therein, for example. The second gas is silane gas, for example. The second gas may be a mixed gas of silane gas and a gas other than silane gas.

Third gas supplier 233 is configured to supply a third gas including ammonia gas. Third gas supplier 233 is a gas container having the third gas introduced therein, for example. The third gas is ammonia gas, for example. The ammonia gas is more likely to be thermally decomposed as compared with nitrogen gas having a triple bond.

By using the ammonia gas, improvement in in-plane uniformity of the carrier concentration can be expected. The ammonia gas is diluted with hydrogen gas, for example. In this case, the third gas includes ammonia gas and hydrogen gas. The concentration of the ammonia gas is about more than or equal to 0.01% (100 ppm) and less than or equal to 10% with respect to the hydrogen gas.

Carrier gas supplier 234 is configured to supply carrier gas such as hydrogen, for example. Carrier gas supplier 234 is a gas container having hydrogen introduced therein, for example.

Controller 245 is configured to control the flow rate of the mixed gas supplied from gas supplier 235 to reaction chamber 201. Specifically, controller 245 may include a first gas flow rate controller 241, a second gas flow rate controller 242, a third gas flow rate controller 243, and a carrier gas flow rate controller 244. Each controller is an MFC (Mass Flow Controller), for example. Controller 245 is disposed between gas supplier 235 and gas inlet 207. In other words, controller 245 is disposed in a flow path that connects gas supplier 235 and gas inlet 207.

Reaction chamber 201 includes: a first heating region 213 that surrounds silicon carbide single crystal substrate 10; and a second heating region 214 located upstream of first heating region 213. As shown in FIG. 27, in the flow direction (axial direction of reaction chamber 201) of the mixed gas, second heating region 214 is a region extending from an upstream boundary between heat insulator 205 and heating element 203 to the upstream end portion of a region in which silicon carbide single crystal substrate 10 is disposed. A boundary portion between second heating region 214 and first heating region 213 may be the upstream side surface of the recess provided in susceptor plate 210. The downstream end portion of first heating region 213 may be a downstream boundary between heat insulator 205 and heating element 203.

In the axial direction of reaction chamber 201, the winding density of induction heating coil 206 may be changed. The term "winding density (the number of windings/m) is the number of windings of the coil per unit length in the axial direction of the apparatus. For example, in order to effectively thermally decompose the ammonia at the upstream side, the winding density of induction heating coil 206 at the upstream side may be higher than the winding density of induction heating coil 206 at the downstream side in second heating region 214.

Second heating region 214 is configured to heat to a temperature of more than or equal to the decomposition temperature of the ammonia. The decomposition temperature of the ammonia is 500° C., for example. The temperature of second heating region 214 can be measured by a radiation thermometer, for example. The temperature of a portion of heating element 203 that constitutes second heating region 214 is more than or equal to 1500° C. and less than or equal to 1700° C., for example. In the flow direction of the mixed gas, length 222 of second heating region 214 may be more than or equal to 60 mm, may be more than or equal to 70 mm, or may be more than or equal to 80 mm. In the flow direction of the mixed gas, length 221 of first heating region 213 may be larger than length 222 of second heating region 214.

Figure 28:
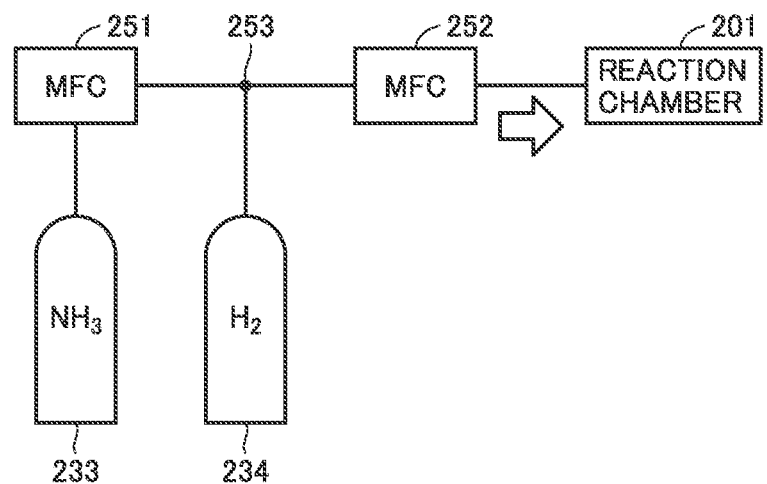
FIG. 28 a schematic view showing a configuration of a second example of the manufacturing apparatus for the silicon carbide epitaxial substrate according to the present embodiment.

As shown in FIG. 28, a first MFC 251 and a second MFC 252 may be disposed between reaction chamber 201 and third gas supplier 233 including the ammonia gas. Carrier gas supplier 234 including the hydrogen gas is connected to a tube 253 that connects between first MFC 251 and second MFC 252. As described above, the concentration of the ammonia gas is very low and therefore it is desirable to control the concentration of the ammonia gas with precision. According to the above-described configuration, the concentration of the ammonia gas can be controlled with precision.

(Method for Manufacturing Silicon Carbide Epitaxial Substrate)

Next, the following describes a method for manufacturing the silicon carbide epitaxial substrate according to the present embodiment.

First, for example, a sublimation method is employed to manufacture a silicon carbide single crystal having polytype 4H. Next, for example, the silicon carbide single crystal is sliced using a wire saw, thereby preparing silicon carbide single crystal substrate 10 (see FIG. 29 and FIG. 30). Silicon carbide single crystal substrate 10 has first main surface 11 and third main surface 13 opposite to first main surface 11.

Figure 30:
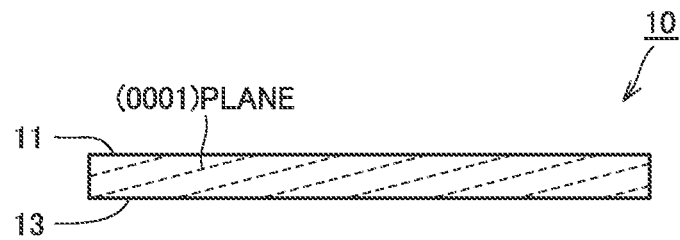
FIG. 30 is a schematic cross sectional view showing the first step of the method for manufacturing the silicon carbide epitaxial substrate according to the present embodiment.

As shown in FIG. 30, first main surface 11 corresponds to a plane inclined relative to the (0001) plane in the off direction.

Specifically, first main surface 11 corresponds to a plane inclined relative to the (0001) plane by more than or equal to 0.5° and less than or equal to 8°, for example. The inclination angle (off angle) relative to the (0001) plane may be more than or equal to 1°, or may be more than or equal to 2°. The off angle may be less than or equal to 7° or may be less than or equal to 6°. The off direction may be the <11-20> direction, may be the <1-100> direction, or may be a direction between the <11-20> direction and the <1-100> direction, for example.

The thickness of silicon carbide single crystal substrate 10 may be 1 mm or may be 2 mm, for example. By slicing silicon carbide single crystal substrate 10 thickly, the warp and bow of silicon carbide single crystal substrate 10 are improved. MP (Mechanical Polishing) and CMP (Chemical Mechanical Polishing) are performed onto first main surface 11 and third main surface 13 of silicon carbide single crystal substrate 10. Accordingly, first main surface 11 and third main surface 13 are planarized. The thickness of silicon carbide single crystal substrate 10 after the MP step and CMP step is 600 μm, for example.

Next, silicon carbide single crystal substrate 10 is placed in manufacturing apparatus 200 described above. Specifically, silicon carbide single crystal substrate 10 is placed on the recess of susceptor plate 210 such that first main surface 11 is exposed from susceptor plate 210.

Figure 38:
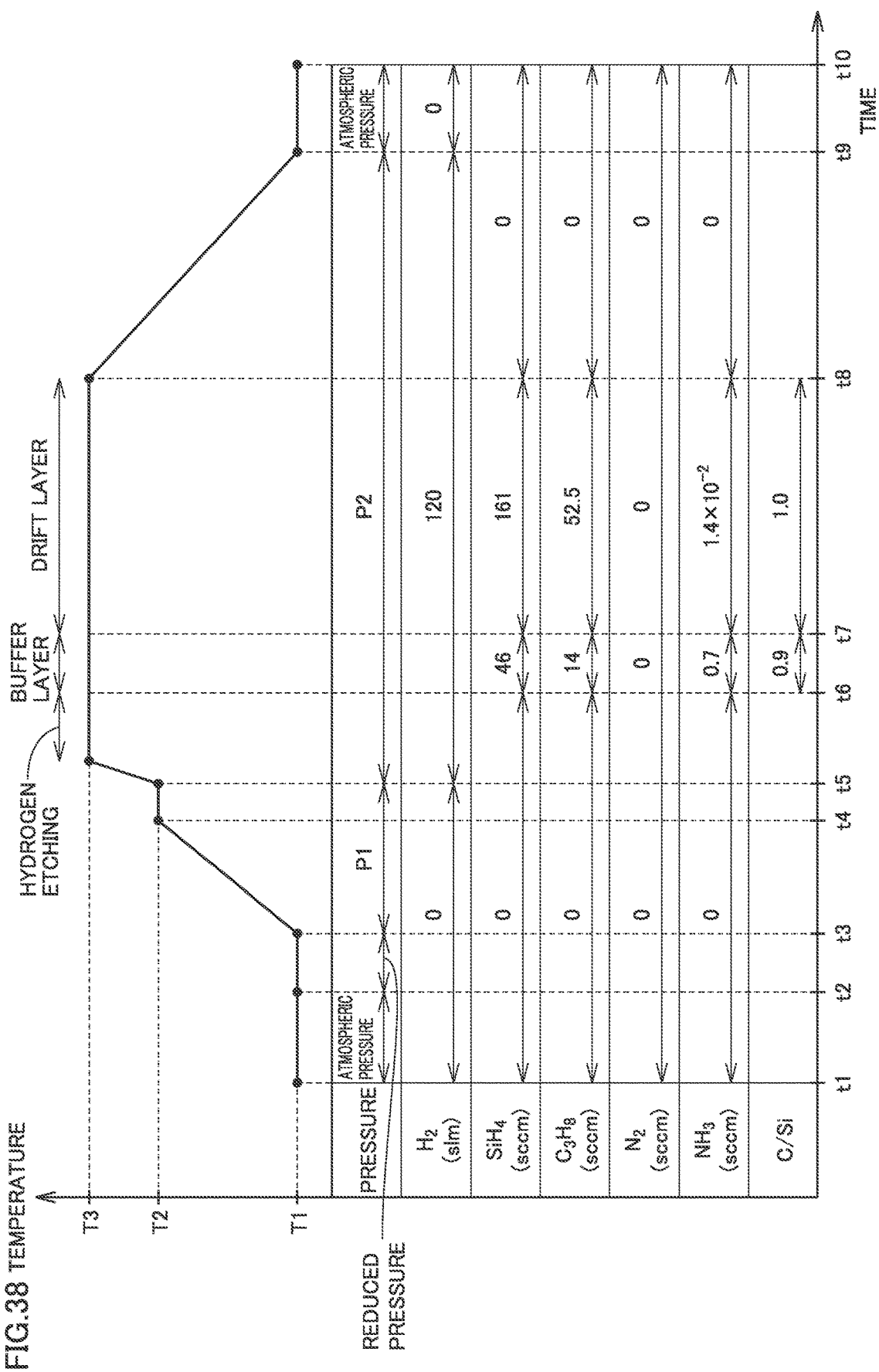
FIG. 38 shows a first example of the method for manufacturing the silicon carbide epitaxial substrate according to the present embodiment.

As shown in FIG. 38, a first time (t1) represents a time at which silicon carbide single crystal substrate 10 is placed on the recess of susceptor plate 210. At the first time (t1), the temperature in reaction chamber 201 is a first temperature (T1), and the pressure in reaction chamber 201 is an atmospheric pressure, for example. The first temperature (T1) is a room temperature, for example. From a second time (t2), the pressure in reaction chamber 201 starts to be reduced. At a third time (t3), the pressure in reaction chamber 201 reaches a first pressure (P1). The first pressure (P1) is about $1 \times 10^{-6}$ Pa, for example.

From the third time (t3) to a fourth time (t4), the temperature of reaction chamber 201 starts to be increased. In the present disclosure, during a period from the fourth time (t4) to a fifth time (t5) in the middle of increasing the temperature, the temperature in reaction chamber 201 is held at a second temperature (T2). The second temperature (T2) is 1100° C., for example. The holding time is 10 minutes, for example. With this operation, a difference between the temperature of susceptor plate 210 and the temperature of silicon carbide single crystal substrate 10 becomes small, whereby it is expected that the temperature distribution in the plane of silicon carbide single crystal substrate 10 becomes uniform.

At the fifth time (t5), the temperature of reaction chamber 201 is resumed to be increased. In the present disclosure, from the fifth time (t5), hydrogen gas, which serves as a carrier gas, is introduced into reaction chamber 201. The flow rate of the hydrogen gas is about 120 slm, for example. The unit "slm" for the flow rate represents "L/min" in a standard state (0° C.; 101.3 kPa). With this operation, it is expected to reduce nitrogen remaining in reaction chamber 201, for example. Further, first main surface 11 of silicon carbide single crystal substrate 10 is etched by the hydrogen. By the introduction of the hydrogen gas, the pressure in reaction chamber 201 is changed from the first pressure (P1) to a second pressure (P2). The second pressure (P2) is 80 mbar (8 kPa), for example. After the temperature of reaction chamber 201 reaches a third temperature (T3), the temperature of reaction chamber 201 is maintained at the third temperature (T3) for a certain period. The third temperature (T3) is 1630° C., for example. The third temperature (T3) is a growth temperature at which epitaxial growth proceeds.

From a sixth time (t6), silane gas serving as the first gas, propane gas serving as the second gas, and doping gas are introduced into reaction chamber 201. Ammonia gas is used for the doping gas in the present disclosure. By using the ammonia gas, improvement in in-plane uniformity can be expected. The ammonia gas may be thermally decomposed before being introduced into reaction chamber 201.

During a period between the sixth time (t6) and a seventh time (t7), a buffer layer 27 is formed by epitaxial growth on silicon carbide single crystal substrate 10. During the period of the sixth time (t6) to the seventh time (t7), the flow rate of the hydrogen gas is 120 slm, the flow rate of the silane gas is 46 sccm, the flow rate of the propane gas is 14 sccm, and the flow rate of the ammonia gas is 0.7 sccm. A C/Si ratio in the source material gas is 0.9, for example. The thickness of buffer layer 27 is 1 μm, for example. The period from the sixth time (t6) to the seventh time (t7) is 3 minutes, for example. During the formation of buffer layer 27 by the epitaxial growth, susceptor plate 210 is being rotated.

During a period from the seventh time (t7) to an eighth time (t8), a drift layer 28 is formed by epitaxial growth on buffer layer 27. During the period between the seventh time (t7) and the eighth time (t8), the flow rate of the hydrogen gas is 120 slm, the flow rate of the silane gas is 161 sccm, the flow rate of the propane gas is 52.5 sccm, and the flow rate of the ammonia gas is $1.4 \times 10^{-2}$ sccm. A volume ratio ($SiH_4/H_2$) of the silane gas to the hydrogen gas is 0.13%. A C/Si ratio in the source material gas is 1.0, for example. The thickness of drift layer 28 is 15 μm, for example. The period of the seventh time (t7) to the eighth time (t8) is 31 minutes, for example. During the formation of drift layer 28 by the epitaxial growth, susceptor plate 210 is being rotated. At the eighth time (t8), the supply of the silane gas, propane gas, and ammonia gas is stopped.

Preferably, in the step of growing silicon carbide layer 20, the temperature of silicon carbide single crystal substrate 10 in the in-plane direction is maintained uniformly. Specifically, during the period from the sixth time (t6) to the eighth time (t8), a difference between the maximum temperature and the minimum temperature is maintained to be less than or equal to 30° C. in first main surface 11 of silicon carbide single crystal substrate 10. Preferably, the difference between the maximum temperature and the minimum temperature is maintained to be less than or equal to 10° C.

Figure 29:
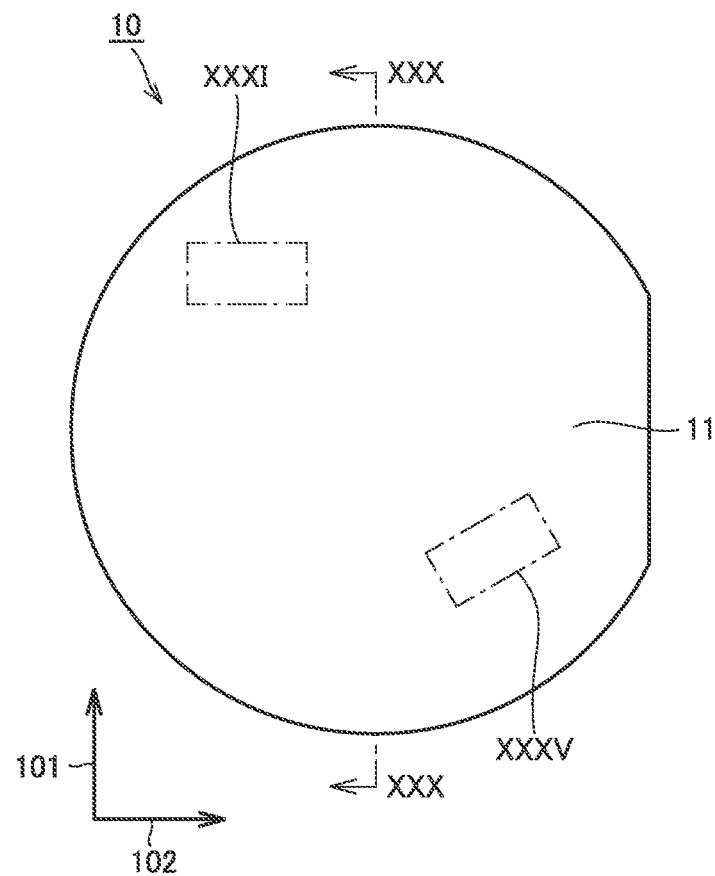
FIG. 29 is a schematic plan view showing a first step of a method for manufacturing the silicon carbide epitaxial substrate according to the present embodiment.
Figure 31:
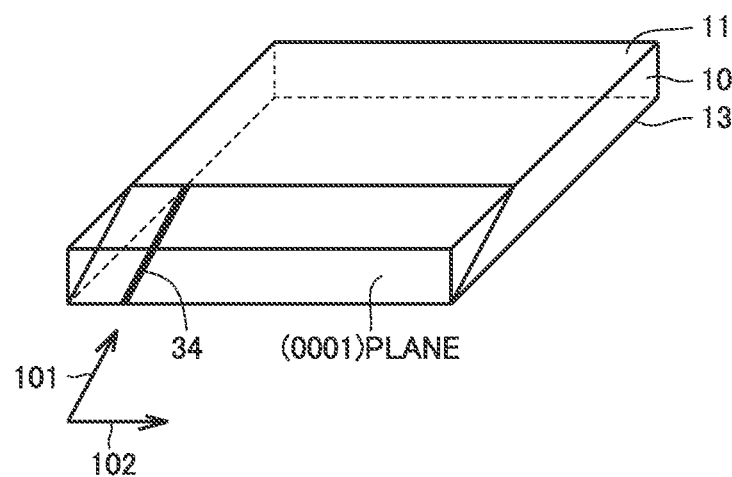
FIG. 31 is a schematic perspective view showing a configuration of a basal plane dislocation in a region XXXI at a sixth time.

Next, the following describes the step of growing silicon carbide layer 20 at its portion on a certain region XXXI of silicon carbide single crystal substrate 10 in detail. As shown in FIG. 29 and FIG. 31, at the first time (t1), basal plane dislocation 34 extending on the (0001) plane exists in certain region XXXI within silicon carbide single crystal substrate 10. One end portion of basal plane dislocation 34 is exposed at first main surface 11, and the other end portion thereof is exposed at third main surface 13. Basal plane dislocation 34 extends along first direction 101 that is the off direction.

Figure 32:
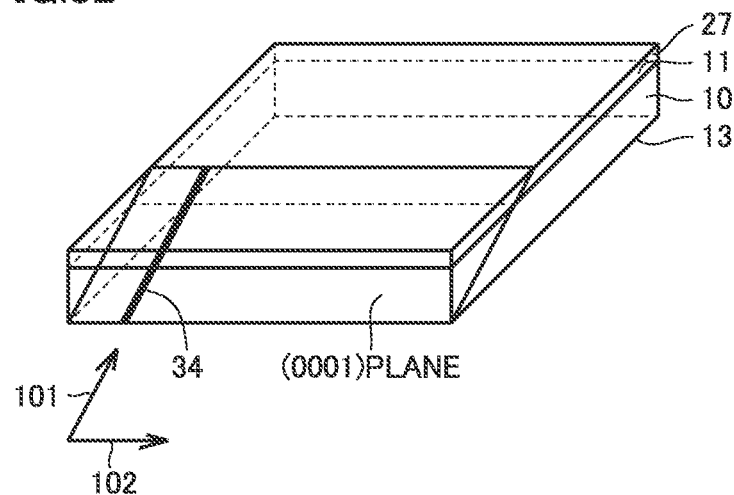
FIG. 32 is a schematic perspective view showing the configuration of the basal plane dislocation in region XXXI at a seventh time.

As shown in FIG. 32, during the period from the sixth time (t6) to the seventh time (t7), buffer layer 27 is formed on silicon carbide single crystal substrate 10. Basal plane dislocation 34 is propagated from silicon carbide single crystal substrate 10 to buffer layer 27. Basal plane dislocation 34 extends in buffer layer 27 along first direction 101. One end portion of basal plane dislocation 34 is exposed at the surface of buffer layer 27, and the other end portion thereof is exposed at third main surface 13.

Figure 33:
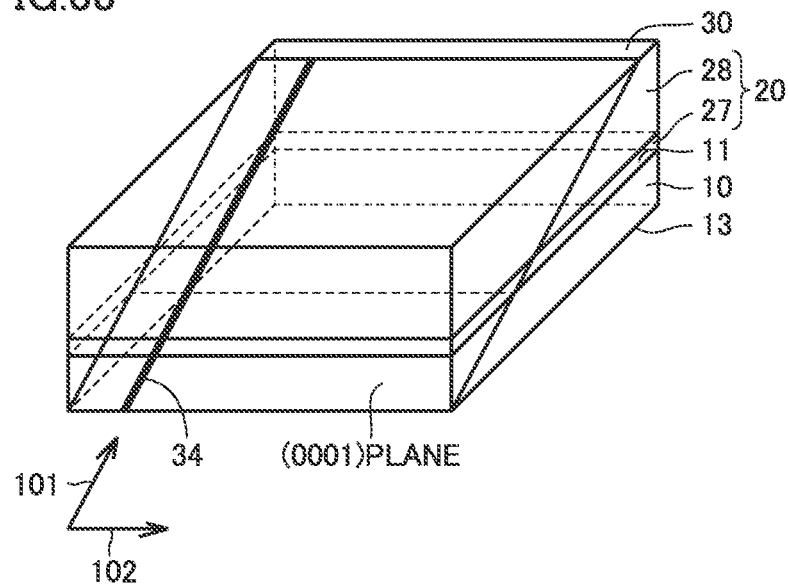
FIG. 33 is a schematic perspective view showing the configuration of the basal plane dislocation in region XXXI at an eighth time.

As shown in FIG. 33, during the period from the seventh time (t7) to the eighth time (t8), drift layer 28 is formed on buffer layer 27. As drift layer 28 is grown, basal plane dislocation 34 extends in drift layer 28. At the seventh time (t7), one end portion of basal plane dislocation 34 is exposed at second main surface 30 of silicon carbide layer 20, and the other end portion is exposed at third main surface 13 of silicon carbide single crystal substrate 10. In this way, the formation of silicon carbide layer 20 is substantially completed.

Next, the following describes a step of cooling silicon carbide epitaxial substrate 100.

As shown in FIG. 38, the cooling step is performed after the end of the growth step. The period from the eighth time (t8) to the ninth time (t9) corresponds to the cooling step. In the cooling step, silicon carbide epitaxial substrate 100 including silicon carbide single crystal substrate 10 and silicon carbide layer 20 is cooled. For example, during the period from the eighth time (t8) to the ninth time (t9), the temperature of silicon carbide epitaxial substrate 100 is decreased from the third temperature (T3) to the first temperature (T1). The period from the eighth time (t8) to the ninth time (t9) is 60 minutes, for example. The third temperature (T3) is 1600° C., for example. For example, silicon carbide epitaxial substrate 100 is cooled from 1600° C. to 100° C. in about 1 hour. In other words, a cooling rate of silicon carbide epitaxial substrate 100 is (1600-100°) C/1 hour=1500° C./hour, for example. The cooling rate in the cooling step may be less than or equal to 1500° C./hour, may be less than or equal to 1300° C./hour, or may be less than or equal to 1000° C./hour.

Figure 34:
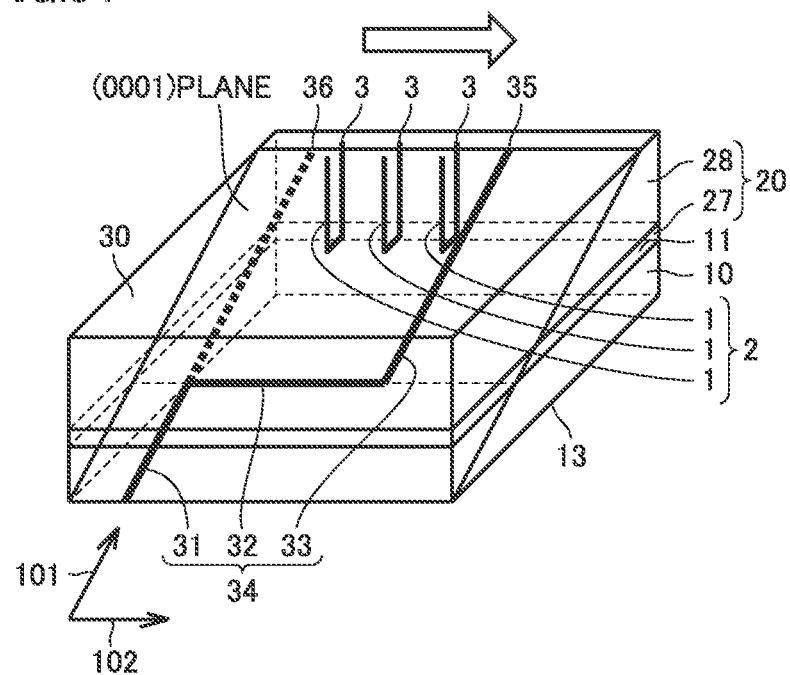
FIG. 34 is a schematic perspective view showing the configurations of the basal plane dislocation and first half loop in region XXXI during a period from the eighth time to a ninth time.

As shown in FIG. 34, in the cooling step, first dislocation array 2 including first half loops 1 may be formed in silicon carbide layer 20. It is considered that first dislocation array 2 is generated in the following manner: third portion 33 of the basal plane dislocation in silicon carbide layer 20 is slid in second direction 102 perpendicular to the off direction. In the cooling step, basal plane dislocation 34 (see FIG. 33) in the growth step is changed into basal plane dislocation 34 (FIG. 34) including first portion 31, second portion 32, and third portion 33, and forms a plurality of first half loops 1. In other words, first half loops 1 generated are originated from basal plane dislocation 34.

Preferably, in the step of cooling silicon carbide epitaxial substrate 100, the temperature of silicon carbide epitaxial substrate 100 in the in-plane direction is maintained uniformly. Specifically, during the period from the eighth time (t8) to the ninth time (t9), a difference between the maximum temperature and the minimum temperature in second main surface 30 of silicon carbide epitaxial substrate 100 is maintained to less than or equal to 10° C. For example, by setting a low cooling rate of silicon carbide epitaxial substrate 100 in the cooling step, the uniformity of the temperature of silicon carbide epitaxial substrate 100 in the in-plane direction can be improved. As the result, stress in silicon carbide epitaxial substrate 100 is eased, thereby suppressing generation of first dislocation array 2 of first half loops 1 arranged along the straight line perpendicular to the off direction.

Next, during a period from the ninth time (t9) to a tenth time (t10), reaction chamber 201 is held at the atmospheric pressure and the room temperature. After the temperature of silicon carbide epitaxial substrate 100 becomes around the room temperature, silicon carbide epitaxial substrate 100 is removed from reaction chamber 201. In the manner described above, silicon carbide epitaxial substrate 100 is completed (see FIG. 14).

It should be noted that the pressure in reaction chamber 201 may be reduced in the cooling step. The pressure in reaction chamber 201 may be reduced from 100 mbar (10 kPa) to 10 mbar (1 kPa) in about 10 minutes, for example. The pressure in reaction chamber 201 is reduced at the following rate: (10-1) kPa/10 minutes=0.9 kPa/minutes. The rate of reducing the pressure in reaction chamber 201 may be more than or equal to 0.9 kPa/minute, more than or equal to 1.2 kPa/minute, or more than or equal to 1.5 kPa/minute. By reducing the pressure of reaction chamber 201 rapidly in the cooling step, the inside of reaction chamber 201 can be thermally insulated from the outside, thereby reducing the cooling rate of silicon carbide epitaxial substrate 100.

The pressure in reaction chamber 201 can be reduced by reducing the flow rate of the carrier gas, for example. For example, the flow rate of the carrier gas in the growth step may be 120 slm, and the flow rate of the carrier gas in the cooling step may be 12 slm. In the growth step, reaction chamber 201 is supplied with the carrier gas, dopant gas, and source material gas. In the cooling step, only the carrier gas may be supplied to reaction chamber 201. The flow rate of the carrier gas may be reduced immediately after the end of the growth step, or may be reduced after maintaining, for a certain period in the cooling step, the flow rate employed in the growth step.

Next, the following describes the step of growing silicon carbide layer 20 at its portion on a certain region XXXV of silicon carbide single crystal substrate 10 in detail.

Figure 35:
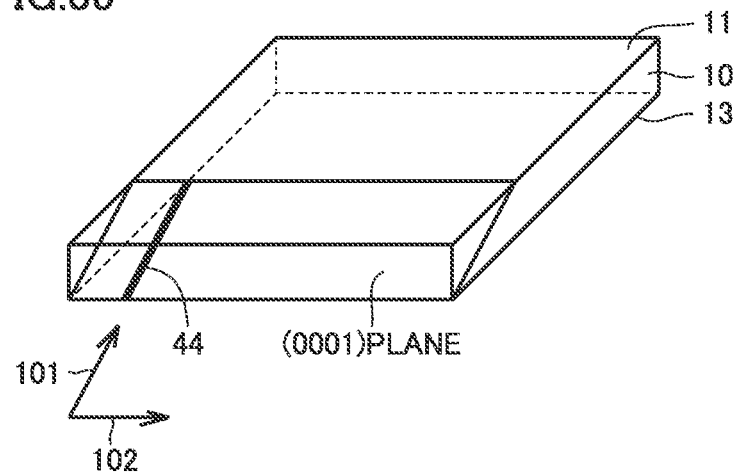
FIG. 35 is a schematic perspective view showing a configuration of a basal plane dislocation in a region XXXV at a sixth time.

As shown in FIG. 29 and FIG. 35, at the first time (t1), basal plane dislocation 44 extending on the (0001) plane may exist in certain region XXXV within silicon carbide single crystal substrate 10. One end portion 35 of basal plane dislocation 44 is exposed at first main surface 11, and the other end portion thereof is exposed at third main surface 13. The basal plane dislocation extends along first direction 101 that is the off direction.

Figure 36:
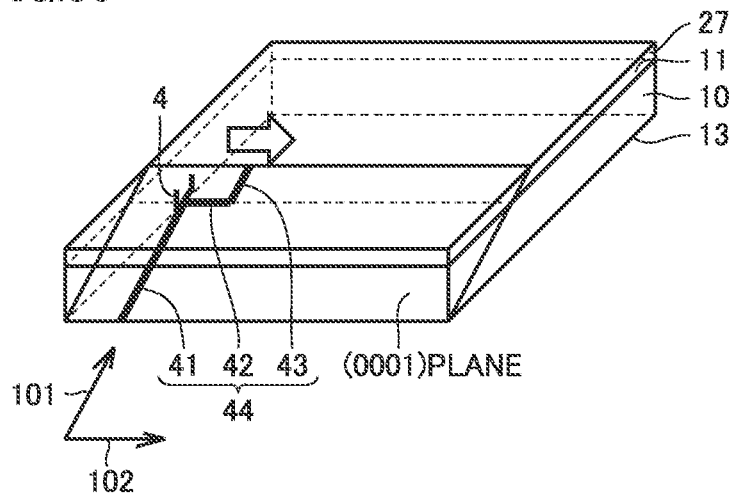
FIG. 36 is a schematic perspective view showing the configurations of the basal plane dislocation and second half loop in region XXXV at the seventh time.

As shown in FIG. 36, during the period from the sixth time (t6) to the seventh time (t7), buffer layer 27 is formed on silicon carbide single crystal substrate 10. On this occasion, second half loop 4 is generated from basal plane dislocation 44. Two end portions of second half loop 4 are exposed at the surface of buffer layer 27. Sixth portion 43 of the basal plane dislocation extending in buffer layer 27 is shifted in the second direction (the direction of an arrow in FIG. 36). As a result, basal plane dislocation 44 is converted into: fourth portion 41 located in silicon carbide single crystal substrate 10; fifth portion 42 located at the interface between silicon carbide single crystal substrate 10 and buffer layer 27 and extending in the second direction; and sixth portion 43 located in buffer layer 27. Accordingly, second half loop 4 is generated. One end portion of basal plane dislocation 44 is exposed at the surface of buffer layer 27, and the other end portion thereof is exposed at third main surface 13.

Figure 37:
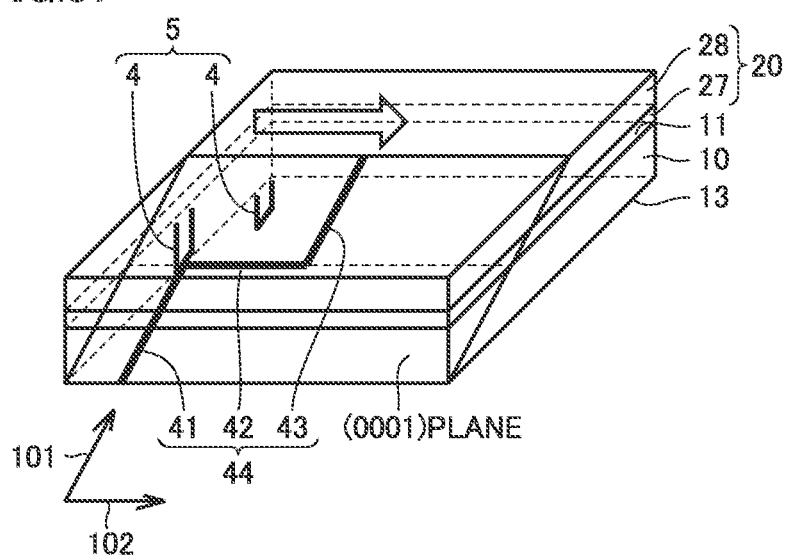
FIG. 37 is a schematic perspective view showing the configurations of the basal plane dislocation and second half loop in region XXXV during the period from the seventh time to the eighth time.

As shown in FIG. 37, when silicon carbide layer 20 is further grown, another second half loop 4 is generated by basal plane dislocation 44. The other second half loop 4 is generated at the first direction 101 side and the second direction 102 side relative to the previously generated second half loop 4. The depth of the previously generated second half loop 4 is larger than the depth of second half loop 4 generated thereafter. Sixth portion 43 (see FIG. 36) of the basal plane dislocation in buffer layer 27 is further shifted in the second direction (the direction of an arrow in FIG. 37). Sixth portion 43 is exposed at the surface of silicon carbide layer 20. In the manner described above, a plurality of second half loops 4 are formed along the straight line inclined relative to the off direction. As the time passes, the number of second half loops 4 is increased. At the eighth time (t8), second dislocation array 5 of second half loops 4 arranged along the straight line inclined relative to the off direction is formed (see FIG. 19). As described above, second dislocation array 5 is formed in the step of forming (i.e., step of growing) the silicon carbide layer. In other words, it is considered that in the step of cooling silicon carbide epitaxial substrate 100, no second dislocation array 5 is generated or ceases to exist.

(First Modification of Method for Manufacturing Silicon Carbide Epitaxial Substrate)

Next, the following describes a method for manufacturing a silicon carbide epitaxial substrate according to a first modification. The method for manufacturing the silicon carbide epitaxial substrate according to the first modification is mainly different from the method for manufacturing the silicon carbide epitaxial substrate according to the above-described embodiment in terms of the silane gas flow rate, propane gas flow rate, and ammonia gas flow rate in the step of forming the drift layer, and is the substantially the same in the other points as the method for manufacturing the silicon carbide epitaxial substrate according to the above-described embodiment.

Figure 39:
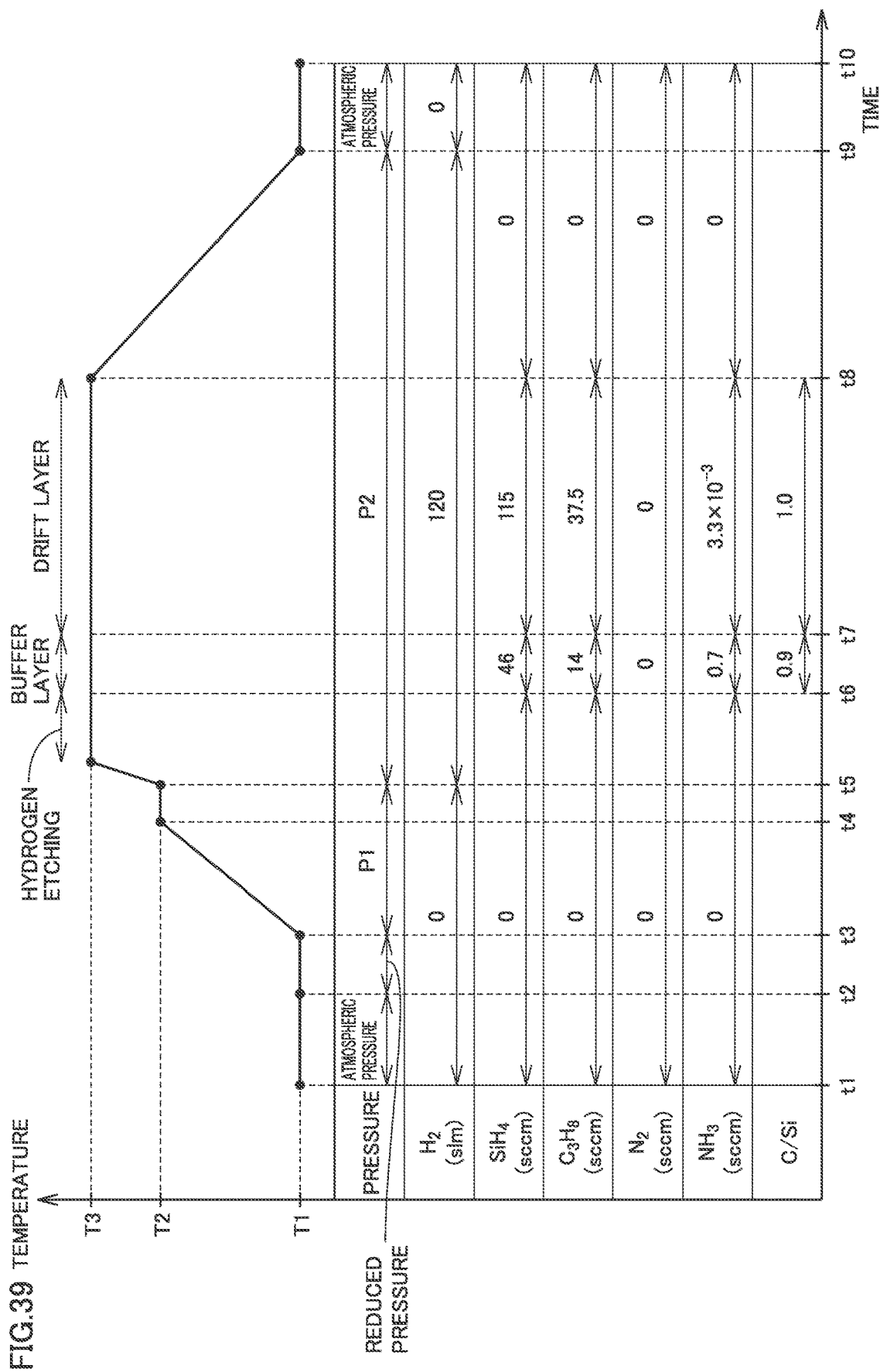
FIG. 39 shows a second example of the method for manufacturing the silicon carbide epitaxial substrate according to the present embodiment.

As shown in FIG. 39, during the period between the seventh time (t7) and the eighth time (t8), the flow rate of the hydrogen gas may be 120 slm, the flow rate of the silane gas may be 115 sccm, the flow rate of the propane gas may be 37.5 sccm, and the flow rate of the ammonia gas may be $3.3 \times 10^{-3}$ sccm. In this case, a volume ratio ($SiH_4/H_2$) of the silane gas to the hydrogen gas is 0.1%. A C/Si ratio in the source material gas is 1.0, for example. The thickness of drift layer 28 is 30 µm, for example. The period from the seventh time (t7) to the eighth time (t8) is 88 minutes, for example. During the formation of drift layer 28 by the epitaxial growth, susceptor plate 210 is being rotated.

(Second Modification of Method for Manufacturing Silicon Carbide Epitaxial Substrate)

Next, the following describes a method for manufacturing a silicon carbide epitaxial substrate according to a second modification. The method for manufacturing the silicon carbide epitaxial substrate according to the second modification is mainly different from the method for manufacturing the silicon carbide epitaxial substrate according to the first modification in terms of the ammonia gas flow rate in the step of forming the drift layer, and is substantially the same in the other points as the method for manufacturing the silicon carbide epitaxial substrate according to the first modification.

Figure 40:
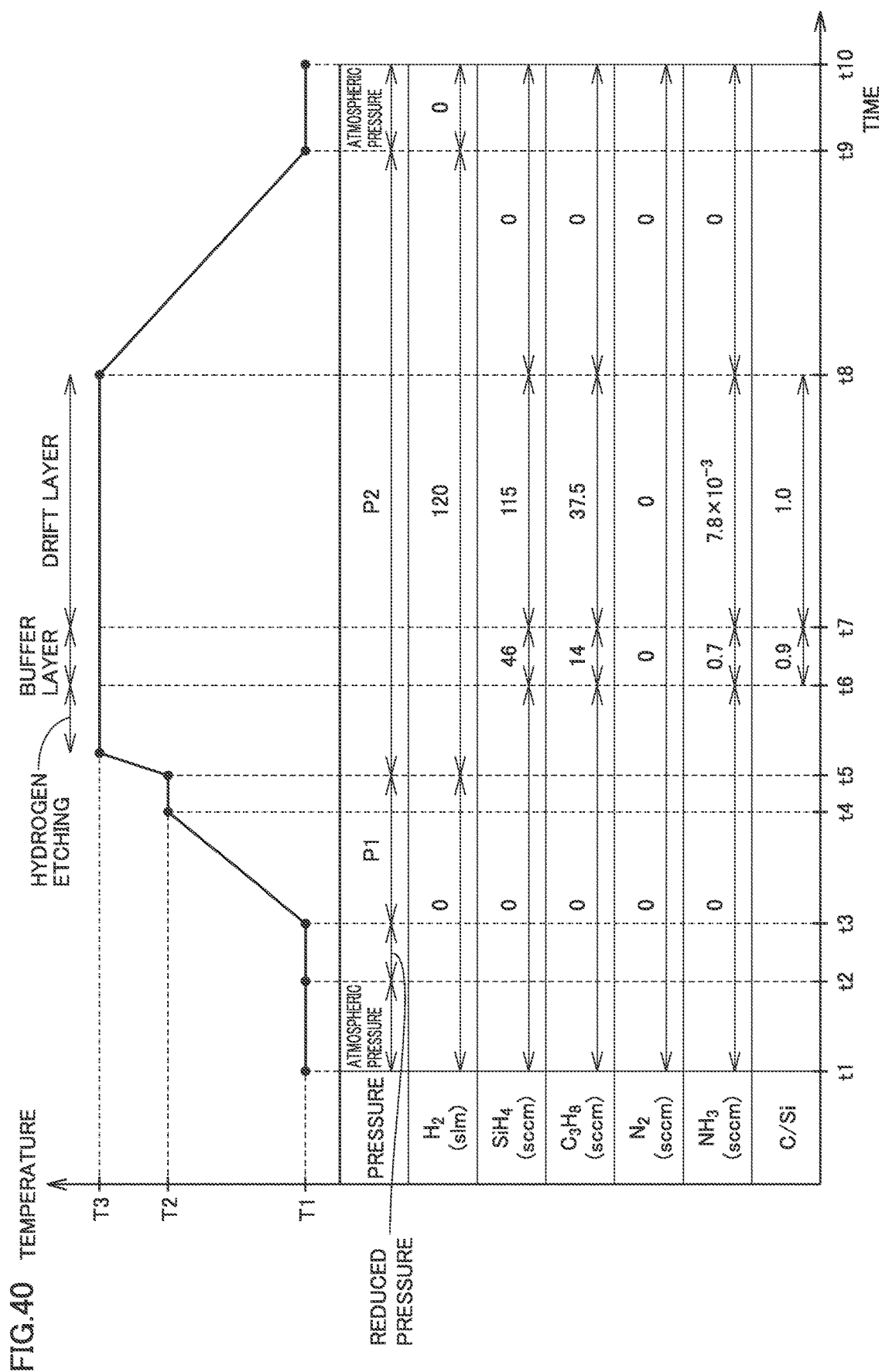
FIG. 40 shows a third example of the method for manufacturing the silicon carbide epitaxial substrate according to the present embodiment.

As shown in FIG. 40, during the period between the seventh time (t7) and the eighth time (t8), the flow rate of the hydrogen gas may be 120 slm, the flow rate of the silane gas may be 115 sccm, the flow rate of the propane gas may be 37.5 sccm, and the flow rate of the ammonia gas is $7.8 \times 10^{-3}$ sccm. In this case, a volume ratio ($SiH_4/H_2$) of the silane gas to the hydrogen gas is 0.1%. A C/Si ratio in the source material gas is 1.0, for example. The thickness of drift layer 28 is 15 µm, for example. The period from the seventh time (t7) to the eighth time (t8) is 43 minutes, for example. During the formation of drift layer 28 by the epitaxial growth, susceptor plate 210 is being rotated.

(Method for Manufacturing Silicon Carbide Semiconductor Device)

The following describes a method for manufacturing a silicon carbide semiconductor device 300 according to the present embodiment.

Figure 41:
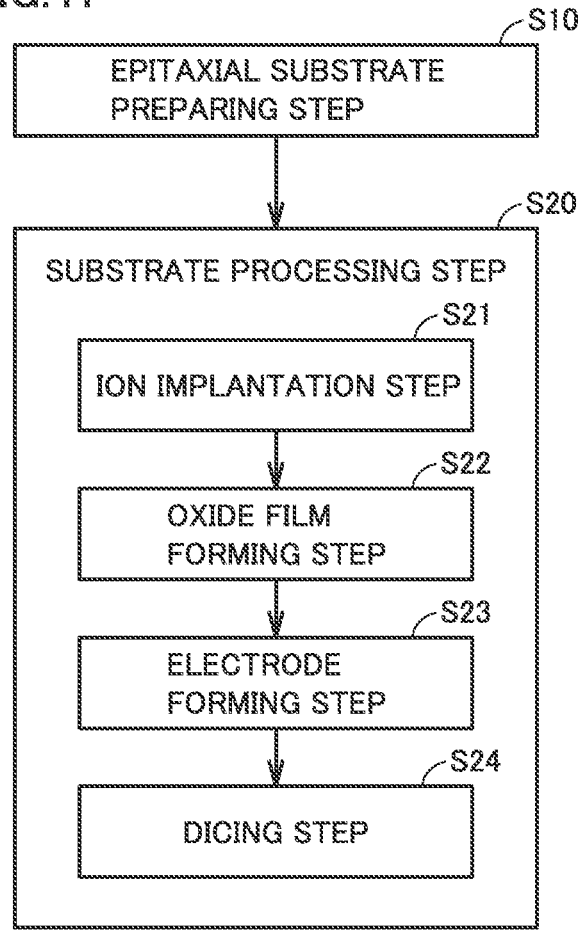
FIG. 41 is a flowchart showing a method for manufacturing a silicon carbide semiconductor device according to the present embodiment.

The method for manufacturing the silicon carbide semiconductor device according to the present embodiment mainly includes an epitaxial substrate preparing step (S10: FIG. 41) and a substrate processing step (S20: FIG. 41).

First, the epitaxial substrate preparing step (S10: FIG. 41) is performed. Specifically, the silicon carbide epitaxial substrate is prepared by the above-described method for manufacturing the silicon carbide epitaxial substrate.

Next, the substrate processing step (S20: FIG. 41) is performed. Specifically, the silicon carbide epitaxial substrate is processed to manufacture a silicon carbide semiconductor device. The term "process" encompasses various processes such as ion implantation, heat treatment, etching, oxide film formation, electrode formation, dicing, and the like. That is, the substrate processing step may include at least one of the ion implantation, the heat treatment, the etching, the oxide film formation, the electrode formation, and the dicing.

The following describes a method for manufacturing a MOSFET (Metal Oxide Semiconductor Field Effect Transistor) serving as an exemplary silicon carbide semiconductor device. The substrate processing step (S20: FIG. 41) includes an ion implantation step (S21: FIG. 41), an oxide film forming step (S22: FIG. 41), an electrode forming step (S23: FIG. 41), and a dicing step (S24: FIG. 41).

Figure 42:
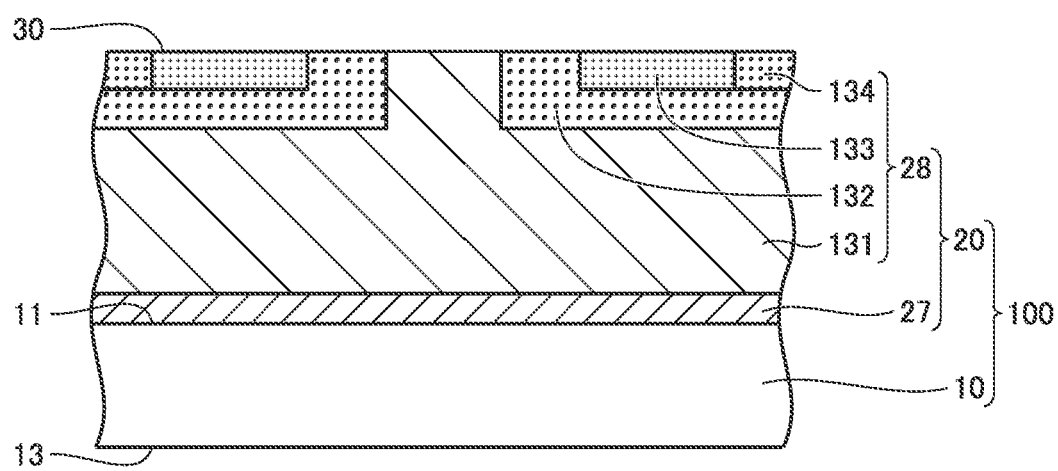
FIG. 42 is a schematic cross sectional view showing a first step of the method for manufacturing the silicon carbide semiconductor device according to the present embodiment.

First, the ion implantation step (S21: FIG. 41) is performed. For example, a p type impurity such as aluminum (Al) is implanted into second main surface 30 on which a mask (not shown) provided with an opening is formed. Accordingly, a body region 132 having p type conductivity is formed. Next, an n type impurity such as phosphorus (P) is implanted into body region 132 at a predetermined location, for example. Accordingly, a source region 133 having n type conductivity is formed. Next, a p type impurity such as aluminum is implanted into source region 133 at a predetermined location. Accordingly, contact region 134 having p type conductivity is formed (see FIG. 42).

A portion of silicon carbide layer 20 other than body region 132, source region 133, and contact region 134 serves as a drift region 131. Source region 133 is separated from drift region 131 by body region 132. The ion implantation may be performed while heating silicon carbide epitaxial substrate 100 at about more than or equal to 300° C. and less than or equal to 600° C. After the ion implantation, activation annealing is performed to silicon carbide epitaxial substrate 100. By the activation annealing, the impurities implanted in silicon carbide layer 20 are activated, thereby generating carriers in each region. An atmosphere for the activation annealing may be an argon (Ar) atmosphere, for example. The temperature of the activation annealing may be about 1800° C., for example. The activation annealing may be performed for about 30 minutes, for example.

Figure 43:
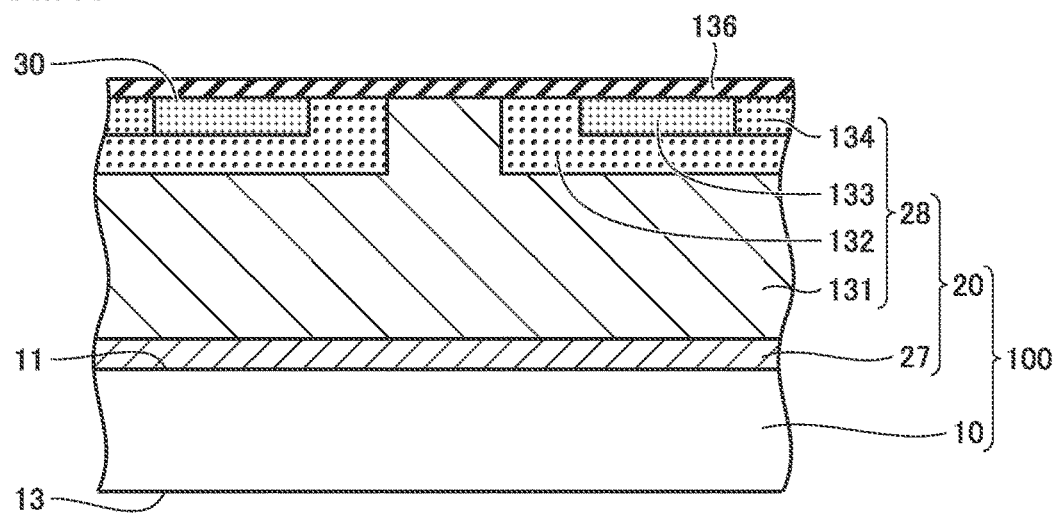
FIG. 43 is a schematic cross sectional view showing a second step of the method for manufacturing the silicon carbide semiconductor device according to the present embodiment.

Next, the oxide film forming step (S22: FIG. 41) is performed. For example, by heating silicon carbide epitaxial substrate 100 in an atmosphere including oxygen, an oxide film 136 is formed on second main surface 30 (see FIG. 43). Oxide film 136 is composed of silicon dioxide ($SiO_2$) or the like, for example. Oxide film 136 functions as a gate insulating film. The temperature of the thermal oxidation process may be about 1300° C., for example. The thermal oxidation process is performed for about 30 minutes, for example.

After oxide film 136 is formed, a heat treatment may be further performed in a nitrogen atmosphere. For example, the heat treatment may be performed at about 1100° C. for about 1 hour in an atmosphere of nitrogen monoxide (NO), nitrous oxide (N₂O), or the like. Further, a heat treatment may be then performed in an argon atmosphere. For example, the heat treatment may be performed at about 1100 to 1500° C. in the argon atmosphere for about 1 hour.

Next, the electrode forming step (S23: FIG. 41) is performed. First electrode 141 is formed on oxide film 136. First electrode 141 functions as a gate electrode. First electrode 141 is formed by the CVD method, for example. First electrode 141 is composed of a conductive polysilicon containing an impurity, for example. First electrode 141 is formed at a location facing source region 133 and body region 132.

Next, an interlayer insulating film 137 is formed to cover first electrode 141. Interlayer insulating film 137 is formed by the CVD method, for example. Interlayer insulating film 137 is composed of silicon dioxide or the like, for example. Interlayer insulating film 137 is formed in contact with first electrode 141 and oxide film 136. Next, oxide film 136 and interlayer insulating film 137 at a predetermined location are removed by etching. Accordingly, source region 133 and contact region 134 are exposed through oxide film 136.

For example, second electrode 142 is formed at the exposed portion by a sputtering method. Second electrode 142 functions as a source electrode. Second electrode 142 is composed of titanium, aluminum, silicon, and the like, for example. After second electrode 142 is formed, second electrode 142 and silicon carbide epitaxial substrate 100 are heated at a temperature of about 900 to 1100° C., for example. Accordingly, second electrode 142 and silicon carbide epitaxial substrate 100 are brought into ohmic contact with each other. Next, an interconnection layer 138 is formed in contact with second electrode 142. Interconnection layer 138 is composed of a material including aluminum, for example.

Next, a passivation protecting film (not shown) is formed on interconnection layer 138 by plasma CVD, for example. The passivation protecting film includes a SiN film, for example. In order to connect a bonding wire, a portion of the passivation protecting film is etched to interconnection layer 138, thus forming an opening in the passivation protecting film. Next, back grinding is performed to third main surface 13 of silicon carbide single crystal substrate 10. Accordingly, silicon carbide single crystal substrate 10 is made thin. Next, a third electrode 143 is formed in third main surface 13. Third electrode 143 functions as a drain electrode. Third electrode 143 is composed of an alloy (for example, NiSi or the like) including nickel and silicon, for example.

Figure 44:
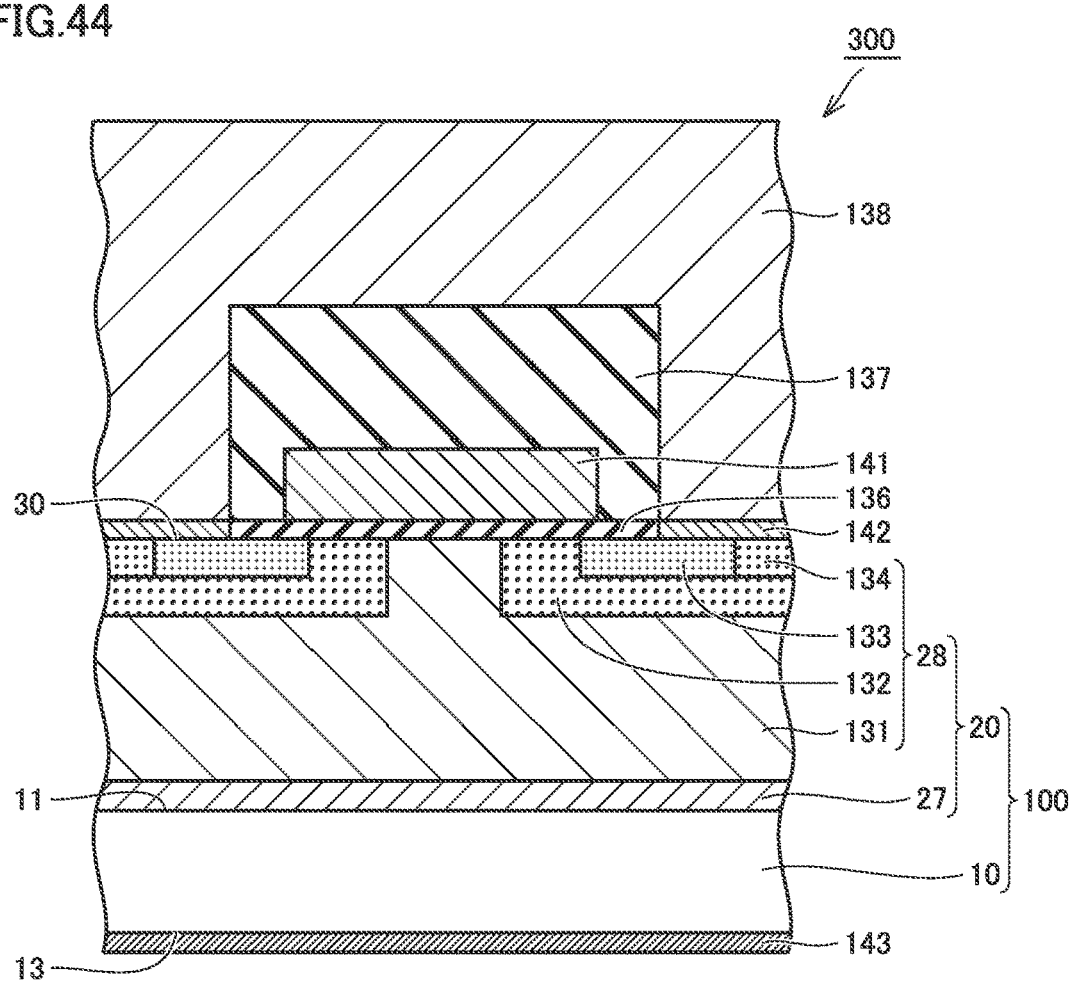
FIG. 44 is a schematic cross sectional view showing a third step of the method for manufacturing the silicon carbide semiconductor device according to the present embodiment.

Next, the dicing step (S24: FIG. 41) is performed. For example, silicon carbide epitaxial substrate 100 is diced along a dicing line, thereby dividing silicon carbide epitaxial substrate 100 into a plurality of semiconductor chips. In this way, a silicon carbide semiconductor device 300 is manufactured (see FIG. 44).

In the description above, the method for manufacturing the MOSFET exemplarily serving as the silicon carbide semiconductor device according to the present disclosure has been described; however, the manufacturing method according to the present disclosure is not limited to this. The manufacturing method according to the present disclosure is applicable to various types of silicon carbide semiconductor devices such as an IGBT (Insulated Gate Bipolar Transistor), an SBD (Schottky Barrier Diode), a thyristor, a GTO (Gate Turn Off thyristor), and a PiN diode.

(Evaluation 1)
1-1. Production of Samples

First, silicon carbide epitaxial substrates 100 according to samples 1 to 6 were prepared. Samples 1 to 3 are silicon carbide epitaxial substrates 100 according to Examples. Samples 4 to 6 are silicon carbide epitaxial substrates 100 according to Comparative Examples. Silicon carbide epitaxial substrates 100 according to samples 1 to 4 were manufactured using the ammonia gas as the dopant gas. The flow rates of the ammonia gas in the steps of forming drift layers 28 of silicon carbide epitaxial substrates 100 according to samples 1 to 4 were $1.4 \times 10^{-2}$ sccm, $3.3 \times 10^{-3}$ sccm, $7.8 \times 10^{-3}$ sccm, and $2.0 \times 10^{-3}$ sccm, respectively. On the other hand, silicon carbide epitaxial substrates 100 according to samples 5 and 6 were manufactured using the nitrogen gas as the dopant gas. The flow rates of the nitrogen gas in the steps of forming drift layers 28 of silicon carbide epitaxial substrates 100 according to samples 5 and 6 were 4.5 sccm and 2.12 sccm, respectively.

In each of the methods for manufacturing silicon carbide epitaxial substrates 100 according to samples 1 to 3, 5, and 6, the C/Si ratio in the step of forming the buffer layer is different from the C/Si ratio in the step of forming the drift layer. On the other hand, in the method for manufacturing silicon carbide epitaxial substrate 100 according to sample 4, the C/Si ratio in the step of forming the drift layer is the same as the C/Si ratio in the step of forming the buffer layer.

Particularly, silicon carbide epitaxial substrates 100 according to samples 1, 2, 3, 4, 5, and 6 were respectively manufactured by the methods shown in FIG. 38, FIG. 39, FIG. 40, FIG. 45, FIG. 46, and FIG. 47. The methods for manufacturing silicon carbide epitaxial substrates 100 according to samples 1, 2, and 3 are respectively the same as the methods for manufacturing silicon carbide epitaxial substrates 100 according to the embodiment, first modification, and second modification.

Figure 45:
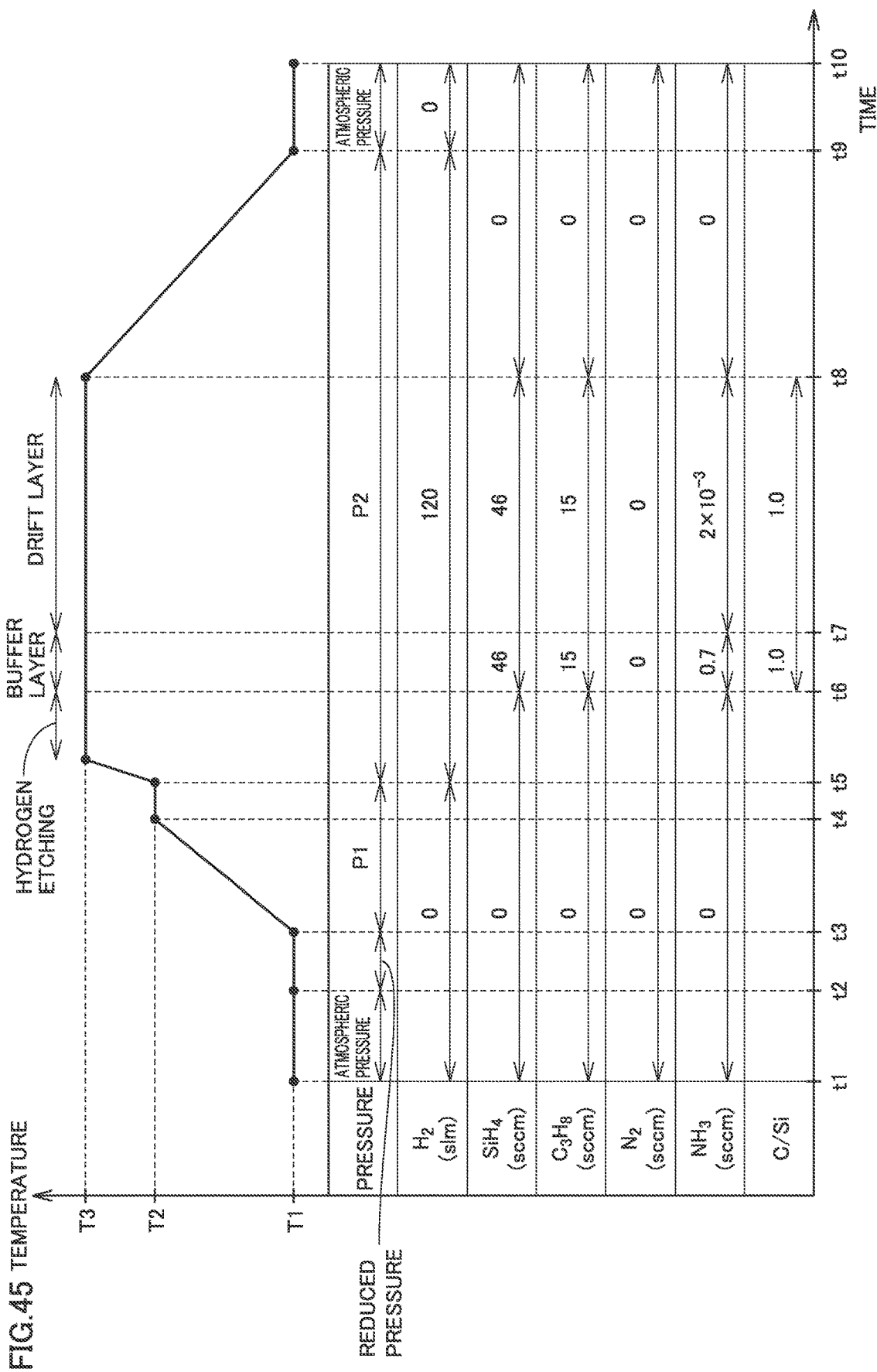
FIG. 45 shows a method for manufacturing a silicon carbide epitaxial substrate according to a sample 4.

Silicon carbide epitaxial substrate 100 according to sample 4 was manufactured as follows. As shown in FIG. 45, in the step of forming the buffer layer (i.e., the period between the sixth time (t6) and the seventh (t7)), the flow rate of the hydrogen gas was 120 slm, the flow rate of the silane gas was 46 sccm, the flow rate of the propane gas was 15 sccm, and the flow rate of the ammonia gas was 0.7 sccm. The C/Si ratio of the source material gas was 1.0. In the step of forming the drift layer (i.e., during the period between the seventh time (t7) and the eighth time (t8)), the flow rate of the hydrogen gas was 120 slm, the flow rate of the silane gas was 46 sccm, the flow rate of the propane gas was 15 sccm, and the flow rate of the ammonia gas was $2.0 \times 10^{-3}$ sccm. The C/Si ratio of the source material gas was 1.0.

Figure 46:
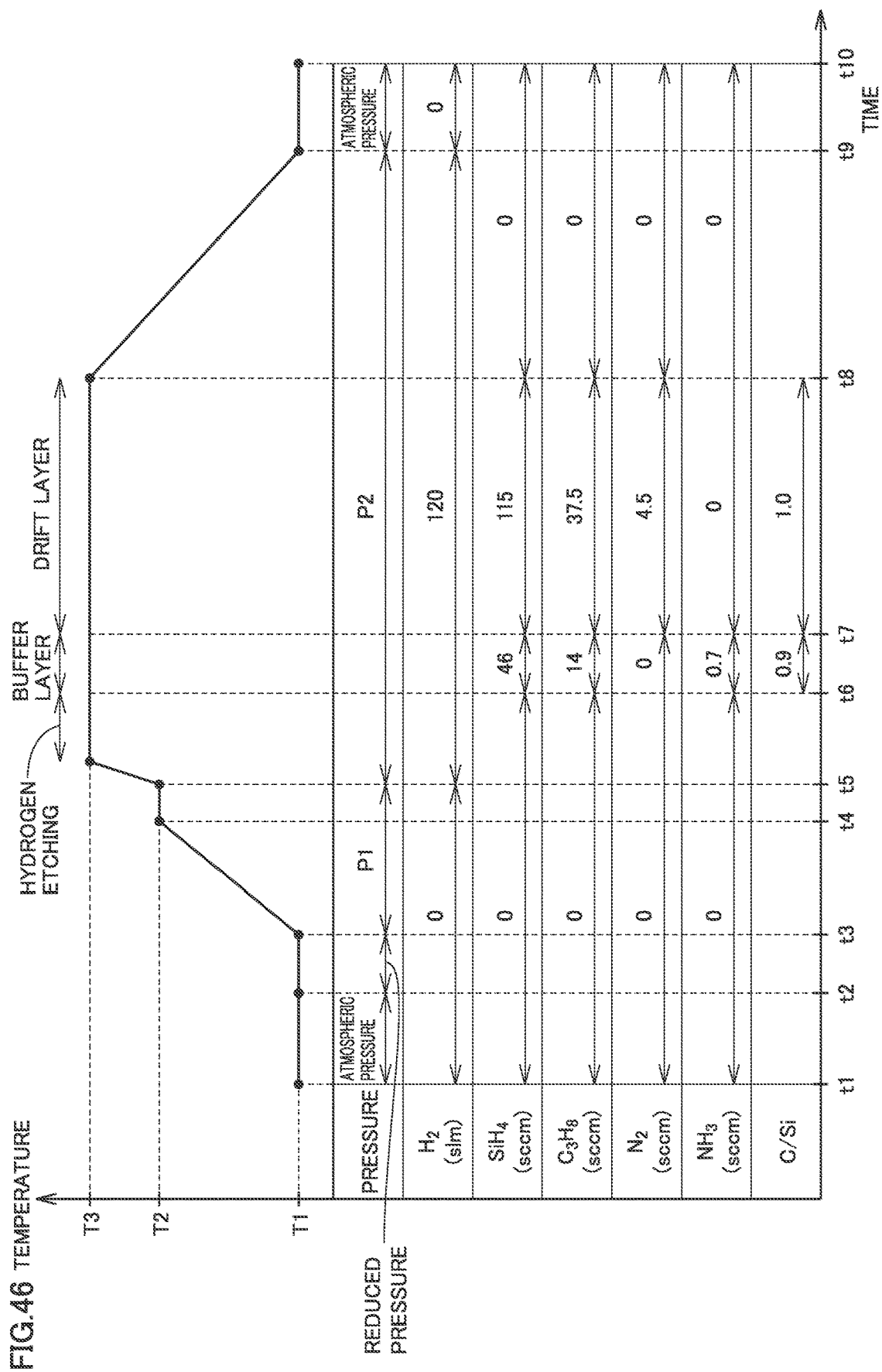
FIG. 46 shows a method for manufacturing a silicon carbide epitaxial substrate according to a sample 5.

Silicon carbide epitaxial substrate 100 according to sample 5 was manufactured as follows. As shown in FIG. 46, in the step of forming the buffer layer (i.e., the period between the sixth time (t6) and the seventh time (t7)), the flow rate of the hydrogen gas was 120 slm, the flow rate of the silane gas was 46 sccm, the flow rate of the propane gas was 14 sccm, and the flow rate of the ammonia gas was 0.7 sccm. The C/Si ratio of the source material gas was 0.9. In the step of forming the drift layer (i.e., during the period between the seventh time (t7) and the eighth time (t8)), the flow rate of the hydrogen gas was 120 slm, the flow rate of the silane gas was 115 sccm, the flow rate of the propane gas was 37.5 sccm, and the flow rate of the nitrogen gas was 4.5 sccm. The C/Si ratio of the source material gas was 1.0.

Figure 47:
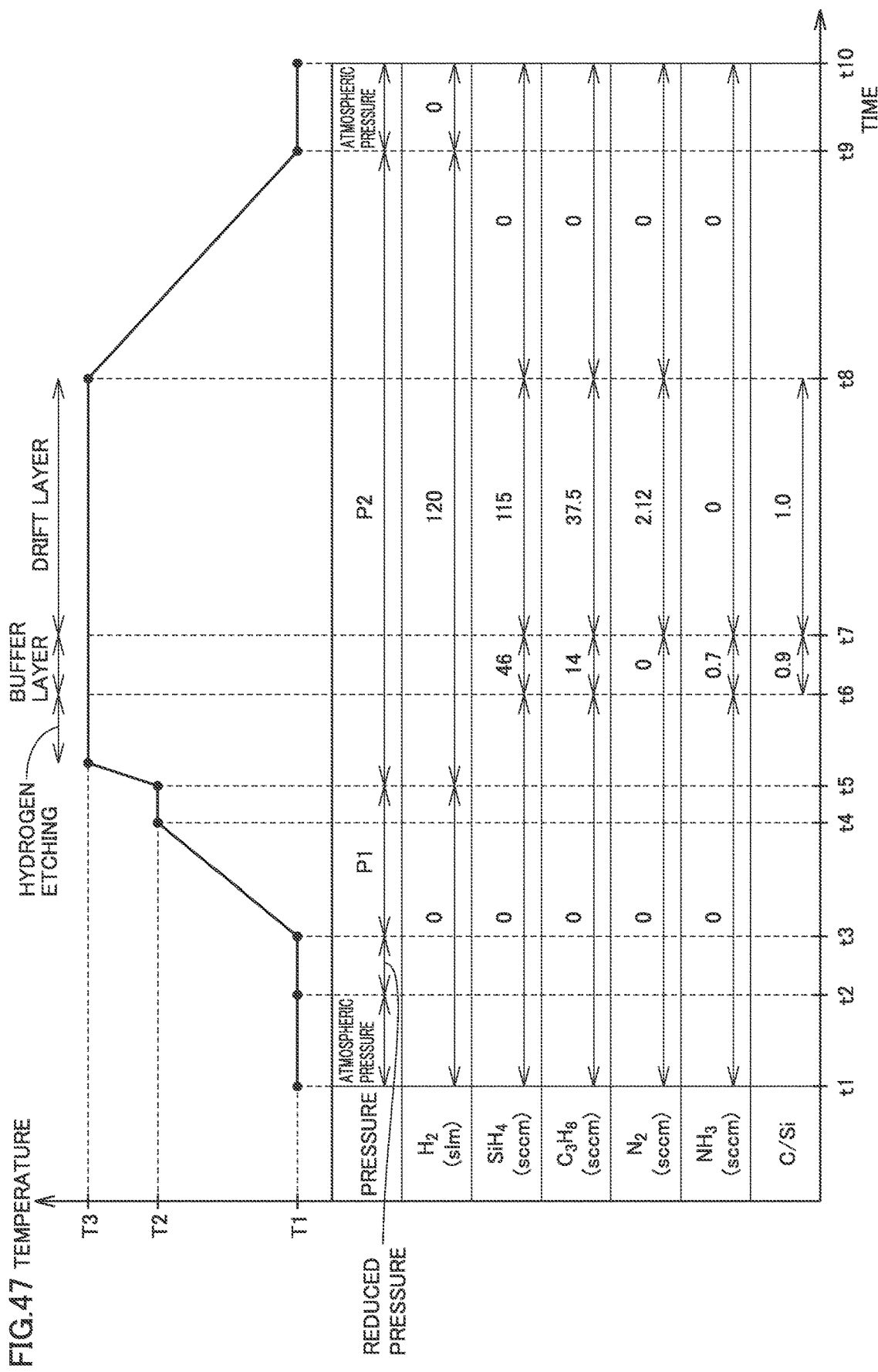
FIG. 47 shows a method for manufacturing a silicon carbide epitaxial substrate according to a sample 6.
Figure 49:
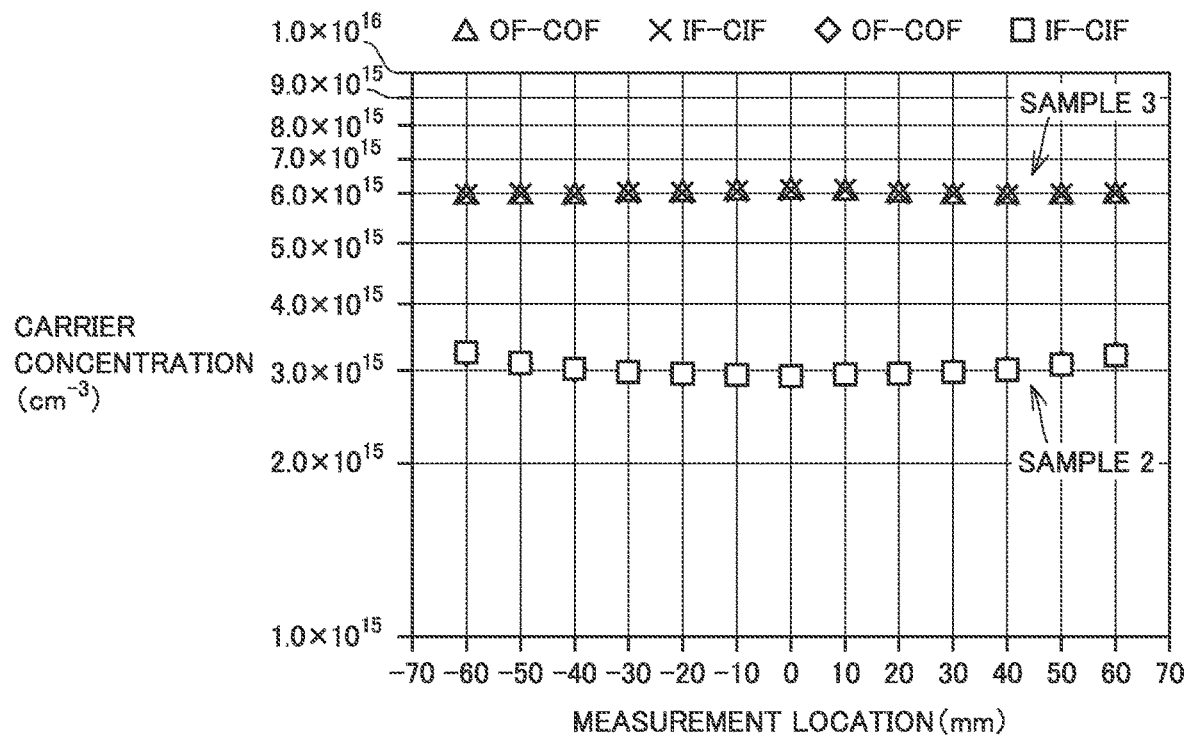
FIG. 49 shows an in-plane distribution of a carrier concentration of a silicon carbide layer of a silicon carbide epitaxial substrate according to each of samples 2 and 3.
Figure 50:
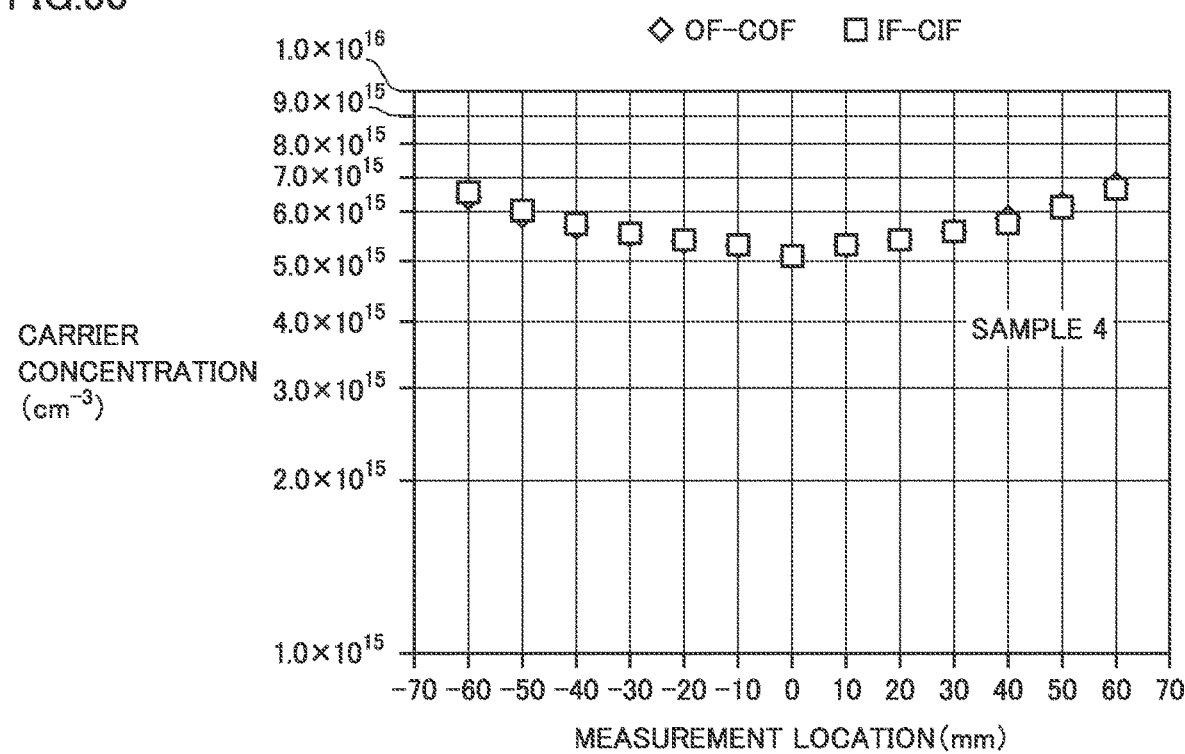
FIG. 50 shows an in-plane distribution of a carrier concentration of a silicon carbide layer of the silicon carbide epitaxial substrate according to sample 4.
Figure 51:
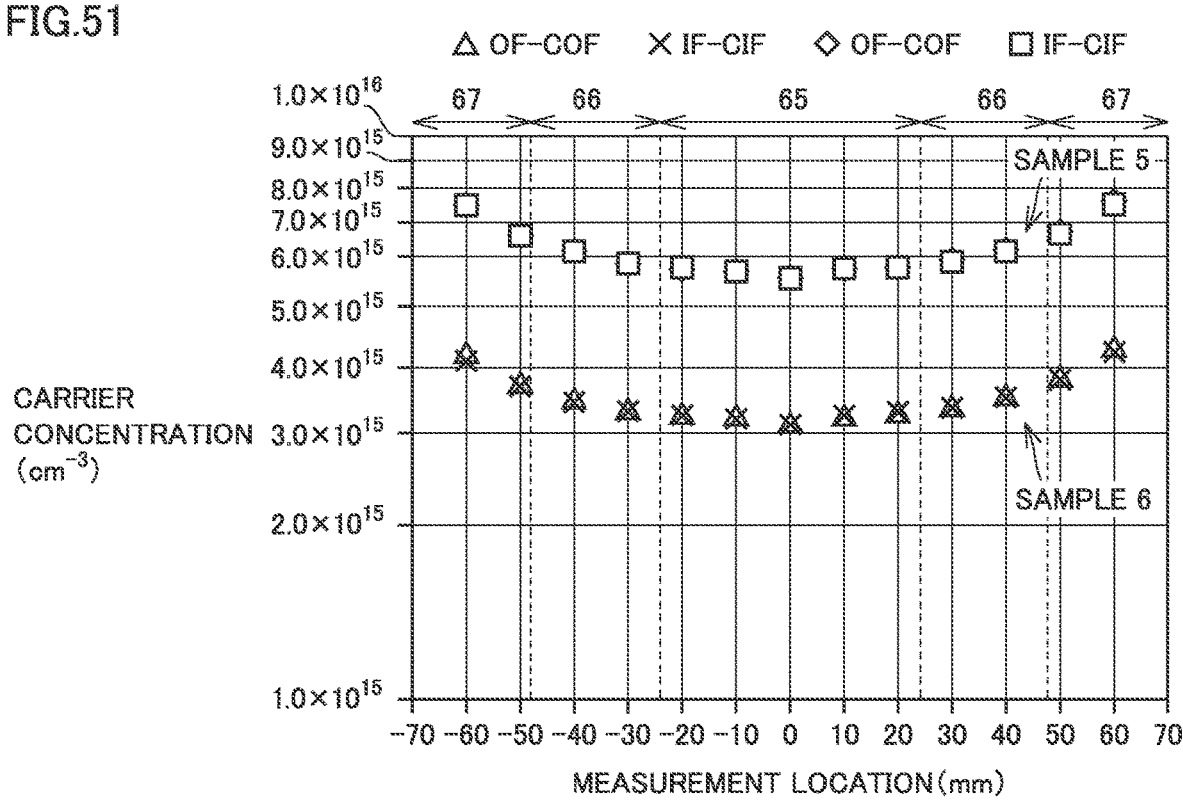
FIG. 51 shows an in-plane distribution of a carrier concentration of a silicon carbide layer of a silicon carbide epitaxial substrate according to each of samples 5 and 6.

Silicon carbide epitaxial substrate 100 according to sample 6 was manufactured as follows. As shown in FIG. 47, in the step of forming the buffer layer (i.e., the period between the sixth time (t6) and the seventh time (t7)), the flow rate of the hydrogen gas was 120 slm, the flow rate of the silane gas was 46 sccm, the flow rate of the propane gas was 14 sccm, and the flow rate of the ammonia gas was 0.7 sccm. The C/Si ratio of the source material gas was 0.9. In the step of forming the drift layer (i.e., during the period between the seventh time (t7) and the eighth time (t8)), the flow rate of the hydrogen gas was 120 slm, the flow rate of the silane gas was 115 sccm, the flow rate of the propane gas was 37.5 sccm, and the flow rate of the nitrogen gas was 2.12 sccm. The C/Si ratio of the source material gas was 1.0.

silicon carbide epitaxial substrates 100 according to sample 5 and sample 6. In FIG. 48 to FIG. 53, "OF-COF" and "IF-CIF" respectively represent results at the measurement locations on second straight line 7 and first straight line 8 in FIG. 3. As shown in FIG. 51, the value of the carrier concentration may become higher at the outer circumferential side (i.e., third region 67) than that at the central side (i.e., first region 65) of second main surface 30. In this case, the profile of the carrier concentration of silicon carbide layer 20 exhibits a U-like shape.

TABLE 1

| | | | | Carrier Concentration ($cm^{-3}$) | | | | | | |
|---|---|---|---|---|---|---|---|---|---|---|
| Sample Number | Epitaxial Growth Condition | Dopant Gas | Dopant Flow Rate (sccm) | Average Value | Standard Deviation | Standard Deviation/ Average Value | Maximum Value | Minimum Value | Maximum Value- Minimum Value | (Maximum Value- Minimum Value)/ (2 × Average Value) |
| Sample 1 | Condition A | $NH_3$ | $1.4 \times 10^{-2}$ | $5.23 \times 10^{15}$ | $5.64 \times 10^{13}$ | 1.08% | $5.33 \times 10^{15}$ | $5.14 \times 10^{15}$ | $1.90 \times 10^{14}$ | 1.9% |
| Sample 2 | Condition B | $NH_3$ | $3.3 \times 10^{-3}$ | $3.00 \times 10^{15}$ | $8.75 \times 10^{13}$ | 2.91% | $3.19 \times 10^{15}$ | $2.90 \times 10^{15}$ | $2.93 \times 10^{14}$ | 4.9% |
| Sample 3 | Condition C | $NH_3$ | $7.8 \times 10^{-3}$ | $6.16 \times 10^{15}$ | $4.78 \times 10^{13}$ | 0.78% | $6.26 \times 10^{15}$ | $6.08 \times 10^{15}$ | $1.74 \times 10^{14}$ | 1.4% |
| Sample 4 | Condition D | $NH_3$ | $2.0 \times 10^{-3}$ | $5.72 \times 10^{15}$ | $4.22 \times 10^{14}$ | 7.38% | $6.60 \times 10^{15}$ | $5.08 \times 10^{15}$ | $1.51 \times 10^{15}$ | 13.2% |
| Sample 5 | Condition E | $N_2$ | 4.5 | $6.36 \times 10^{15}$ | $6.05 \times 10^{14}$ | 9.52% | $7.63 \times 10^{15}$ | $5.65 \times 10^{15}$ | $1.97 \times 10^{15}$ | 15.5% |
| Sample 6 | Condition F | $N_2$ | 2.12 | $3.53 \times 10^{15}$ | $3.22 \times 10^{14}$ | 9.12% | $4.22 \times 10^{15}$ | $3.16 \times 10^{15}$ | $1.06 \times 10^{15}$ | 15.0% |

1-2. Carrier Concentration Measurement Experiment

The carrier concentration of silicon carbide layer 20 of silicon carbide epitaxial substrate 100 according to each of samples 1 to 6 was measured using a C-V measuring apparatus employing the mercury probe method. The area of the probe is 0.01 $cm^2$. Applied voltage was set at 0 to 5 V. The carrier concentration is measured at central region 53. As shown in FIG. 3, for example, on first straight line 8, the carrier concentration was measured at points distant away from center O by ±10 mm, ±20 mm, ±30 mm, ±40 mm, ±50 mm and ±60 mm. Likewise, on second straight line 7, the carrier concentration was measured at points distant away from center O by ±10 mm, ±20 mm, ±30 mm, ±40 mm, ±50 mm and ±60 mm. The carrier concentration was also measured at center O. That is, the carrier concentration was measured at measurement regions 25 indicated by circles with hatching in FIG. 3. The average value, standard deviation, standard deviation/average value, maximum value, minimum value, maximum value−minimum value, and (maximum value−minimum value)/(2×average value) of the carrier concentration in all the measurement regions 25 were calculated. It should be noted that in the case of silicon carbide epitaxial substrate 100 according to sample 1, in addition to the 25 measurement locations above, the measurement was also performed at the following locations (see FIG. 48): a location of +70 mm from center O on second straight line 7; a location of −65 mm from center O; and locations of ±70 mm from center O on first straight line 8.

1-3. Results of Carrier Concentration Measurement

Figure 48:
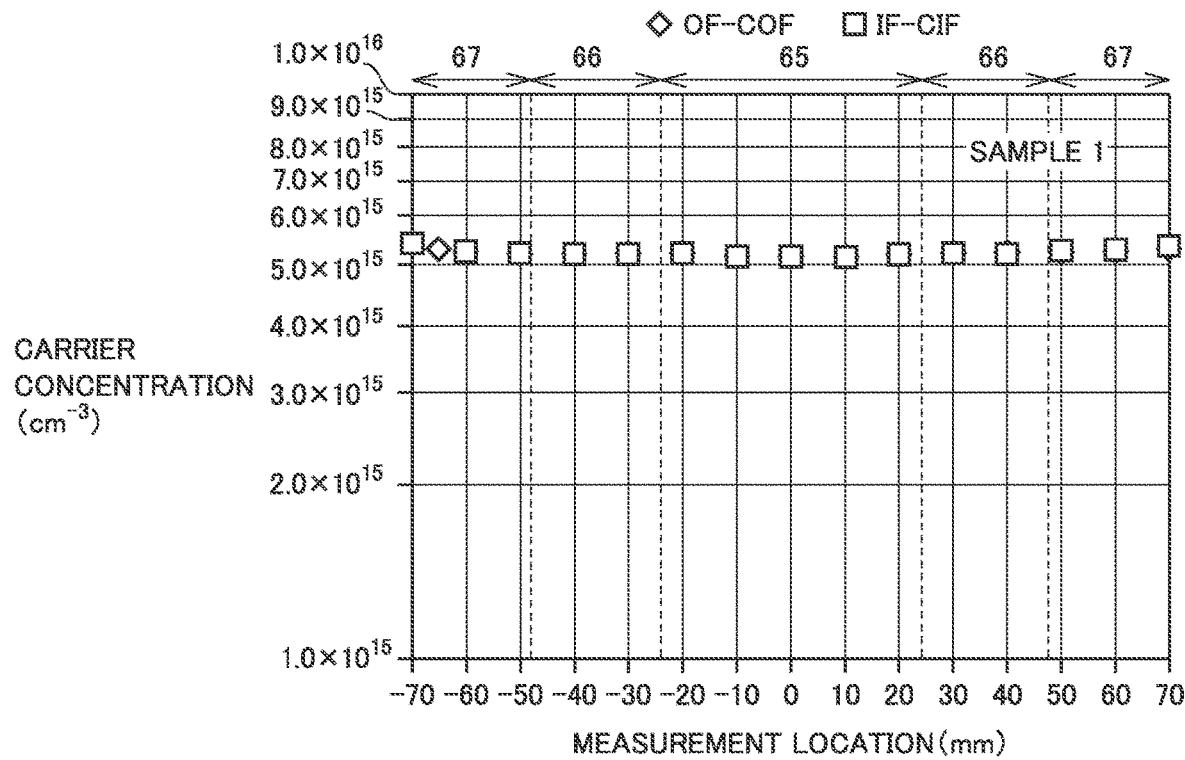
FIG. 48 shows an in-plane distribution of a carrier concentration of a silicon carbide layer of a silicon carbide epitaxial substrate according to a sample 1.

FIG. 48 shows a carrier concentration distribution of silicon carbide layer 20 of silicon carbide epitaxial substrate 100 according to sample 1. FIG. 49 shows carrier concentration distributions of silicon carbide layers 20 of silicon carbide epitaxial substrates 100 according to sample 2 and sample 3. FIG. 50 shows a carrier concentration distribution of silicon carbide layer 20 of silicon carbide epitaxial substrate 100 according to sample 4. FIG. 51 shows carrier concentration distributions of silicon carbide layers 20 of Table 1 shows the average value, standard deviation, standard deviation/average value, maximum value, minimum value, maximum value−minimum value, and (maximum value−minimum value)/(2×average value) of the carrier concentration of silicon carbide layer 20 of silicon carbide epitaxial substrate 100 according to each of samples 1 to 6. The values described in Table 1 were calculated using the carrier concentration at the total of 25 measurement regions 25 within ±60 mm from center O (see FIG. 3). As shown in Table 1, the standard deviations/average values of the carrier concentrations of silicon carbide layers 20 of silicon carbide epitaxial substrates 100 according to samples 1 to 6 were 1.08%, 2.91%, 0.78%, 7.38%, 9.52% and 9.12%, respectively. Likewise, the (maximum values−minimum values)/(2×average values) of the carrier concentrations of silicon carbide layers 20 of silicon carbide epitaxial substrates 100 according to samples 1 to 6 were 1.9%, 4.9%, 1.4%, 13.2%, 15.5% and 15.0%, respectively.

In the case of silicon carbide epitaxial substrate 100 according to sample 1, as shown in FIG. 48, in addition to the 25 measurement regions above, the carrier concentration was measured at the following locations: locations of −65 mm and +70 mm on second straight line 7; and locations of ±70 mm on first straight line 8. In consideration of the additional measurement regions above, the standard deviation/average value of the carrier concentration of silicon carbide layer 20 of silicon carbide epitaxial substrate 100 according to sample 1 was 1.31%, and the (maximum value−minimum value)/(2×average value) of the carrier concentration thereof was 2.7%. That is, also in consideration of the carrier concentration in the silicon carbide layer at the outer circumferential side, it was confirmed that the standard deviation/average value of the carrier concentration and the (maximum value−minimum value)/(2×average value) of the carrier concentration of silicon carbide epitaxial substrate 100 according to sample 1 were lower than those of silicon carbide epitaxial substrate 100 according to sample 2.

In the direction parallel to the central region, the ratio of the standard deviation of the carrier concentration to the average value of the carrier concentration of the carrier concentration in silicon carbide layer 20 of silicon carbide epitaxial substrate 100 according to each of samples 1 to 3 was less than 5%. On the other hand, in the direction parallel to the central region, the ratio of the standard deviation of the carrier concentration to the average value of the carrier concentration of the carrier concentration in silicon carbide layer 20 of silicon carbide epitaxial substrate 100 according to each of samples 4 to 6 was more than or equal to 5%.

It was confirmed that the in-plane uniformity of the carrier concentration can be improved by employing the ammonia gas as the doping gas instead of the nitrogen gas and setting the very low flow rate of the ammonia gas (for example, about less than or equal to $7.8 \times 10^{-3}$ sccm) (i.e., the silicon carbide epitaxial substrates according to samples 1 to 3) as described above. The ammonia gas is likely to be thermally decomposed as compared with the nitrogen gas having a triple bond. Accordingly, it is considered that the uniformity of the concentration of the nitrogen atoms in the flow direction of the dopant gas is improved, with the result that the in-plane uniformity of the carrier concentration is improved.

Moreover, the ammonia gas is more likely to be included in the silicon carbide layer than the nitrogen gas. Therefore, the flow rate of the ammonia gas is required to be precisely controlled with the flow rate of the ammonia gas being set to be very low during the epitaxial growth. As a result of diligent study, the inventors found that the flow rate of the ammonia gas can be precisely controlled with the flow rate of the ammonia gas being set to be very low by using a container including ammonia gas diluted with hydrogen gas in advance, for example. Accordingly, the in-plane uniformity of the carrier concentration can be improved.

Moreover, the inventors paid attention to increasing the epitaxial growth rate of the silicon carbide layer while using ammonia as the dopant gas. Specifically, the flow rate of the source material gas with respect to the hydrogen gas was increased. The hydrogen gas has a characteristic of etching silicon carbide. By increasing the ratio of the source material gas to the hydrogen gas (for example, by setting $SiH_4/H_2$ to be about more than or equal to 0.1%), the epitaxial growth rate of the silicon carbide layer can be increased. Accordingly, it is considered that variation in the carrier concentration at the outer circumferential side of the silicon carbide layer is reduced particularly, whereby the in-plane uniformity of the carrier concentration can be improved.

1-4. Film Thickness Measurement Experiment

The film thickness of silicon carbide layer 20 of silicon carbide epitaxial substrate 100 according to each of samples 1 and 4 was measured by FT-IR. The film thickness was measured at the same locations as those in the above-described measurement of the carrier concentration. That is, at each of measurement regions 25 indicated by the circles with hatching in FIG. 3, the film thickness of silicon carbide layer 20 was measured. The average value, standard deviation, standard deviation/average value, maximum value, minimum value, maximum value−minimum value, and (maximum value−minimum value)/(2×average value) of the film thickness of silicon carbide layer 20 at all the measurement regions 25 were calculated. It should be noted that in the case of silicon carbide epitaxial substrate 100 according to sample 1, in addition to the 25 measurement locations above, the measurement was also performed at the following locations (see FIG. 52): a location of +70 mm from center O on second straight line 7; a location of −65 mm from center O; and locations of ±70 mm from the center on first straight line 8. Moreover, in the case of silicon carbide epitaxial substrate 100 according to sample 4, the measurement was not performed at center O (see FIG. 53).

1-5. Results of Film Thickness Measurement

Figure 52:
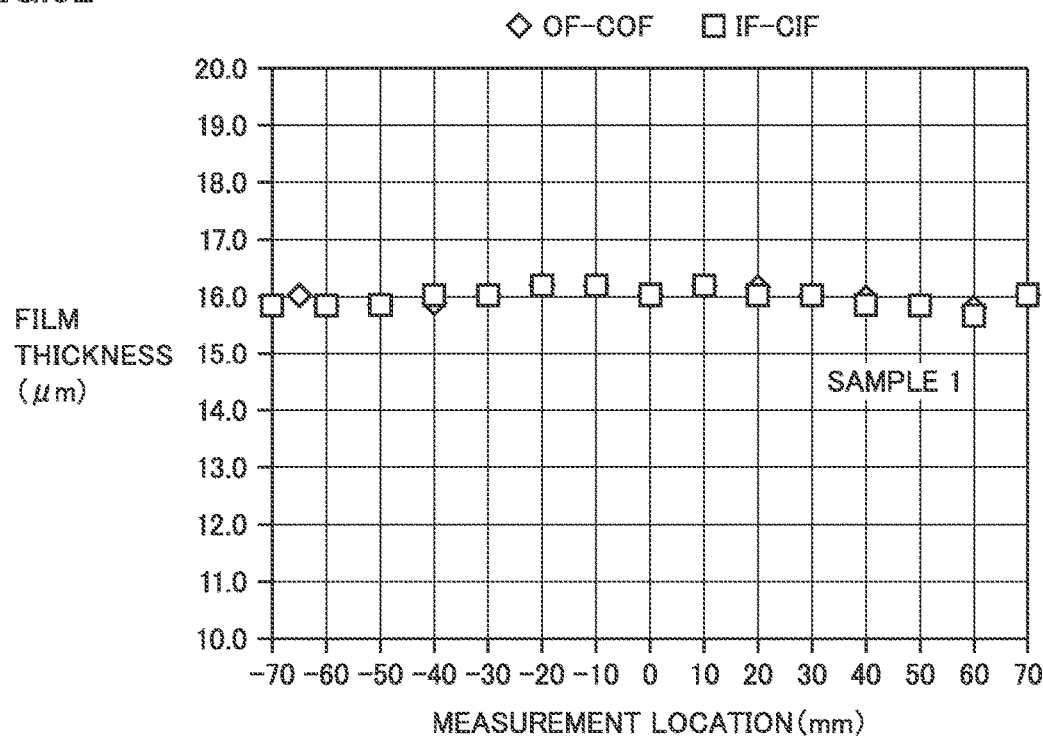
FIG. 52 shows an in-plane distribution of a film thickness of the silicon carbide layer of the silicon carbide epitaxial substrate according to sample 1.
Figure 53:
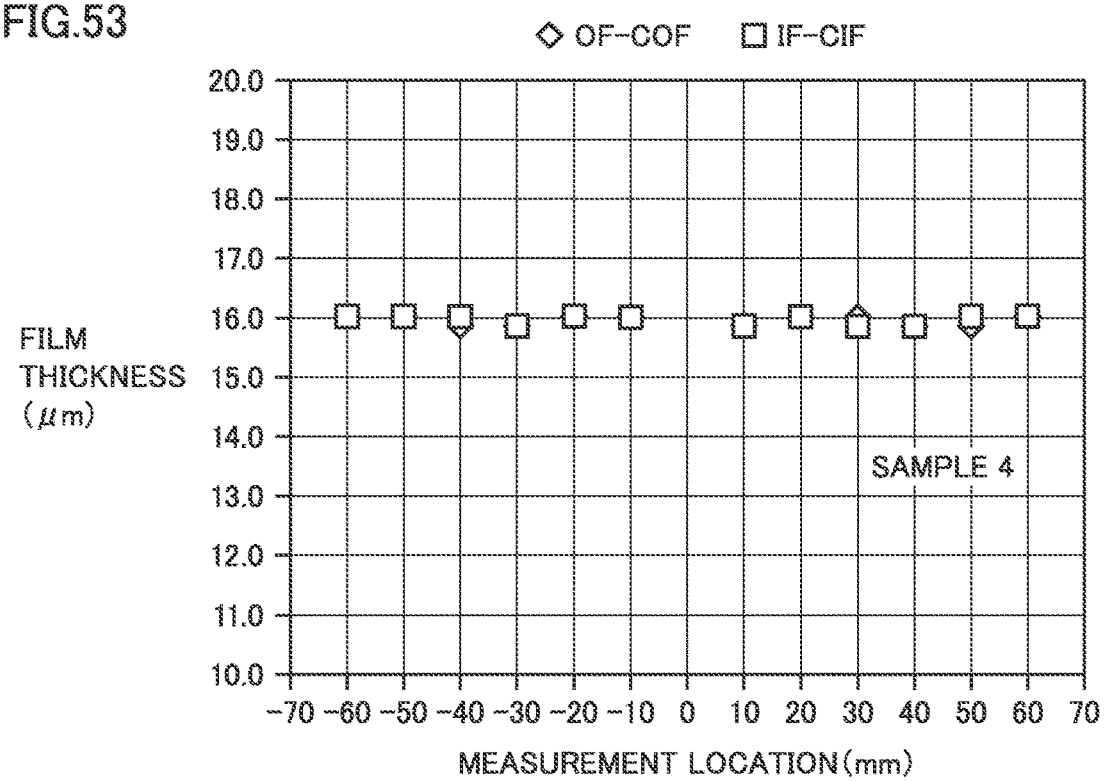
FIG. 53 shows an in-plane distribution of a film thickness of the silicon carbide layer of the silicon carbide epitaxial substrate according to sample 4.

FIG. 52 shows a film thickness distribution of silicon carbide layer 20 of silicon carbide epitaxial substrate 100 according to sample 1. FIG. 53 shows a film thickness distribution of silicon carbide layer 20 of silicon carbide epitaxial substrate 100 according to sample 4.

TABLE 2

| | | | | Film Thickness of Epitaxial Layer (nm) | | | | | | |
|---|---|---|---|---|---|---|---|---|---|---|
| Sample Number | Epitaxial Growth Condition | Dopant Gas | Dopant Flow Rate (sccm) | Average Value | Standard Deviation | Standard Deviation/ Average Value | Maximum Value | Minimum Value | Maximum Value- Minimum Value | (Maximum Value- Minimum Value)/ (2 × Average Value) |
| Sample 1 | Condition A | $NH_3$ | $1.4 \times 10^{-2}$ | 15.99 | 0.15 | 0.92% | 16.20 | 15.68 | 0.52 | 1.6% |
| Sample 4 | Condition D | $NH_3$ | $2.0 \times 10^{-3}$ | 15.96 | 0.08 | 0.53% | 16.02 | 15.85 | 0.17 | 0.5% |

Table 2 shows the average value, standard deviation, standard deviation/average value, maximum value, minimum value, maximum value−minimum value, and (maximum value−minimum value)/(2×average value) of the film thickness of silicon carbide layer 20 (i.e., epitaxial layer) of silicon carbide epitaxial substrate 100 according to each of samples 1 and 4. As shown in Table 2, the standard deviation/average value of the film thickness of silicon carbide layer 20 of silicon carbide epitaxial substrate 100 according to sample 1 was 0.92% and the standard deviation/average value of the film thickness of silicon carbide layer 20 of silicon carbide epitaxial substrate 100 according to sample 4 was 0.53%. Likewise, the (maximum value−minimum value)/(2×average value) of the film thickness of silicon carbide layer 20 of silicon carbide epitaxial substrate 100 according to sample 1 was 1.6% and the (maximum value−minimum value)/(2×average value) of the film thickness of silicon carbide layer 20 of silicon carbide epitaxial substrate 100 according to sample 4 was 0.5%. In the direction parallel to the central region, the ratio of the standard deviation of the thickness to the average value of the thickness in silicon carbide layer 20 of silicon carbide epitaxial substrate 100 according to each of samples 1 and 4 was less than 5%.

(Evaluation 2)

2-1. Production of Samples

First, silicon carbide epitaxial substrates 100 according to samples 7 to 10 were prepared. Samples 7 and 8 are silicon carbide epitaxial substrates 100 according to Examples. Samples 9 and 10 are silicon carbide epitaxial substrates 100 according to Comparative Examples. Silicon carbide epitaxial substrates 100 according to samples 7 to 10 were manufactured using the ammonia gas as the dopant gas. In each of the methods for manufacturing silicon carbide epitaxial substrates 100 according to samples 7 and 8, the C/Si ratio in the step of forming the buffer layer is different from the C/Si ratio in the step of forming the drift layer. On the other hand, in the method for manufacturing silicon carbide epitaxial substrate 100 according to each of sample 9 and 10, the C/Si ratio in the step of forming the buffer layer is the same as the C/Si ratio in the step of forming the drift layer.

Specifically, the methods for manufacturing silicon carbide epitaxial substrates 100 according to samples 7, 8, and 9 are respectively the same as the methods for manufacturing silicon carbide epitaxial substrates 100 according to samples 3, 1, and 4 in Evaluation 1 above. The method for manufacturing silicon carbide epitaxial substrate 100 according to sample 10 is different from the method for manufacturing silicon carbide epitaxial substrate 100 according to sample 9 in terms of a condition in which the third temperature (T3: FIG. 45) in each of the steps of forming the buffer layer and the drift layer is 1560° C. The other conditions are the same as those in the method for manufacturing silicon carbide epitaxial substrate 100 according to sample 9.

2-2. Experiment Conditions

The number of defects and haze were measured in second main surface 30 of silicon carbide epitaxial substrate 100 according to each of samples 7 to 10. The number of defects and the haze were measured using SICA provided by Lasertec. The measurement method is as described above. As the defects, macroscopic defects, pits, and bumps were measured. The macroscopic defects include downfall defects and triangular defects. Each of the pits is deep pit 87 (see FIG. 5). Each of the bumps is bump 73 (see FIG. 9) involving a trapezoidal defect. The defect density was calculated by dividing the total number of the defects by the area of the region in which the defects were measured. The area of the region in which the defects were measured was about 170 cm$^2$.

A ratio of 6-mm square measurement regions including the macroscopic defects was calculated as follows. The region in which the macroscopic defects were measured was divided into a plurality of square regions each having a size of 6 mm×6 mm (6-mm square measurement regions). In each of the 6-mm square measurement regions, it was determined whether or not the macroscopic defects were included. By dividing the number of the 6-mm square measurement regions including the macroscopic defects by the number of all the 6-mm square measurement regions, the ratio of the 6-mm square measurement regions including the macroscopic defects was calculated.

2-3. Experiment Results

Figure 54:
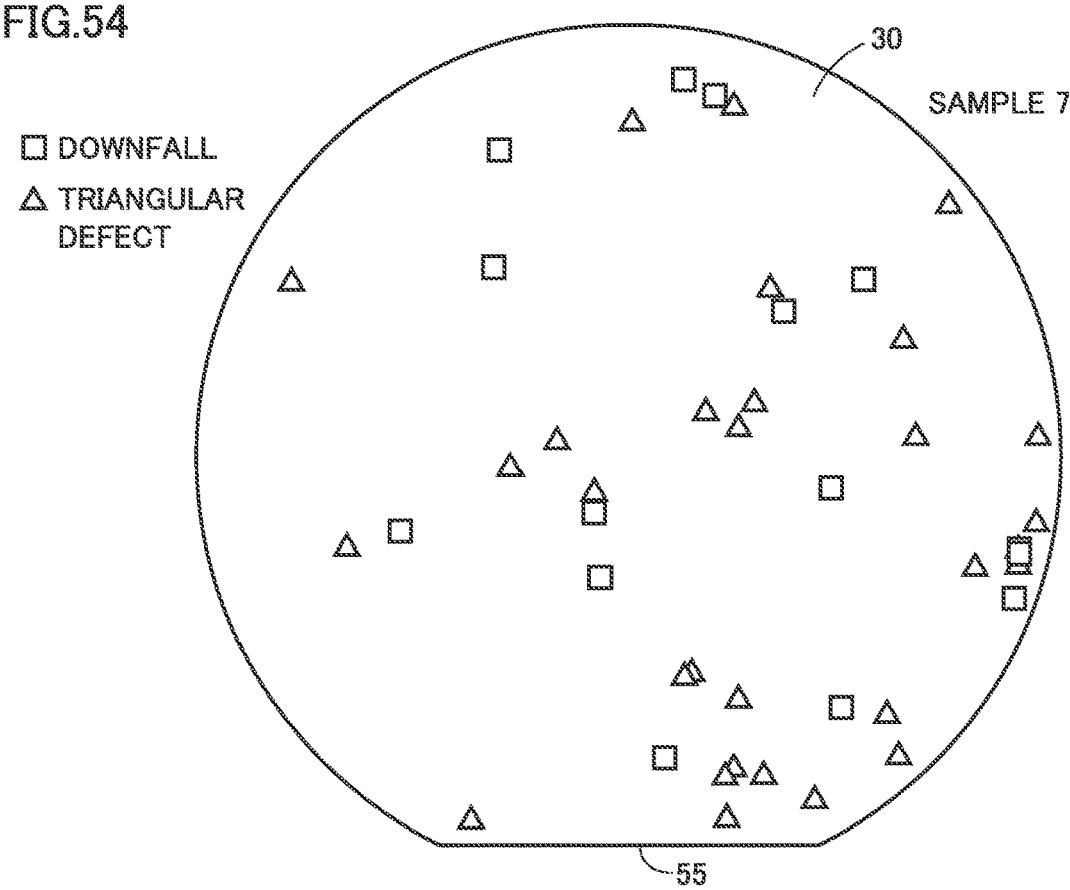
FIG. 54 is a map showing an in-plane distribution of downfall and triangular defects in the second main surface of the silicon carbide epitaxial substrate according to sample 7.

FIG. 54 and FIG. 55 are maps respectively showing the in-plane distributions of the downfall defects and triangular defects in second main surfaces 30 of silicon carbide epitaxial substrates 100 according to samples 7 and 9. In FIG. 54, the downfall defects are indicated by quadrangles and the triangular defects are indicated by triangles. In FIG. 55, the downfall defects and the triangular defects are collectively indicated by quadrangles. As shown in FIG. 54 and FIG. 55, as compared with silicon carbide epitaxial substrate 100 according to sample 7, a multiplicity of downfall defects and triangular defects are distributed in second main surface 30 of silicon carbide epitaxial substrate 100 according to sample 9. A multiplicity of downfall defects and triangular defects are distributed at the outer circumferential side relative to the center of second main surface 30.

TABLE 3

| Sample Number | Epitaxial Growth Condition | Diameter of Substrate | Area of Substrate | Number of Defects | | | Defect Density (cm$^{-2}$) | | |
|---|---|---|---|---|---|---|---|---|---|
| | | | | Macroscopic Defects | Pits | Bumps | Macroscopic Defects | Pits | Bumps |
| Sample 7 | Condition C | 150 mm | 170 cm$^2$ | 37 | 48 | 312 | 0.2 | 0.3 | 1.8 |
| Sample 8 | Condition A | 150 mm | 170 cm$^2$ | 160 | 1163 | 1725 | 0.9 | 6.8 | 10.1 |
| Sample 9 | Condition D | 150 mm | 170 cm$^2$ | 157 | 103 | 350 | 0.9 | 0.6 | 2.1 |
| Sample 10 | Condition G | 150 mm | 170 cm$^2$ | — | — | — | — | 900 | — |

As shown in Table 3, the defect densities of the macroscopic defects in second main surfaces 30 of silicon carbide epitaxial substrates 100 according to samples 7, 8, and 9 were respectively 0.2 cm$^{-2}$, 0.9 cm$^{-2}$, and 0.9 cm$^{-2}$. The defect densities of the pits in second main surfaces 30 of silicon carbide epitaxial substrates 100 according to samples 7, 8, 9, and 10 were respectively 0.3 cm$^{-2}$, 6.8 cm$^{-2}$, 0.6 cm$^{-2}$, and 900 cm$^{-2}$. The defect densities of the bumps in second main surfaces 30 of silicon carbide epitaxial substrates 100 according to samples 7, 8, and 9 were respectively 1.8 cm$^{-2}$, 10.1 cm$^{-2}$, and 2.1 cm$^{-2}$. The defect density of the macroscopic defects, pits, and bumps in second main surface 30 of silicon carbide epitaxial substrate 100 according to sample 7 is lower than the defect density of the macroscopic defects, pits, and bumps in second main surface 30 of silicon carbide epitaxial substrate 100 according to sample 7.

TABLE 4

| Sample Number | Epitaxial Growth Condition | Substrate Diameter | Number of All 6-mm Square Measurement Regions | Number of 6-mm Square Measurement Regions Including Macroscopic Defects | Ratio of 6-mm Square Measurement Regions Including Macroscopic Defects | Haze |
|---|---|---|---|---|---|---|
| Sample 7 | Condition C | 150 mm | 194 | 14 | 7.2% | 18.8 |
| Sample 8 | Condition A | 150 mm | 194 | 49 | 25.3% | — |
| Sample 9 | Condition D | 150 mm | 194 | 50 | 25.8% | 19.1 |
| Sample 10 | Condition G | 150 mm | — | — | — | — |

As shown in Table 4, the ratios of the 6-mm square measurement regions including the macroscopic defects in second main surfaces 30 of silicon carbide epitaxial substrates 100 according to samples 7, 8, and 9 were respectively 7.2%, 25.3%, and 25.8%. The ratio of the 6-mm square measurement regions including the macroscopic defects in second main surface 30 of silicon carbide epitaxial substrate 100 according to sample 7 is lower than those in silicon carbide epitaxial substrates 100 according to samples 8 and 9. The hazes in second main surfaces 30 of silicon carbide epitaxial substrates 100 according to samples 7 and 9 were respectively 18.8 and 19.1. That is, the surface roughness of second main surface 30 of silicon carbide epitaxial substrate 100 according to each of samples 7 and 9 was excellent. As described above, it was confirmed that the surface roughness can be reduced in silicon carbide epitaxial substrate 100 according to sample 7 while improving the in-plane uniformity of the carrier concentration.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: first half loop; 2: first dislocation array; 3, 6, 35, 45: end portion; 4: second half loop; 5: second dislocation array; 7: second straight line; 8: first straight line; 10: silicon carbide single crystal substrate; 11: first main surface; 13: third main surface; 14: fourth main surface (surface); 20: silicon carbide layer; 23: threading screw dislocation; 24, 34, 44: basal plane dislocation; 25: measurement region; 27: buffer layer; 28: drift layer; 29: central surface layer; 30: second main surface; 31: first portion; 32: second portion; 33: third portion; 36: point; 37, 47: imaginary line; 41: fourth portion; 42: fifth portion; 43: sixth portion; 52: outer circumferential region; 53: central region; 54: outer edge; 55: orientation flat; 57: curvature portion; 61: first side; 62: second side; 65: first region; 66: second region; 67: third region; 70: trapezoidal defect; 71: origin; 72: upper base portion; 73: protrusion; 73: bump; 74: base portion; 75: step-bunching; 80: pure water; 81: tangent line; 85: square region; 86: shallow pit; 87: deep pit (pit); 90: carrot defect; 91: central location; 92: highest location; 93: lowest location; 94: point reference plane; 95: first location; 96: second location; 97: third location; 100: silicon carbide epitaxial substrate; 101: first direction; 102: second direction; 103: third direction; 131: drift region; 132: body region; 133: source region; 134: contact region; 136: oxide film; 137: interlayer insulating film; 138: interconnection layer; 141: first electrode; 142: second electrode; 143: third electrode; 161: measurement data; 200: manufacturing apparatus; 201: reaction chamber; 203: heating element; 204: quartz tube; 205: heat insulator; 206: induction heating coil; 207: gas inlet; 208: gas outlet; 210: susceptor plate; 211: heater; 212: rotation axis; 213: first heating region; 214: second heating region; 231: first gas supplier; 232: second gas supplier; 233: third gas supplier; 234: carrier gas supplier; 235: gas supplier; 241: first gas flow rate controller; 242: second gas flow rate controller; 243: third gas flow rate controller; 244: carrier gas flow rate controller; 245: controller; 253: tube; 300: silicon carbide semiconductor device.

The invention claimed is:
1. A silicon carbide epitaxial substrate comprising:
a silicon carbide single crystal substrate having a first main surface; and
a silicon carbide layer on the first main surface,
the silicon carbide layer including a second main surface opposite to a surface of the silicon carbide layer in contact with the silicon carbide single crystal substrate,
the second main surface corresponding to a plane inclined by more than or equal to 0.5° and less than or equal to 8° relative to a (0001) plane,
the second main surface having a maximum diameter of more than or equal to 100 mm,
the silicon carbide layer having a polytype of 4H-SiC,
the silicon carbide layer having n type conductivity,
the second main surface having an outer circumferential region and a central region, the outer circumferential region being within 3 mm from an outer edge of the second main surface, the central region being surrounded by the outer circumferential region,
in a direction parallel to the central region, a ratio of a standard deviation of a carrier concentration of the silicon carbide layer to an average value of the carrier concentration of the silicon carbide layer being less than 5%,
the average value of the carrier concentration being more than or equal to 1×10$^{14}$ cm$^{-3}$ and less than or equal to 5×10$^{16}$ cm$^{-3}$, in the direction parallel to the central region, a ratio of a standard deviation of a thickness of the silicon carbide layer to an average value of the thickness of the silicon carbide layer being less than 5%, the central region having an arithmetic mean roughness (Sa) of less than or equal to 1 nm, pits originated from threading screw dislocations are in the central region, when viewed in a direction perpendicular to the central region, each of the pits has a planar shape including a first side and a second side, the first side extending in a first direction, the second side extending in a second direction perpendicular to the first direction, and a width of the first side is twice or more as large as a width of the second side.

2. The silicon carbide epitaxial substrate according to claim 1, wherein an area density of the pits is less than or equal to 100 $cm^{-3}$.

3. The silicon carbide epitaxial substrate according to claim 1, wherein a maximum depth of each of the pits from the central region is more than or equal to 8 nm.

4. The silicon carbide epitaxial substrate according to claim 1, wherein the central region having a haze of less than or equal to 50.

5. The silicon carbide epitaxial substrate according to claim 1, wherein when the central region is divided into square regions with each side of 6 mm, a ratio of the number of square regions each having at least one of a downfall defect and a triangular defect to the number of all the square regions is less than or equal to 10%.

6. The silicon carbide epitaxial substrate according to claim 1, wherein the average value of the thickness is more than or equal to 5 μm and less than or equal to 50 μm.

7. The silicon carbide epitaxial substrate according to claim 2, wherein the area density of the pits is less than or equal to 10 $cm^{-2}$.

8. The silicon carbide epitaxial substrate according to claim 7, wherein the area density of the pits is less than or equal to 1 $cm^{-2}$.

9. The silicon carbide epitaxial substrate according to claim 1, wherein the maximum depth of each of the pits from the central region is more than or equal to 20 nm.

10. The silicon carbide epitaxial substrate according to claim 1, wherein trapezoidal defects are in the central region, each of the trapezoidal defects being a trapezoidal depression, an area density of the trapezoidal defects is less than or equal to 10 $cm^{-2}$, when viewed in a direction perpendicular to the central region, each of the trapezoidal defects includes an upper base portion and a lower base portion each crossing a <11-20> direction, the upper base portion has a width of more than or equal to 0.1 μm and less than or equal to 100 μm, the lower base portion has a width of more than or equal to 50 μm and less than or equal to 5000 μm, the upper base portion includes a protrusion, and the lower base portion includes a plurality of step-bunchings.

11. The silicon carbide epitaxial substrate according to claim 1, wherein basal plane dislocations are in the central region, and an area density of the basal plane dislocations is less than or equal to 10 $cm^{-2}$.

12. The silicon carbide epitaxial substrate according to claim 1, wherein first dislocation arrays of first half loops arranged along a straight line perpendicular to a <11-20> direction are in the central region, each of the first half loops includes a pair of threading edge dislocations exposed at the central region, and an area density of the first dislocation arrays in the central region is less than or equal to 10 $cm^{-2}$.

13. The silicon carbide epitaxial substrate according to claim 12, wherein second dislocation arrays of second half loops arranged along a straight line inclined relative to the <11-20> direction are in the central region, each of the second half loops includes a pair of threading edge dislocations exposed at the central region, and in the central region, the area density of the first dislocation arrays is lower than an area density of the second dislocation arrays.

14. The silicon carbide epitaxial substrate according to claim 1, wherein when pure water is dropped to the central region, an average value of a contact angle of the pure water is less than or equal to 45°, and an absolute value of a difference between maximum value and minimum value of the contact angle is less than or equal to 10°.

15. The silicon carbide epitaxial substrate according to claim 1, wherein a thickness of the silicon carbide single crystal substrate is less than or equal to 600 μm, a warp of the silicon carbide epitaxial substrate is less than or equal to 30 μm, an absolute value of a bow of the silicon carbide epitaxial substrate is less than or equal to 20 μm, when the bow is positive, in a direction perpendicular to a three-point reference plane of the second main surface, a location having a maximum height when viewed from the three-point reference plane is in a range from a center of the second main surface to ⅔ of a radius of the second main surface, when the bow is negative, in the direction perpendicular to the three-point reference plane, a location having a minimum height when viewed from the three-point reference plane is in the range from the center of the second main surface to ⅔ of the radius of the second main surface.

16. A method for manufacturing a silicon carbide semiconductor device, the method comprising:

preparing the silicon carbide epitaxial substrate recited in claim 1; and processing the silicon carbide epitaxial substrate.

* * * * *